(12) United States Patent
Chen

(10) Patent No.: US 10,428,587 B2
(45) Date of Patent: Oct. 1, 2019

(54) MULTILEVEL FORCE BALANCED DOWNHOLE DRILLING TOOLS INCLUDING CUTTING ELEMENTS IN A STEP PROFILE CONFIGURATION

(71) Applicant: Halliburton Energy Services, Inc., Houston, TX (US)

(72) Inventor: Shilin Chen, Montgomery, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 277 days.

(21) Appl. No.: 15/039,691

(22) PCT Filed: Dec. 26, 2013

(86) PCT No.: PCT/US2013/077743
§ 371 (c)(1),
(2) Date: May 26, 2016

(87) PCT Pub. No.: WO2015/099718
PCT Pub. Date: Jul. 2, 2015

(65) Prior Publication Data
US 2016/0376845 A1    Dec. 29, 2016

(51) Int. Cl.
*E21B 10/43* (2006.01)
*E21B 10/55* (2006.01)
(Continued)

(52) U.S. Cl.
CPC ............. *E21B 10/43* (2013.01); *E21B 10/55* (2013.01); *G06F 17/5009* (2013.01); *E21B 2010/425* (2013.01)

(58) Field of Classification Search
CPC ..... E21B 10/43; E21B 10/55; E21B 2010/425
See application file for complete search history.

(56) References Cited

U.S. PATENT DOCUMENTS

| 4,815,342 A | 3/1989 | Brett et al. |
| 4,932,484 A | 6/1990 | Warren et al. |

(Continued)

FOREIGN PATENT DOCUMENTS

| GB | 2361496 | 10/2001 |
| WO | 2010/068646 | 6/2010 |
| WO | 2013/180702 | 12/2013 |

OTHER PUBLICATIONS

"The FM3000™ Series, The Science Behind the New Generation of PDC Drill Bits," Halliburton; 2 pages, Aug. 2003.

(Continued)

*Primary Examiner* — Blake E Michener
(74) *Attorney, Agent, or Firm* — Baker Botts L.L.P.

(57) ABSTRACT

A downhole drilling tool designed for drilling a wellbore is disclosed. The drilling tool includes a bit body, and a first plurality of blades and a second plurality of blades on exterior portions of the bit body. A first group of cutting elements is located on exterior portions of the first plurality of blades. A second group of cutting elements is located on the second plurality of blades and under-exposed with respect to the first group of cutting elements. The first and second plurality of blades and the first group and second groups of cutting elements cooperate with each other to form a composite bit face profile such that each respective group of at least three neighbor cutting elements on the composite bit face profile is force balanced with respect to each other.

24 Claims, 31 Drawing Sheets

(51) Int. Cl.
*G06F 17/50* (2006.01)
*E21B 10/42* (2006.01)

(56) References Cited

U.S. PATENT DOCUMENTS

| | | | | |
|---|---|---|---|---|
| 5,265,685 | A * | 11/1993 | Keith | E21B 10/04 |
| | | | | 175/431 |
| 5,531,281 | A * | 7/1996 | Murdock | E21B 10/43 |
| | | | | 175/431 |
| 5,549,171 | A * | 8/1996 | Mensa-Wilmot | E21B 10/43 |
| | | | | 175/431 |
| 5,551,522 | A * | 9/1996 | Keith | E21B 10/55 |
| | | | | 175/420.2 |
| 5,582,261 | A * | 12/1996 | Keith | E21B 10/43 |
| | | | | 175/431 |
| 5,595,252 | A | 1/1997 | O'Hanlon | |
| 5,607,024 | A | 3/1997 | Keith et al. | |
| 5,607,025 | A | 3/1997 | Mensa-Wilmot et al. | |
| 6,123,161 | A | 9/2000 | Taylor | |
| 6,609,580 | B2 | 8/2003 | Beaton | |
| 6,612,384 | B1 | 9/2003 | Singh et al. | |
| 6,879,947 | B1 | 4/2005 | Glass | |
| 7,251,590 | B2 | 7/2007 | Huang et al. | |
| 7,455,125 | B2 | 11/2008 | Sinor et al. | |
| 7,693,695 | B2 | 4/2010 | Huang et al. | |
| 7,703,557 | B2 | 4/2010 | Durairajan et al. | |
| 7,703,558 | B2 | 4/2010 | Sinor et al. | |
| 7,726,415 | B1 | 6/2010 | Tipton et al. | |
| 7,861,809 | B2 | 1/2011 | Gavia et al. | |
| 8,047,307 | B2 | 11/2011 | Pessier et al. | |
| 8,899,357 | B2 * | 12/2014 | Chen | E21B 10/43 |
| | | | | 175/331 |
| 2002/0157869 | A1 | 10/2002 | Glass et al. | |
| 2004/0254664 | A1 | 12/2004 | Centala et al. | |
| 2005/0015230 | A1 | 1/2005 | Centala et al. | |
| 2005/0096847 | A1 | 5/2005 | Huang | |
| 2005/0269139 | A1 | 12/2005 | Shen et al. | |
| 2006/0070771 | A1 * | 4/2006 | McClain | E21B 10/43 |
| | | | | 175/57 |
| 2006/0162968 | A1 | 7/2006 | Durairajan et al. | |
| 2006/0167669 | A1 | 7/2006 | Cariveau et al. | |
| 2006/0195307 | A1 | 8/2006 | Huang et al. | |
| 2007/0078632 | A1 * | 4/2007 | Shen | E21B 10/43 |
| | | | | 703/1 |
| 2007/0106487 | A1 | 5/2007 | Gavia et al. | |
| 2007/0261890 | A1 * | 11/2007 | Cisneros | E21B 10/43 |
| | | | | 175/331 |
| 2008/0135297 | A1 * | 6/2008 | Gavia | E21B 10/43 |
| | | | | 175/57 |
| 2008/0179108 | A1 * | 7/2008 | McClain | E21B 10/43 |
| | | | | 175/431 |
| 2008/0302575 | A1 * | 12/2008 | Durairajan | E21B 10/43 |
| | | | | 175/327 |
| 2009/0145663 | A1 * | 6/2009 | Durairajan | E21B 10/55 |
| | | | | 175/57 |
| 2009/0145669 | A1 * | 6/2009 | Durairajan | E21B 10/43 |
| | | | | 175/431 |
| 2009/0166091 | A1 * | 7/2009 | Matthews | E21B 10/08 |
| | | | | 175/195 |
| 2009/0266619 | A1 * | 10/2009 | Durairajan | E21B 10/43 |
| | | | | 175/431 |
| 2010/0089658 | A1 * | 4/2010 | Welch | E21B 10/43 |
| | | | | 175/374 |
| 2010/0155151 | A1 | 6/2010 | Drews | |
| 2010/0175930 | A1 | 7/2010 | Schwefe | |
| 2010/0326742 | A1 * | 12/2010 | Vempati | E21B 10/43 |
| | | | | 175/431 |
| 2011/0005841 | A1 * | 1/2011 | Wood | E21B 10/26 |
| | | | | 175/385 |
| 2011/0079438 | A1 * | 4/2011 | Schwefe | E21B 10/43 |
| | | | | 175/61 |
| 2011/0100724 | A1 * | 5/2011 | Azar | E21B 10/43 |
| | | | | 175/428 |
| 2011/0240376 | A1 * | 10/2011 | Chen | E21B 10/43 |
| | | | | 175/336 |
| 2011/0278073 | A1 * | 11/2011 | Gillis | E21B 10/43 |
| | | | | 175/426 |
| 2012/0111630 | A1 * | 5/2012 | Chen | E21B 10/43 |
| | | | | 175/45 |
| 2012/0234610 | A1 | 9/2012 | Azar et al. | |
| 2012/0312603 | A1 * | 12/2012 | Propes | E21B 10/43 |
| | | | | 175/431 |
| 2014/0332271 | A1 * | 11/2014 | Do | E21B 10/62 |
| | | | | 175/57 |
| 2016/0215568 | A1 * | 7/2016 | Chen | E21B 10/54 |
| 2017/0154149 | A1 * | 6/2017 | Chen | G06F 17/5086 |

OTHER PUBLICATIONS

"TransFormation Bits™, Sharper Solutions™," Reed Hycalog; 8 pages, 2004.
Examination Report under Section 18(3) received for Great Britain Patent Application No. GB1111776.9; 2 pages, dated Jan. 17, 2013.
Examination Report under Section 18(3) received for Great Britain Patent Application No. GB1111776.9; 1 page, dated Jul. 10, 2013.
Examination Report under Section 18(3) received for Great Britain Patent Application No. GB1305848.2; 1 page, dated Jul. 9, 2013.
Examination Report under Section 18(3) received for Great Britain Patent Application No. GB1607383.5, dated Dec. 9, 2016; 6 pages.
Examination Report under Section 18(3) received for Great Britain Patent Application No. GB1305849.0; 1 page, dated Jul. 9, 2013.
Examination Report under Section 18(3) received for Great Britain Patent Application No. GB1607383.5, dated Jul. 17, 2017; 5 pages.
Examination Report under Section 18(3) received for Great Britain Patent Application No. GB1608131.7, dated Dec. 16, 2016; 6 pages.
Examination Report under Section 18(3) received for Great Britain Patent Application No. GB1608131.7, dated Jul. 18, 2017; 6 pages.
FM2000i/r Bit Series, Matrix Body, Diamond Impregnation Backs Up PDC Cutters, Security DBS Drill Bits, Halliburton H03008-A4; 2 pages, 2002.
G. E. Weaver et al., "A New PDC Cutting Structure Improves Bit Stabilization and Extends Application into Harder Rock Types," SPE/IADC Drilling Conference, Amsterdam, The Netherlands, Feb. 23-25, 1993; 12 pgs.
Halliburton; "Diamond Impregnated"; Bit Size: 8-⅜"; Bit Type: Ti3105B; Assembly No. 62187; pp. 1, 2003.
Halliburton; "Ring Claw," Bit Size: 4-¾"x2.02", Bit Type: FC3636; Assembly No. 63076; 1 page, 2003.
Halliburton; "Ring Claw," Bit Size: 5-⅝", Bit Type: SE3631, Assembly No. 62807; 1 page, 2003.
Halliburton; "The Science of Improving Cutter Technology"; www.halliburton.com; pp. 2, 2003.
International Preliminary Report on Patentability for PCT Patent Application No. PCT/US2013/077742, dated Jul. 7, 2016; 16 pages.
International Preliminary Report on Patentability for PCT Patent Application No. PCT/US2013/077743, dated Jul. 7, 2016; 16 pages.
International Preliminary Report on Patentability for PCT Patent Application No. PCT/US09/67263; 4 pages, dated Dec. 28, 2011.
International Preliminary Report on Patentability for PCT Patent Application No. PCT/US09/67362; 11 pages, dated Nov. 17, 2011.
International Search Report and Written Opinion for PCT Patent Application No. PCT/US2013/077742; 19 pgs., dated Sep. 25, 2014.
International Search Report and Written Opinion for PCT Patent Application No. PCT/US2013/077743; 19 pgs., dated Sep. 26, 2014.
International Search Report and Written Opinion for PCT Patent Application No. PCT/US2009/067263; 26 pages, dated Mar. 10, 2010.
International Search Report and Written Opinion for PCT Patent Application No. PCT/US2009/067362, 8 pages, dated Jan. 29, 2010.
Office Action received for Canadian Patent Application No. 2745812, dated Jul. 25, 2016; 4 pages.
Office Action received for Canadian Patent Application No. 2930178, dated Apr. 21, 2017; 4 pages.

(56) References Cited

OTHER PUBLICATIONS

Office Action received for Canadian Patent Application No. 2931408, dated May 10, 2017; 4 pages.
Office Action received for Canadian Patent Application No. 2745812, dated Nov. 13, 2015; 6 pages.
Office Action received for Chinese Patent Application No. 201380080826.7, dated Mar. 1, 2017; 15 pages.
Office Action received for Chinese Patent Application No. 201380080884.X, dated Mar. 2, 2017, no English translation; 10 pages.
R. Clayton et al., "New Bit Design, Cutter Technology Extend PDC Applications to Hard Rock Drilling," SPE/IADC Drilling Conference, Amsterdam, The Netherlands, Feb. 23-25, 2005; 6 pages.
S. Miska et al., "Type Curves for Predicting Directional Tendencies of Simple Bottom-Hole Assemblies," Journal of Energy Resources Technology, vol. 120; 8 pages, Sep. 1998.

\* cited by examiner

EXAMPLE MATCH OF MAJOR BLADES, ALGORITHMS AND CUTTING ELEMENT SETS

| N. BLD | MAJOR BLADES | ALGORITHM | BLADE GROUPS | CUTTING ELEMENT SET | PREFERRED MATCH |
|---|---|---|---|---|---|
| 4 | 1,3 | TWO GROUP | (1,3), (2,4) | [(1,3), (2,4)] | YES |
| 5 | 1,3,5 | TWO GROUP | (1,3,5), (2,4) | [(1,3,5), (2,4)] | YES |
|   | 1,3,4 | TWO GROUP | (1,3,4), (2,5) | [(1,3,4), (2,5)] |   |
| 6 | 1,3,5 | TWO GROUP | (1,3,5), (2,4,6) | [(1,3,5), (2,4,6)] | YES |
|   | 1,4 | PAIR GROUP | (1,4), (2,5), (3,6) | [(1,4), (3,6), (2,5)] | YES |
| 7 | 1,3,5,7 | TWO GROUP | (1,3,5,7), (2,4,6) | [(1,3,5,7), (2,4,6)] | YES |
|   | 1,3,5 | TWO GROUP | (1,3,5), (2,4,6,7) | [(1,3,5), (2,4,6,7)] | YES |
|   | 1,4,6 | TWO GROUP | (1,4,6), (2,5,3,7) | [(1,4,6), (2,5,3,7)] |   |
|   | 1,4,6 | THREE GROUP | (1,4,6), (2,5), (3,7) | [(1,4,6), (2,5), (3,7)] |   |
| 8 | 1,3,5,7 | TWO GROUP | (1,3,5,7), (2,4,6,8) | [(1,3,5,7), (2,4,6,8)] |   |
|   | 1,3,5,7 | PAIR GROUP | (1,5), (2,6), (3,7), (4,8) | [(1,5), (3,7), (2,6), (4,8)] | YES |
|   | 1,4,7 | THREE GROUP | (1,4,7), (2,6), (3,5,8) | [(1,4,7), (3,5,8), (2,6)] |   |
| 9 | 1,4,7 | THREE GROUP | (1,4,7), (2,5,8), (3,6,9) | [(1,4,7), (2,5,8), (3,6,9)] | YES |
|   | 1,4,7 | FOUR GROUP | (1,4,7), (2,6), (3,8), (5,9) | [(1,4,7), (3,8), (5,9), (2,6)] |   |
| 10 | 1,4,6,9 | PAIR GROUP | (1,6), (2,7), (3,8), (4,9), (5,10) | [(1,6), (4,9), (2,7), (5,10), (3,8)] | YES |
|   | 1,4,6,9 | THREE GROUP | (1,4,6,9), (2,5,8), (3,7,10) | [(1,4,6,9), (3,7,10), (2,5,8)] |   |
|   | 1,4,7 | FOUR GROUP | (1,4,7), (2,6,9), (3,8), (5,10) | [(1,4,7), (3,8), (5,10), (2,6,9)] |   |
| 11 | 1,3,7,9 | THREE GROUP | (1,3,7,9), (2,5,8,11), (4,6,10) | [(1,3,7,9), (2,5,8,11), (4,6,10)] | YES |
|   | 1,5,9 | FOUR GROUP | (1,5,9), (2,8), (3,6,10), (4,7,11) | [(1,5,9), (3,6,10), (4,7,11), (2,8)] |   |
|   | 1,4,7,10 | FIVE GROUP | (1,7), (2,5,9), (3,8), (4,10), (6,11) | [(1,7), (4,10), (6,11), (3,8), (2,5,9)] |   |

FIG. 4A

EXAMPLE MATCH OF MAJOR BLADES, ALGORITHMS AND CUTTING ELEMENT SETS

| N. BLD | MAJOR BLADES | ALGORITHM | BLADE GROUPS | CUTTING ELEMENT SET | PREFERRED MATCH |
|---|---|---|---|---|---|
| 12 | 1,4,7,10 | PAIR GROUP | (1,7), (2,8), (3,9), (4,10), (5,11), (6,12) | [(1,7), (4,10), (2,8), (5,11), (3,9), (6,12 )] | YES |
| | 1,4,7,10 | THREE GROUP | (1,4,7,10), (2,5,8,11), (3,6,9,12) | [(1,4,7,10), (2,5,8,11), (3,6,9,12)] | |
| | 1,5,9 | FOUR GROUP | (1,5,9), (2, 6,10), (3,7,11), (4,8,12), | [(1,5,9), (2,6,10), (3,7,11), (4,8,12)] | YES |
| | 1,4,7,10 | FIVE GROUP | (1,7), (4,10), (6,12), (2,5,9), (3,8,11) | [(1,7), (4,10), (6,12), (3,8,11), (2,5,9)] | |
| 13 | 1,5,8,11 | FOUR GROUP | (1, 5, 8,11), (2,6,10), (3,7,12), (4,9,13 ) | [(1, 5, 8,11), (4,9,13 ), (3,7,12), (2,6,10)] | |
| | 1,5,10 | FIVE GROUP | [(1,5,10), (3,9), (6,12), (4,8,13), (2,7,11)] | [(1,5,10), (3,9), (4,8,13), (6,12), (2,7,11)] | YES |
| | 1,5,9 | SIX GROUP | (1,5,9), (2,8), (3,10), (4,11), (6,12) , (7,13) | [(1,5,9), (3,10), (4,11), (6,12) , (7,13), (2,8)] | |
| 14 | 1,5,8,12 | PAIR GROUP | (1, 8), (2,9), (3,10), (4.,11), (5,12), (6,13), (7,14) | [(1,8), (5,12), (3,10), (6,13), (2,9), (7,14), (4.,11)] | YES |
| | 1,5,8,12 | FOUR GROUP | (1,5,8,12), (2,6,9,13), (3,7,11), (4,10,14) | [(1,5,8,12), (3,7,11), (4,10,14), (2,6,9,13)] | |
| | 1,5,10 | FIVE GROUP | (1,5,10), (2,9), (3,7,12), (4,8,13),(6,11,14) | [(1,5,10), (3,7,12), (4,8,13),(6,11,14), (2,9)] | |
| | 1,5,10 | SIX GROUP | (1,5,10), (2,9), (3,8,12), (4,11), (6,13), (7,14) | [(1,5,10), (4,11), (3,8,12), (6,13), (7,14), (2,9)] | YES |
| 15 | 1,5,9,13 | FOUR GROUP | (1,5,9,13), (2,6,11), (3,7,10,14), (4,8,12,15) | [(1,5,9,13), (3,7,10,14), (4, 8,12,15), (2, 6,11)] | |
| | 1,6,11 | FIVE GROUP | (1,6,11), (2,7,12), (3,8,13), (4,9,14), (5,10,15) | [(1,6,11), (2,7,12), (3,8,13), (4,9,14), (5,10,15)] | YES |
| | 1,6,11 | SIX GROUP | (1,6,11), (2,9), (4,12), (3,8,13), (5,10,15), (7,14) | [(1,6,11), (2,9), (4,12), (3,8,13), (5,10,15), (7,14)] | |
| | 3,8,13 | SEVEN GROUP | (1,9), (2,10), (3,8,13), (4,11), (5,12), (6,14), (7,15) | [(3,8,13), (7,15), (5,12), (6,14), (4,11), (1,9), (2,10)] | |

FIG. 4B

PREFERRED MATCH OF MAJOR BLADES, ALGORITHMS AND FOUR-LEVEL FORCE BALANCED CUTTING ELEMENT SETS 501

| N. BLD | MAJOR BLADES | ALGORITHM | LEVEL FOUR FORCED BALANCED CUTTING ELEMENT SET | CONSECUTIVE CUTTING ELEMENTS IN A CUTTING ELEMENT SET WITH MINIMIZED IMBALANCE FORCE |
|---|---|---|---|---|
| 5 | 1,3,5 | TWO GROUP | [(1,3,5), (2,4)] | 1,2,3; 2,3,4; 3,4,5; |
| 6 | 1,4 | PAIR GROUP | [(1,4), (3,6), (2,5)] | 1,2,3,4; 2,3,4,5; 3,4,5,6; |
| 7 | 1,3,5,7 (OR 1,3,5) | TWO GROUP | [(1,3,5,7), (2,4,6)] | 1,2,3,4; 2,3,4,5; 3,4,5,6; 4,5,6,7; |
| 8 | 1,3,5,7 | PAIR GROUP | [(1,5), (3,7), (2,6), (4,8)] | 1,2,3,4; 2,3,4,5; 3,4,5,6; 4,5,6,7; |
| 9 | 1,4,7 | THREE GROUP | [(1,4,7), (2,5,8), (3,6,9)] | 1,2,3; 2,3,4; 3,4,5; 4,5,6; 5,6,7; 6,7,8; 7,8,9; |
| 10 | 1,4,6,9 | PAIR GROUP | [(1,6), (4,9), (2,7), (5,10), (3,8)] | 1,2,3,4; 2,3,4,5; 3,4,5,6; 4,5,6,7; 5,6,7,8; 6,7,8,9; 7,8,9,10; |
| 11 | 1,3,7,9 | THREE GROUP | [(1,3,7,9), (2,5,8,11), (4,6,10)] | 1,2,3,4; 2,3,4,5; 3,4,5,6; 4,5,6,7; 5,6,7,8; 6,7,8,9; 7,8,9,10; 8,9,10,11; |
| 12 | 1,4,7,10 | PAIR GROUP | [(1,7), (4,10), (2,8), (5,11), (3,9), (6,12)] | 1,2,3,4; 2,3,4,5; 3,4,5,6; 4,5,6,7; 5,6,7,8; 6,7,8,9; 7,8,9,10; 8,9,10,11; 9,10,11,12; |
| 12 | 1,5,9 | FOUR GROUP | [(1,5,9), (2,6,10), (3,7,11), (4,8,12)] | 1,2,3; 2,3,4; 3,4,5; 4,5,6; 5,6,7; 6,7,8; 7,8,9; 8,9,10; 9,10,11; 10,11,12; |
| 13 | 1,5,10 | FIVE GROUP | [(1,5,10), (3,9), (6,12), (4,8,13), (2,7,11)] | 1,2,3,4; 2,3,4,5; 3,4,5,6; 4,5,6,7; 5,6,7,8; 6,7,8,9; 7,8,9,10; 8,9,10,11; 9,10,11,12; 10,11,12,13; |
| 14 | 1,5,8,12 | PAIR GROUP | [(1,8), (5,12), (3,10), (6,13), (2,9), (7,14), (4,11)] | 1,2,3,4; 2,3,4,5; 3,4,5,6; 4,5,6,7; 5,6,7,8; 6,7,8,9; 7,8,9,10; 8,9,10,11; 9,10,11,12; 10,11,12,13; 11,12,13,14; |
| 15 | 1,6,11 | FIVE GROUP | [(1,6,11), (2,7,12), (3,8,13), (4,9,14), (5,10,15)] | 1,2,3; 2,3,4; 3,4,5; 4,5,6; 5,6,7; 6,7,8; 7,8,9; 8,9,10; 9,10,11; 10,11,12; 11,12,13; 12,13,14; 13,14,15; |

FIG. 5

MULTILEVEL FORCE BALANCED DOWNHOLE DRILLING TOOLS INCLUDING CUTTING ELEMENTS IN A STEP PROFILE CONFIGURATION

RELATED APPLICATION

This application is a U.S. National Stage Application of International Application No. PCT/US2013/077743 filed Dec. 26, 2013, which designates the United States, and which is incorporated herein by reference in its entirety.

TECHNICAL FIELD

The present disclosure is related to downhole drilling tools and more particularly to multilevel force balanced downhole drilling tools including cutting elements in a step profile configuration.

BACKGROUND OF THE DISCLOSURE

Various types of downhole drilling tools including, but not limited to, rotary drill bits, reamers, core bits, stabilizers and other downhole tools may be used to form wellbores in associated downhole formations. Examples of rotary drill bits include, but are not limited to, fixed cutter drill bits, drag bits, polycrystalline diamond compact (PDC) drill bits, matrix drill bits, roller cone drill bits, rotary cone drill bits and rock bits used to form a wellbore extending through one or more downhole formations. Cutting action associated with these drill bits generally requires weight on bit (WOB) and rotation of associated cutting elements into adjacent portions of a downhole formation.

Rotary drill bits may be formed with blades extending from a bit body with cutting elements disposed on exterior portions of the blades. Various techniques and procedures have been used to select locations for installing cutting elements on the downhole drilling tools. These prior techniques assume that all cutting elements are engaged with a generally uniform downhole formation. However, in typical drilling applications, formations may generally have a relatively low compressive strength in the upper portions (e.g., shallower drilling depths) of the formation and a relatively high compressive strength in the lower portions (e.g., deeper drilling depths) of the formation.

BRIEF DESCRIPTION OF THE DRAWINGS

A more complete and thorough understanding of the various embodiments and advantages thereof may be acquired by referring to the following description taken in conjunction with the accompanying drawings, in which like reference numbers indicate like features, and wherein:

FIGS. 4A and 4B illustrate a table showing examples of matching major blades, cutting element groups, blade groups and cutting element sets for use in multilevel force balancing of downhole drilling tools, in accordance with some embodiments of the present disclosure;

FIG. 5 illustrates a table showing preferred matches of major blades, cutting element groups, blade groups and cutting element sets during design of multilevel force balance downhole drilling tools, in accordance with some embodiments of the present disclosure;

DETAILED DESCRIPTION OF THE DISCLOSURE

Embodiments of the present disclosure and its advantages may be understood by referring to FIGS. 1 through 13, where like numbers are used to indicate like and corresponding parts.

Figure 1:
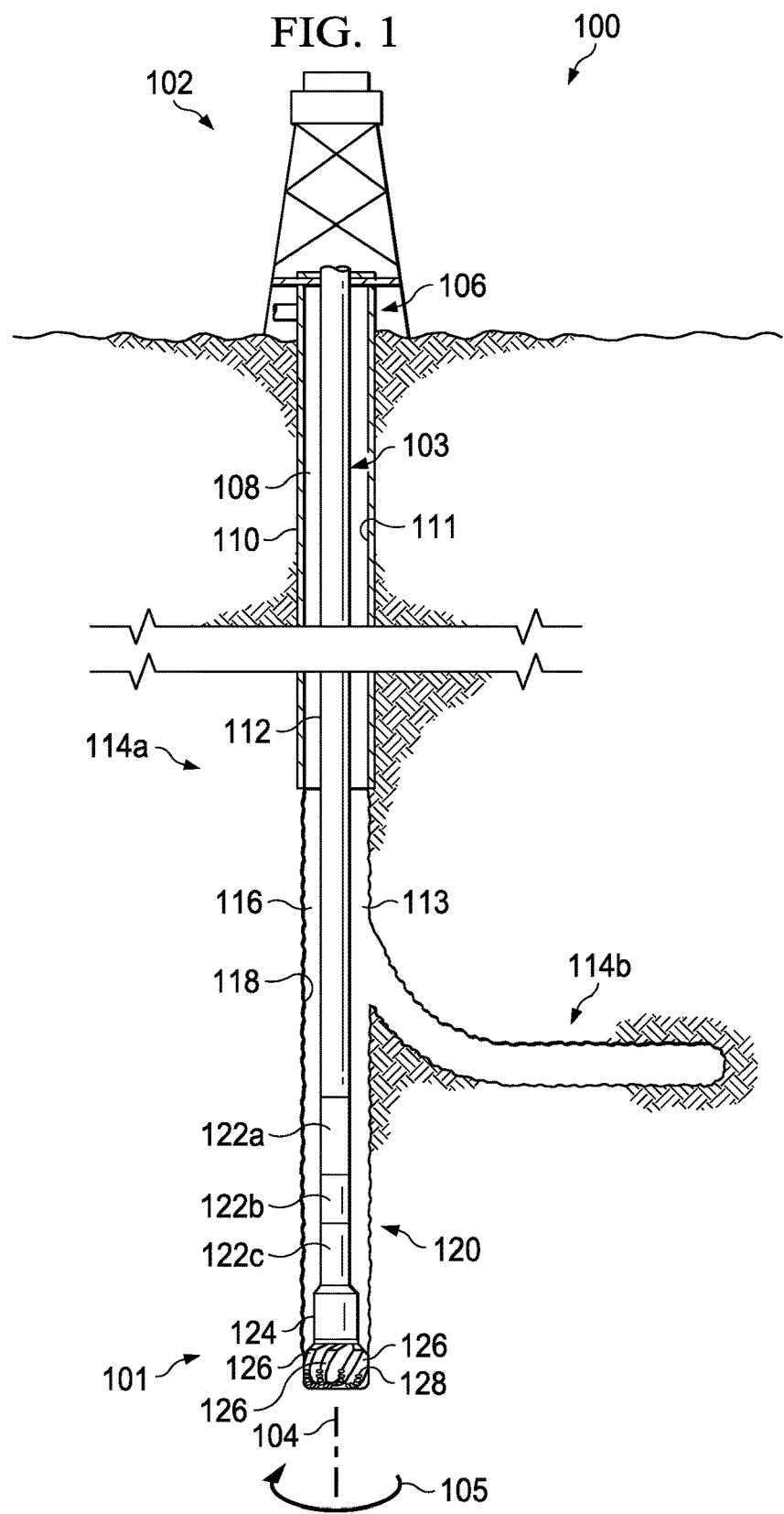
FIG. 1 illustrates an elevation view of an example embodiment of a drilling system, in accordance with some embodiments of the present disclosure.

FIG. 1 illustrates an elevation view of an example embodiment of drilling system 100, in accordance with some embodiments of the present disclosure. Drilling system 100 may include well surface or well site 106. Various types of drilling equipment such as a rotary table, drilling fluid pumps and drilling fluid tanks (not expressly shown) may be located at well surface or well site 106. For example, well site 106 may include drilling rig 102 that may have various characteristics and features associated with a "land drilling rig." However, downhole drilling tools incorporating teachings of the present disclosure may be satisfactorily used with drilling equipment located on offshore platforms, drill ships, semi-submersibles and drilling barges (not expressly shown).

Drilling system 100 may also include drill string 103 associated with drill bit 101 that may be used to form a wide variety of wellbores or bore holes such as generally vertical wellbore 114a or generally horizontal wellbore 114b or any combination thereof. Various directional drilling techniques and associated components of bottom hole assembly (BHA) 120 of drill string 103 may be used to form horizontal wellbore 114b. For example, lateral forces may be applied to BHA 120 proximate kickoff location 113 to form generally horizontal wellbore 114b extending from generally vertical wellbore 114a. The term "directional drilling" may be used to describe drilling a wellbore or portions of a wellbore that extend at a desired angle or angles relative to vertical. The desired angles may be greater than normal variations associated with vertical wellbores. Direction drilling may also be described as drilling a wellbore deviated from vertical. The term "horizontal drilling" may be used to include drilling in a direction approximately ninety degrees (90°) from vertical.

BHA 120 may be formed from a wide variety of components configured to form wellbore 114. For example, components 122a, 122b and 122c of BHA 120 may include, but are not limited to, drill bits (e.g., drill bit 101), coring bits, drill collars, rotary steering tools, directional drilling tools, downhole drilling motors, reamers, hole enlargers or stabilizers. The number and types of components 122 included in BHA 120 may depend on anticipated downhole drilling conditions and the type of wellbore that will be formed by drill string 103 and rotary drill bit 101. BHA 120 may also include various types of well logging tools (not expressly shown) and other downhole tools associated with directional drilling of a wellbore. Examples of logging tools and/or directional drilling tools may include, but are not limited to, acoustic, neutron, gamma ray, density, photoelectric, nuclear magnetic resonance, rotary steering tools and/or any other commercially available well tool.

Wellbore 114 may be defined in part by casing string 110 that may extend from well surface 106 to a selected downhole location. Portions of wellbore 114, as shown in FIG. 1, that do not include casing string 110 may be described as "open hole." Various types of drilling fluid may be pumped from well surface 106 through drill string 103 to attached drill bit 101. The drilling fluids may be directed to flow from drill string 103 to respective nozzles (depicted as nozzles 156 in FIG. 2A) passing through rotary drill bit 101. The drilling fluid may be circulated back to well surface 106 through annulus 108 defined in part by outside diameter 112 of drill string 103 and inside diameter 118 of wellbore 114a. Inside diameter 118 may be referred to as the "sidewall" of wellbore 114a Annulus 108 may also be defined by outside diameter 112 of drill string 103 and inside diameter 111 of casing string 110. Open hole annulus 116 may be defined as sidewall 118 and outside diameter 112.

Drilling system 100 may also include rotary drill bit ("drill bit") 101. Drill bit 101, discussed in further detail in FIG. 2A, may include one or more blades 126 that may be disposed outwardly from exterior portions of rotary bit body 124 of drill bit 101. Rotary bit body 124 may be generally cylindrical and blades 126 may be any suitable type of projections extending outwardly from rotary bit body 124. Drill bit 101 may rotate with respect to bit rotational axis 104 in a direction defined by directional arrow 105. Blades 126 may include one or more cutting elements 128 disposed outwardly from exterior portions of each blade 126. Blades 126 may also include one or more depth of cut controllers (not expressly shown) configured to control the depth of cut of cutting elements 128. Blades 126 may further include one or more gage pads (not expressly shown) disposed on blades 126. Drill bit 101 may be designed and formed in accordance with teachings of the present disclosure and may have many different designs, configurations, and/or dimensions according to the particular application of drill bit 101.

During operation of drilling system 100, bit imbalance forces may cause vibration of drill string 103 when drill bit 101 initially contacts the bottom of wellbore 114a or the end of horizontal wellbore 114b. This vibration may extend from drill bit 101 throughout the length of drill string 103 and may damage both the downhole drilling equipment and drilling equipment at well site 106. Imbalance forces acting on a downhole drilling tool may also result during transition drilling from a first generally soft formation layer into a second, generally harder downhole formation layer. Imbalance forces acting on a downhole drilling tool may further result from drilling from a first downhole formation into a second downhole formation where the second downhole formation may be tilted at an angle other than normal to a wellbore formed by a downhole drilling tool.

Therefore, while performing directional drilling or drilling into different types of geological formations, it may be advantageous to provide a drilling tool that is force balanced (e.g., the bit lateral forces are balanced or minimized) such that the drilling tool is more efficient and drills with a higher lateral stability. In some embodiments, the drilling tool may be multilevel force balanced such that the lateral forces acting on the drilling tool are balanced when the drilling tool is forming a wellbore with non-uniform downhole drilling formations. Multilevel force balancing may generally include the use of respective cutting element groups and cutting element sets and may not be limited to a single set of all cutting elements of a downhole drilling tool engaged with a generally uniform downhole formation. Multilevel force balancing may also include evaluating bit imbalance forces as a function of drilling depth.

The configuration of cutting elements 128 on drill bit 101 and/or other downhole drilling tools may also contribute to the stability and drilling efficiency of the drill bit. Cutting elements 128 may be laid out according to two general principles: single-set and track-set. In a single-set configuration, each of cutting elements 128 on drill bit 101 may have a unique radial position with respect to bit rotational axis 104. In a track-set configuration, at least two of cutting elements 128 of drill bit 101 may have the same radial position with respect to bit rotational axis 104. In some embodiments, the track-set cutting elements may be located on different blades of the drill bit. In other embodiments, the track-set cutting elements may be located on the same blade. Drill bits having cutting elements laid out in a single-set configuration may drill more efficiently than drill bits having a track-set configuration while drill bits having cutting elements laid out in a track-set configuration may be more stable than drill bits having a single-set configuration.

Accordingly, the drilling tools may be modified to improve performance and enhance stability and drilling efficiency. In some embodiments, drill bit 101 may be designed and manufactured in accordance with teachings of the present disclosure and may have many different designs, configurations, and/or dimensions according to the particular application of drill bit 101. As disclosed in further detail below with respect to FIGS. 3-13 and according to some embodiments of the present disclosure, cutting elements 128 of drill bit 101 may be laid out such that neighbor cutting elements or neighbor groups of cutting elements are force balanced to minimize vibration and at least some of cutting elements 128 are track-set and/or at least some of cutting elements 128 are under-exposed to increase the stability of drill bit 101. In some embodiments, cutting elements 128 of drill bit 101 may be laid out such that single-set cutting element groups and track-set element groups are mixed along the bit face profile and form neighbor cutting elements or cutting element groups. Neighbor cutting elements may be cutting elements that are disposed immediately adjacent to each other (e.g., consecutively numbered) on an associated bit face profile. In other embodiments, cutting elements 128 of drill bit 101 may be laid out in multiple layers such that some cutting elements are under-exposed and form a step profile on an associated bit profile for drill bit 101. By under-exposing some of cutting elements 128, drill bit 101 may form groves at the bottom of wellbore 114a or the end of wellbore 114b during drilling operations. These grooves may enhance bit stability without affecting the efficiency of drill bit 101.

Figure 2A:
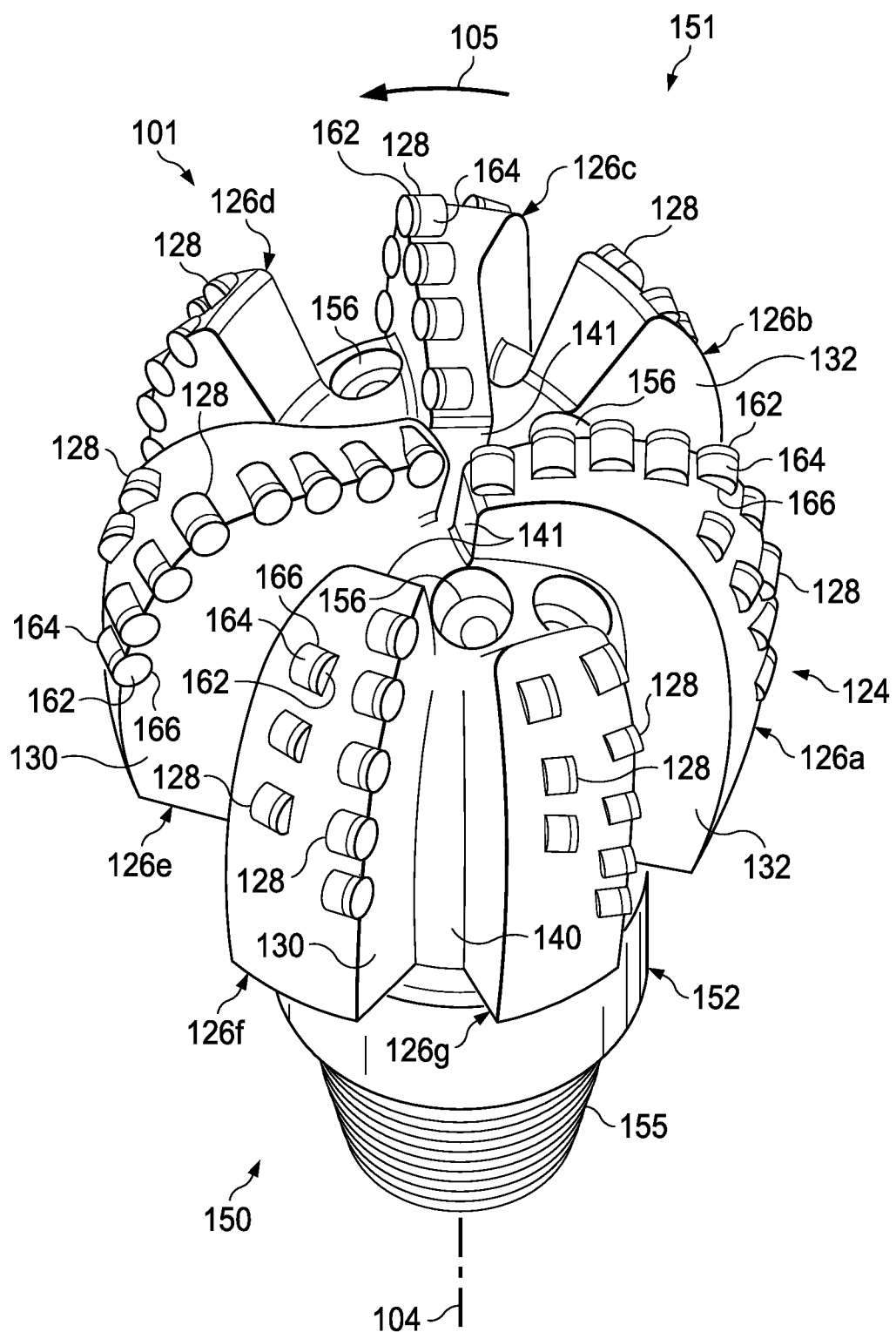
FIG. 2A illustrates an isometric view of a rotary drill bit oriented upwardly in a manner often used to model or design drill bits, in accordance with some embodiments of the present disclosure.

FIG. 2A illustrates an isometric view of rotary drill bit 101 oriented upwardly in a manner often used to model or design fixed cutter drill bits, in accordance with some embodiments of the present disclosure. Drill bit 101 may be any of various types of rotary drill bits, including fixed cutter drill bits, polycrystalline diamond compact (PDC) drill bits, drag bits, matrix drill bits, and/or steel body drill bits operable to form a wellbore (e.g., wellbore 114 as illustrated in FIG. 1) extending through one or more downhole formations. Drill bit 101 may be designed and formed in accordance with teachings of the present disclosure and may have many different designs, configurations, and/or dimensions according to the particular application of drill bit 101.

Drill bit 101 may include one or more blades 126 (e.g., blades 126a-126g) that may be disposed outwardly from exterior portions of rotary bit body 124 of drill bit 101. Rotary bit body 124 may be generally cylindrical and blades 126 may be any suitable type of projections extending outwardly from rotary bit body 124. For example, a portion of blade 126 may be directly or indirectly coupled to an exterior portion of bit body 124, while another portion of blade 126 may be projected away from the exterior portion of bit body 124. Blades 126 formed in accordance with teachings of the present disclosure may have a wide variety of configurations including, but not limited to, substantially arched, generally helical, spiraling, tapered, converging, diverging, symmetrical, and/or asymmetrical. In some embodiments, one or more blades 126 may have a substantially arched configuration extending from proximate rotational axis 104 of drill bit 101. The arched configuration may be defined in part by a generally concave, recessed shaped portion extending from proximate bit rotational axis 104. The arched configuration may also be defined in part by a generally convex, outwardly curved portion disposed between the concave, recessed portion and exterior portions of each blade which correspond generally with the outside diameter of the rotary drill bit.

Each of blades 126 may include a first end disposed proximate or toward bit rotational axis 104 and a second end disposed proximate or toward exterior portions of drill bit 101 (e.g., disposed generally away from bit rotational axis 104 and toward uphole portions of drill bit 101). The terms "uphole" and "downhole" may be used to describe the location of various components of drilling system 100 relative to the bottom or end of wellbore 114 shown in FIG. 1. For example, a first component described as uphole from a second component may be further away from the end of wellbore 114 than the second component. Similarly, a first component described as being downhole from a second component may be located closer to the end of wellbore 114 than the second component.

Blades 126a-126g may include primary blades disposed about the bit rotational axis. For example, blades 126a, 126c, and 126e may be primary blades or major blades because respective first ends 141 of each of blades 126a, 126c, and 126e may be disposed closely adjacent to bit rotational axis 104 of drill bit 101. In some embodiments, blades 126a-126g may also include at least one secondary blade disposed between the primary blades. In the illustrated embodiment, blades 126b, 126d, 126f, and 126g on drill bit 101 may be secondary blades or minor blades because respective first ends 141 may be disposed on downhole end 151 of drill bit 101 a distance from associated bit rotational axis 104. The number and location of primary blades and secondary blades may vary such that drill bit 101 includes more or less primary and secondary blades. Blades 126 may be disposed symmetrically or asymmetrically with regard to each other and bit rotational axis 104 where the location of blades 126 may be based on the downhole drilling conditions of the drilling environment. In some embodiments, blades 126 and drill bit 101 may rotate about rotational axis 104 in a direction defined by directional arrow 105.

Each of blades 126 may have respective leading or front surfaces 130 in the direction of rotation of drill bit 101 and trailing or back surfaces 132 located opposite of leading surface 130 away from the direction of rotation of drill bit 101. In some embodiments, blades 126 may be positioned along bit body 124 such that they have a spiral configuration relative to bit rotational axis 104. In other embodiments, blades 126 may be positioned along bit body 124 in a generally parallel configuration with respect to each other and bit rotational axis 104.

Blades 126 may include one or more cutting elements 128 disposed outwardly from exterior portions of each blade 126. For example, a portion of cutting element 128 may be directly or indirectly coupled to an exterior portion of blade 126 while another portion of cutting element 128 may be projected away from the exterior portion of blade 126. By way of example and not limitation, cutting elements 128 may be various types of cutters, compacts, buttons, inserts, and gage cutters satisfactory for use with a wide variety of drill bits 101. Although FIG. 2A illustrates two rows of cutting elements 128 on blades 126, drill bits designed and manufactured in accordance with the teachings of the present disclosure may have one row of cutting elements or more than two rows of cutting elements.

Cutting elements 128 may be any suitable device configured to cut into a formation, including but not limited to, primary cutting elements, back-up cutting elements, secondary cutting elements or any combination thereof. Cutting elements 128 may include respective substrates 164 with a layer of hard cutting material (e.g., cutting table 162) disposed on one end of each respective substrate 164. The hard layer of cutting elements 128 may provide a cutting surface that may engage adjacent portions of a downhole formation to form wellbore 114 as illustrated in FIG. 1. The contact of the cutting surface with the formation may form a cutting zone associated with each of cutting elements 128. The edge of the cutting surface located within the cutting zone may be referred to as the cutting edge of a cutting element 128.

Each substrate 164 of cutting elements 128 may have various configurations and may be formed from tungsten carbide or other suitable materials associated with forming cutting elements for rotary drill bits. Tungsten carbides may include, but are not limited to, monotungsten carbide (WC), ditungsten carbide ($W_2C$), macrocrystalline tungsten carbide and cemented or sintered tungsten carbide. Substrates may also be formed using other hard materials, which may include various metal alloys and cements such as metal borides, metal carbides, metal oxides and metal nitrides. For some applications, the hard cutting layer may be formed from substantially the same materials as the substrate. In other applications, the hard cutting layer may be formed from different materials than the substrate. Examples of materials used to form hard cutting layers may include polycrystalline diamond materials, including synthetic polycrystalline diamonds. Blades 126 may include recesses or bit pockets 166 that may be configured to receive cutting elements 128. For example, bit pockets 166 may be concave cutouts on blades 126.

In some embodiments, blades 126 may also include one or more depth of cut controllers (DOCCs) (not expressly shown) configured to control the depth of cut of cutting elements 128. A DOCC may include an impact arrestor, a back-up or second layer cutting element and/or a Modified Diamond Reinforcement (MDR). Exterior portions of blades 126, cutting elements 128 and DOCCs (not expressly shown) may form portions of the bit face.

Blades 126 may further include one or more gage pads (not expressly shown) disposed on blades 126. A gage pad may be a gage, gage segment, or gage portion disposed on exterior portion of blade 126. Gage pads may contact adjacent portions of a wellbore (e.g., wellbore 114 as illustrated in FIG. 1) formed by drill bit 101. Exterior portions of blades 126 and/or associated gage pads may be disposed at various angles (e.g., positive, negative, and/or parallel) relative to adjacent portions of generally vertical wellbore 114a. A gage pad may include one or more layers of hardfacing material.

Uphole end 150 of drill bit 101 may include shank 152 with drill pipe threads 155 formed thereon. Threads 155 may be used to releasably engage drill bit 101 with BHA 120 whereby drill bit 101 may be rotated relative to bit rotational axis 104. Downhole end 151 of drill bit 101 may include a plurality of blades 126a-126g with respective junk slots or fluid flow paths 140 disposed therebetween. Additionally, drilling fluids may be communicated to one or more nozzles 156.

Drill bit operation may be expressed in terms of depth of cut per revolution as a function of drilling depth. Depth of cut per revolution, or "depth of cut," may be determined by rate of penetration (ROP) and revolution per minute (RPM). ROP may represent the amount of formation that is removed as drill bit 101 rotates and may be in units of ft/hr. Further, RPM may represent the rotational speed of drill bit 101. For example, drill bit 101 utilized to drill a formation may rotate at approximately 120 RPM. Actual depth of cut ($\Delta$) may represent a measure of the depth that cutting elements cut into the formation during a rotation of drill bit 101. Thus, actual depth of cut may be expressed as a function of actual ROP and RPM using the following equation:

$$\Delta = ROP/(5*RPM).$$

Actual depth of cut may have a unit of in/rev.

Figure 2B:
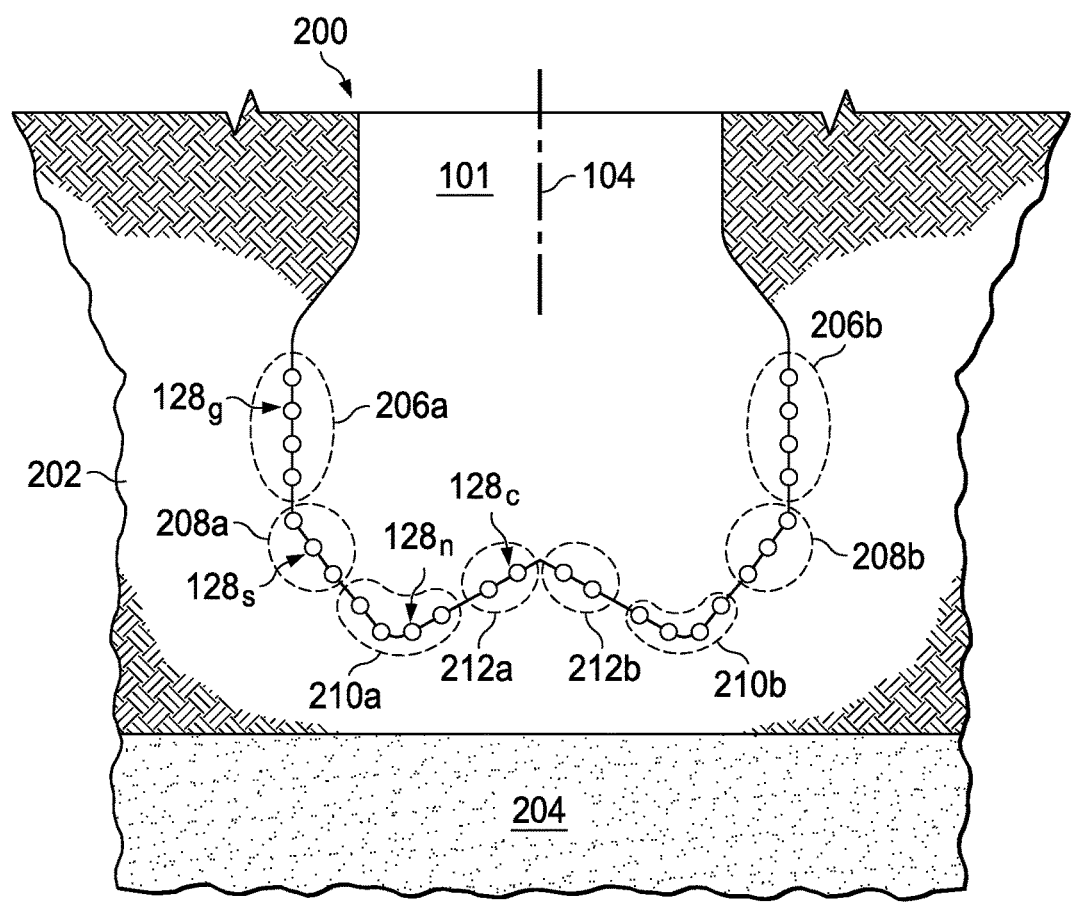
FIG. 2B illustrates a schematic drawing in section and in elevation with portions broken away showing the rotary drill bit of FIG. 2A drilling a wellbore through a first downhole formation and into an adjacent second downhole formation, in accordance with some embodiments of the present disclosure.

FIG. 2B illustrates a drawing in section and in elevation with portions broken away showing drill bit 101 of FIG. 2A drilling a wellbore through a first downhole formation and into an adjacent second downhole formation, in accordance with some embodiments of the present disclosure. Exterior portions of blades (not expressly shown), cutting elements 128 and DOCCs (not expressly shown) may be projected rotationally onto a radial plane to form bit face profile 200. In the illustrated embodiment, formation layer 202 may have a compressive strength or hardness less than the compressive strength or hardness of formation layer 204 such that formation layer 202 may be described as "softer" or "less hard" when compared to formation layer 204. As illustrated, drill bit 101 may include various zones or segments where the zones or segments on one side of bit rotational axis 104 may be substantially similar to the zones or segments on the opposite side of bit rotational axis 104.

For example, drill bit 101 may include gage zone 206a located opposite gage zone 206b, shoulder zone 208a located opposite shoulder zone 208b, nose zone 210a located opposite nose zone 210b, and cone zone 212a located opposite cone zone 212b. Cutting elements 128 included in each zone may be referred to as cutting elements of that zone. For example, cutting elements $128_g$ included in gage zones 206 may be referred to as gage cutting elements, cutting elements 128, included in shoulder zones 208 may be referred to as shoulder cutting elements, cutting elements $128_n$ included in nose zones 210 may be referred to as nose cutting elements, and cutting elements $128_c$ included in cone zones 212 may be referred to as cone cutting elements. Cone cutting elements $128_c$ may also be described as "inner cutting elements" and shoulder cutting elements $128_s$ may also be described as "outer cutting elements." Further, each zone or segment may be defined in part by respective portions of associated blades 126.

Cone zones 212 may be generally concave and may be formed on exterior portions of each blade (e.g., blades 126 as illustrated in FIG. 1) of drill bit 101, adjacent to and extending out from bit rotational axis 104. Nose zones 210 may be generally convex and may be formed on exterior portions of each blade of drill bit 101, adjacent to and extending from each cone zone 212. Shoulder zones 208 may be formed on exterior portions of each blade 126 extending from respective nose zones 210 and may terminate proximate to respective gage zones 206.

During transition drilling between formation layer 202 and formation layer 204, imbalance forces may be applied to drill bit 101 or other downhole drilling tool resulting in undesired vibration of an associated drill string (e.g., drill string 103 as illustrated in FIG. 1). Excessive amounts of vibration or imbalance forces applied to a drill string while forming a directional wellbore (e.g., wellbore 114b as illustrated in FIG. 1) may cause problems with steering the drill string and/or damage one or more downhole components. To reduce these imbalance forces and vibrations, drill bit 101 may be designed and manufactured at least in part based on simulations using multilevel force balancing techniques. The simulations may include assigning cutting elements 128 to respective cutting element groups and cutting element sets, determining a configuration for installing cutting elements 128 on drill bit 101, evaluating forces acting on cutting elements 128 in each cutting element group and cutting element set and evaluating resulting imbalance forces acting on drill bit 101 or other downhole drilling tool.

Multilevel force balancing may include, but is not limited to, various levels of force balancing, such as level one through level five. According to multilevel force balancing criteria, cutting elements 128 in each cutting element group may be force balanced, which may be referred to as "level one force balancing." In some embodiments, each cutting element group may have two, three, four or five cutting elements as discussed in detail below with respect to FIGS. 3A-3H. In other embodiments, force balancing may be conducted for respective cutting element groups of more than five neighbor cutting elements. The cutting element group may be force balanced when the magnitude of the imbalance forces associated with cutting elements 128 in the cutting element group is smaller than that associated with each individual cutting element in the same group. When performing level one force balancing, cutting elements 128 in each cutting element group may be in a uniform formation.

Cutting elements 128 in each neighbor cutting element group may also be force balanced, which may be referred to as "level two force balancing." Neighbor cutting element groups may be force balanced when the magnitude of the imbalance forces associated with at least two neighbor cutting element groups is smaller than that associated with each individual cutting element in the same neighbor cutting element groups. When performing level two force balancing, cutting elements 128 in each neighbor cutting element group may be in a uniform formation.

Cutting elements 128 of drill bit 101 or other downhole drilling tool may then be divided into respective cutting element sets. Each cutting element set may include at least two force balanced cutting element groups. The number of cutting elements 128 within each cutting element set may equal the number of blades on drill bit 101 or other downhole drilling tool. Cutting elements 128 in each cutting element set may also be force balanced, which may be referred to as "level three force balancing." A cutting element set may be force balanced when the magnitude of the imbalance forces associated with cutting elements 128 in the cutting element set is smaller than that associated with each individual cutting element in the same set. When performing level three force balancing, cutting elements 128 in the set may be in a uniform formation.

Neighbor cutting elements 128 disposed adjacent to each other on an associated bit face profile or cutting face profile may be divided into respective groups (N) of either three or four consecutive cutting elements per group. The number of cutting elements 128 in each group of N (N=3 or N=4) neighbor cutting elements may depend on the number of blades and the cutting element set used to lay out cutting elements 128. Cutting elements 128 in each neighbor cutting element group may be force balanced, which may be referred to as "level four force balancing." Consecutive neighbor cutting elements (N=3 or N=4) may be force balanced when the magnitude of the imbalance forces associated with N consecutive neighbor cutting elements 128 is smaller than the maximum imbalance forces associated with each cutting element 128 of N consecutive cutting elements. When performing level four force balancing, cutting elements 128 in the set may be in a uniform formation.

A final level or "level five force balancing" may include simulating forces acting on all cutting elements 128 on drill bit 101 when engaged with a generally uniform and/or a generally non-uniform downhole formation, which may be referred to as "all cutting element level force balancing." Simulations may include evaluating force balancing after each level.

In some embodiments, the configuration of cutting elements 128 may be further modified to improve stability and drilling efficiency. In some embodiments, some of cutting elements 128 on drill bit 101 may be laid out in a single-set configuration and some of cutting elements 128 on drill bit 101 may be laid out in a track-set configuration. In other embodiments, cutting elements 128 may be laid out in a track-set configuration. In further embodiments, some neighbor cutting elements 128 on drill bit 101 may be under-exposed with respect to other cutting elements such that the bit profile for drill bit 101 includes at least one step and groves may be formed by drill bit 101 at the end of a wellbore (e.g., wellbore 114 as illustrated in FIG. 1) during drilling operations. Accordingly, drill bits and other downhole drilling tools designed according to the present disclosure may be more stable and have an increased drilling efficiency than drill bits designed using conventional methods.

FIGS. 3A, 3C, 3E and 3G illustrate schematic drawings showing various components of respective bit faces or cutting faces 302a, 302b, 302c and 302d disposed on drill bit 101 or other downhole drilling tool, in accordance with some embodiments of the present disclosure. FIGS. 3B, 3D, 3F and 3H illustrate schematic drawings showing portions of a composite bit face profile or composite cutting face profile corresponding with the components shown in respective FIGS. 3A, 3C, 3E and 3G, in accordance with some embodiments of the present disclosure. To provide a frame of reference, each of FIGS. 3B, 3D, 3F and 3H include a z-axis that represents bit rotational axis 104 of drill bit 101 and radial axis 106 that indicates the orthogonal distance from rotational axis 104. Blades and associated cutting elements discussed with respect to FIGS. 3A-3H may be disposed on exterior portions of drill bit 101 as illustrated in FIGS. 1 and 2A-2B. FIGS. 3A-3H show various examples of selecting respective cutting element groups for level one multilevel force balancing an associated downhole drilling tool, in accordance with some embodiments of the present disclosure.

Figure 3C:
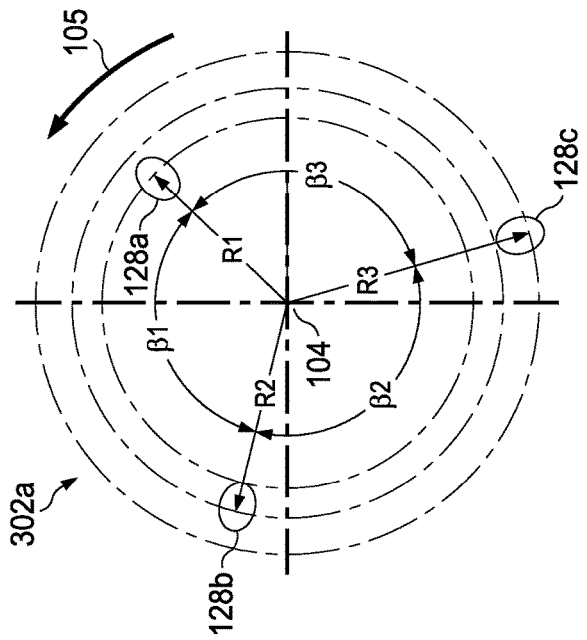
FIG. 3C illustrates a schematic drawing of a bit face for a downhole drilling tool including a three cutting element group for use in multilevel force balancing the downhole drilling tool, in accordance with some embodiments of the present disclosure.
Figure 3D:
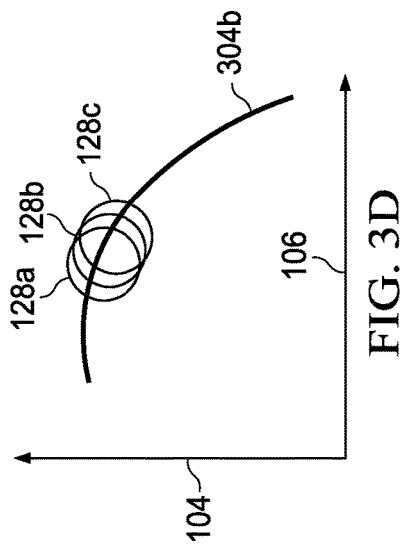
FIG. 3D illustrates a schematic drawing of a bit face profile for the downhole drilling tool of FIG. 3C, in accordance with some embodiments of the present disclosure.
Figure 3A:
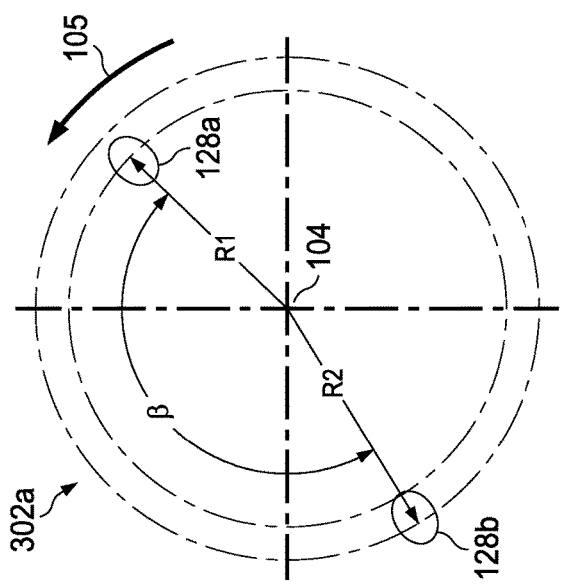
FIG. 3A illustrates a schematic drawing of a bit face for a downhole drilling tool including a two cutting element group for use in multilevel force balancing the downhole drilling tool, in accordance with some embodiments of the present disclosure.
Figure 3B:
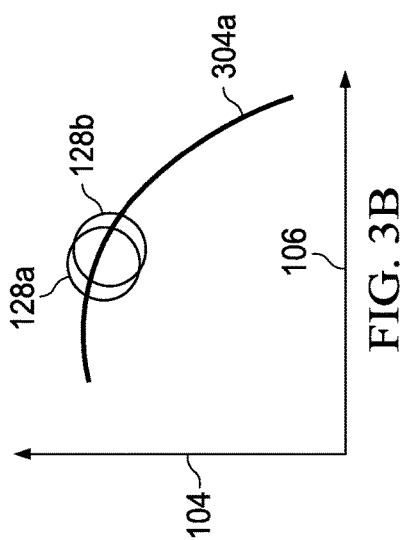
FIG. 3B illustrates a schematic drawing of a bit face profile for the downhole drilling tool of FIG. 3A, in accordance with some embodiments of the present disclosure.

FIGS. 3A and 3B illustrate one example of a "two cutting element group" represented by cutting elements 128a and

128b, which may be disposed on exterior portions of respective blades (e.g., blades 126 as illustrated in FIGS. 1 and 2A-2B). A two cutting element group may be a pair of cutting elements 128 disposed on exterior portions of an associated bit face spaced radially between approximately 160° and 200° from each other relative to bit rotational axis 104. Cutting elements 128a and 128b represent only one example of a two cutting element group satisfactory for use in level one force balancing associated downhole drilling tools using multilevel force balancing techniques.

As shown in FIG. 3A, radial distance $R_2$ from bit rotational axis 104 to second cutting element 128b is greater than the radial distance $R_1$ from bit rotational axis 104 to first cutting element 128a. In other embodiments, radial distance $R_1$ may be approximately equal to radial distance $R_2$ such that cutting elements 128a and 128b are track-set with respect to each other. Angle ß between cutting element 128a and 128b relative to rotational axis 104 is approximately 170°. In some embodiments, the radial spacing or angle of separation for the first and second cutting elements in a two cutting element group is approximately 180°. As shown in FIG. 3B, cutting elements 128a and 128b are neighbor cutting elements because cutting elements 128a and 128b are disposed immediately adjacent to each other on composite bit face profile 304a.

FIGS. 3C and 3D illustrate one example of a "three cutting element group" represented by cutting elements 128a, 128b and 128c, which may be disposed on exterior portions of respective blades (e.g., blades 126 as illustrated in FIGS. 1 and 2A-2B). A three cutting element group may be three cutting elements 128 disposed on exterior portions of an associated bit face spaced radially from each other between approximately 100° and 140° relative to bit rotational axis 104. Cutting elements 128a, 128b and 128c represent only one example of a three cutting element group satisfactory for use in level one force balancing associated downhole drilling tools using multilevel force balancing techniques.

As shown in FIG. 3C, radial distance $R_3$ from bit rotational axis 104 to third cutting element 128c is greater than radial distance $R_2$ from bit rotational axis 104 to second cutting element 128b. Additionally, radial distance $R_2$ from bit rotational axis 104 to second cutting element 128b is greater than radial distance $R_1$ from bit rotational axis 104 to first cutting element 128a. In other embodiments, radial distance $R_1$, radial distance $R_2$ and radial distance $R_3$ may be approximately equal such that cutting elements 128a, 128b and 128c are track-set with respect to each other. Angle $ß_1$ between cutting elements 128a and 128b, angle $ß_2$ between cutting elements 128b and 128c and angle $ß_3$ between cutting element 128c and 128a are each greater than 100° and less than 140°. In some embodiments, the radial spacing or angle of separation for the cutting elements in a three cutting element group is approximately 120°. As shown in FIG. 3D, cutting elements 128a, 128b and 128c are neighbor cutting elements because cutting elements 128a, 128b and 128c are disposed adjacent to each other on composite bit face profile 304b.

Figure 3G:
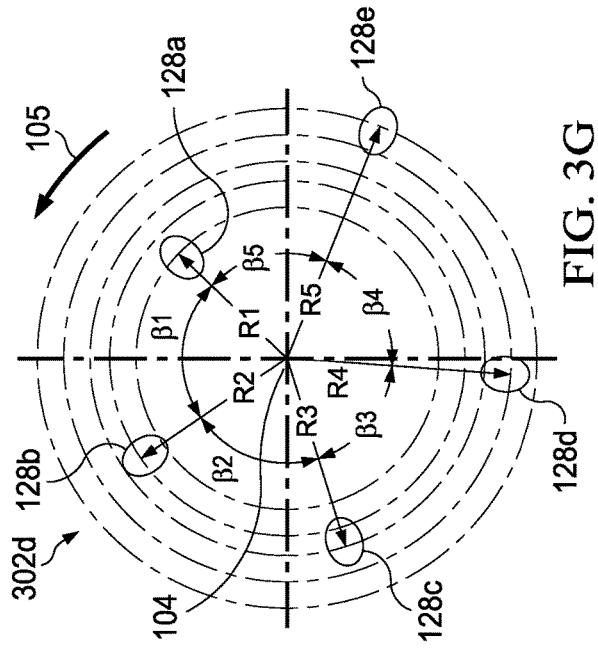
FIG. 3G illustrates a schematic drawing of a bit face for a downhole drilling tool including a five cutting element group for use in multilevel force balancing the downhole drilling tool, in accordance with some embodiments of the present disclosure.
Figure 3H:
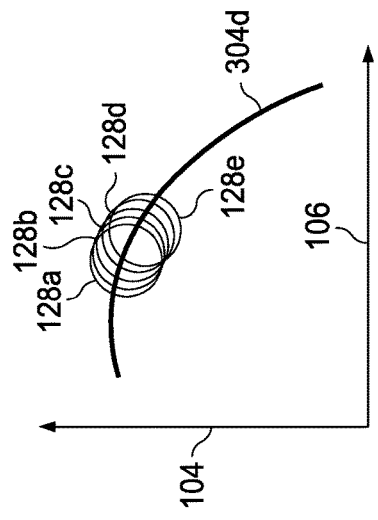
FIG. 3H illustrates a schematic drawing of a bit face profile for the downhole drilling tool of FIG. 3G, in accordance with some embodiments of the present disclosure.
Figure 3E:
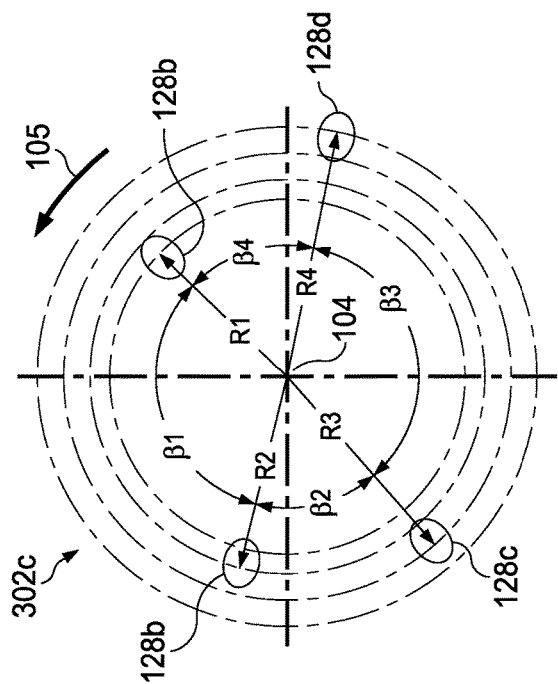
FIG. 3E illustrates a schematic drawing of a bit face for a downhole drilling tool including a four cutting element group for use in multilevel force balancing the downhole drilling tool, in accordance with some embodiments of the present disclosure.
Figure 3F:
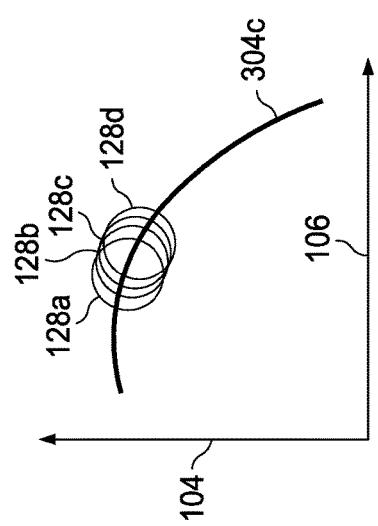
FIG. 3F illustrates a schematic drawing of a bit face profile for the downhole drilling tool of FIG. 3E, in accordance with some embodiments of the present disclosure.

FIGS. 3E and 3F illustrate one example of a "four cutting element group" represented by cutting elements 128a, 128b, 128c and 128d, which may be disposed on exterior portions of respective blades (e.g., blades 126 as illustrated in FIGS. 1 and 2A-2B). A four cutting element group may be four cutting elements 128 disposed on exterior portions of an associated bit face spaced radially from each other with the angle of separation between the first and second cutting elements approximately equal to the angle of separation between the third and fourth cutting elements and the angle of separation between the second and third cutting elements approximately equal to the angle of separation between the fourth and first cutting elements. Cutting elements 128a, 128b, 128c and 128d represent only one example of a four cutting element group satisfactory for use in level one force balancing associated downhole drilling tools using multi-level force balancing techniques.

As shown in FIG. 3E, radial distance $R_4$ from bit rotational axis 104 to fourth cutting element 128d is greater than radial distance $R_3$ from bit rotational axis 104 to third cutting element 128c. Additionally, radial distance $R_3$ from bit rotational axis 104 to third cutting element 128c is greater than radial distance $R_2$ from bit rotational axis 104 to second cutting element 128b. Further, radial distance $R_2$ from bit rotational axis 104 to second cutting element 128b is greater than radial distance $R_1$ from bit rotational axis 104 to first cutting element 128a. In other embodiments, radial distance $R_1$, radial distance $R_2$, radial distance $R_3$ and radial distance $R_4$ may be approximately equal such that cutting elements 128a, 128b, 128c and 128d are track-set with respect to each other. Angle $ß_1$ between cutting elements 128a and 128b may be approximately equal to angle $ß_3$ between cutting elements 128c and 128d. Additionally, angle $ß_2$ between cutting elements 128b and 128c may be approximately equal to angle $ß_4$ between cutting elements 128d and 128a. As shown in FIG. 3F, cutting elements 128a, 128b, 128c and 128d are neighbor cutting elements because cutting elements 128a, 128b, 128c and 128d are disposed adjacent to each other on composite bit face profile 304c.

FIGS. 3G and 3H illustrate one example of a "five cutting element group" represented by cutting elements 128a, 128b, 128c, 128d and 128e, which may be disposed on exterior portions of respective blades (e.g., blades 126 as illustrated in FIGS. 1 and 2A-2B). A five cutting element group may be five cutting elements 128 disposed on exterior portions of an associated bit face spaced radially from each other with the angle of separation between the each of cutting elements being approximately 72° plus or minus 20°. Cutting elements 128a, 128b, 128c, 128d and 128e represent only one example of a five cutting element group satisfactory for use in level one force balancing an associated downhole drilling tools using multilevel force balancing techniques.

As shown in FIG. 3G, radial distance $R_5$ from bit rotational axis 104 to fifth cutting element 128e is greater than radial distance $R_4$ from bit rotational axis 104 to fourth cutting element 128d. Additionally, radial distance $R_4$ from bit rotational axis 104 to fourth cutting element 128d is greater than radial distance $R_3$ from bit rotational axis 104 to third cutting element 128c. Further, radial distance $R_3$ from bit rotational axis 104 to third cutting element 128c is greater than radial distance $R_2$ from bit rotational axis 104 to second cutting element 128b. Also, radial distance $R_2$ from bit rotational axis 104 to second cutting element 128b is greater than radial distance $R_1$ from bit rotational axis 104 to first cutting element 128a. In other embodiments, radial distance $R_1$, radial distance $R_2$, radial distance $R_3$, radial distance $R_4$ and radial distance $R_5$ may be approximately equal such that cutting elements 128a, 128b, 128c, 128d and 128e are track-set with respect to each other. Angles $ß_1$ through $ß_5$ may be approximately 72°. As shown in FIG. 3H, cutting elements 128a, 128b, 128c, 128d and 128e are neighbor cutting elements because cutting elements 128a, 128b, 128c, 128d and 128e are disposed adjacent to each other on composite bit face profile 304d.

FIGS. 4A and 4B illustrate table 401 including examples of parameters for use in multilevel force balancing of drill bit 101 or other downhole drilling tools, in accordance with some embodiments of the present disclosure. In the illustrated embodiment, table 401 lists some possible cutting element sets for a given number of blades and blade groups for an associated downhole drilling tool. In other embodiments, other cutting element sets may be possible given the number of blades and the configurations for the blade groups. Selection of various configurations for the blade groups and the cutting elements sets is further described below with respect to FIGS. 6 and 7. Although table 401 includes various configurations for downhole drilling tools (e.g., drill bit 101 as illustrated in FIGS. 1 and 2A-2B), multilevel force balancing techniques may apply to downhole drilling tools having fewer than four blades or greater than fifteen blades and other algorithms may be used to determine the blade groups and respective cutting element sets.

FIG. 5 illustrates table 501 including example level four force balanced cutting element sets for drill bit 101 or other downhole drilling tools, in accordance with some embodiments of the present disclosure. As illustrated, at least one configuration for a downhole drilling tool with between five and fifteen blades exists that provides level four force balancing. However, other configurations may exist that provide level four force balancing. Although table 501 includes various configurations for downhole drilling tools (e.g., drill bit 101 as illustrated in FIGS. 1 and 2A-2B), multilevel force balancing techniques may apply to downhole drilling tools having fewer than four blades or greater than fifteen blades and other algorithms may be used to determine the blade groups to provide a level four forced balanced cutting element set.

Tables 401 and 501 may be generated by using various computer programs, models or any combination thereof. The programs and/or models may include instructions stored on computer readable media and operable to perform, when executed, one or more steps for generating the information include in tables 401 and 501. The computer readable media may include any system, apparatus or device configured to store and retrieve programs or instructions, such as a hard disk drive, a compact disc, flash memory or any other suitable device. The programs and models may be configured to direct a processor or other suitable processing device to retrieve and execute the instructions from the computer readable media. In some embodiments, the processor and computer readable media may be included in a computer or other device including processing capability. The computer may further include memory and communication ports for communicating with external devices and various input and output (I/O) devices, such as a keyboard, a mouse and/or a video display.

Figure 6:
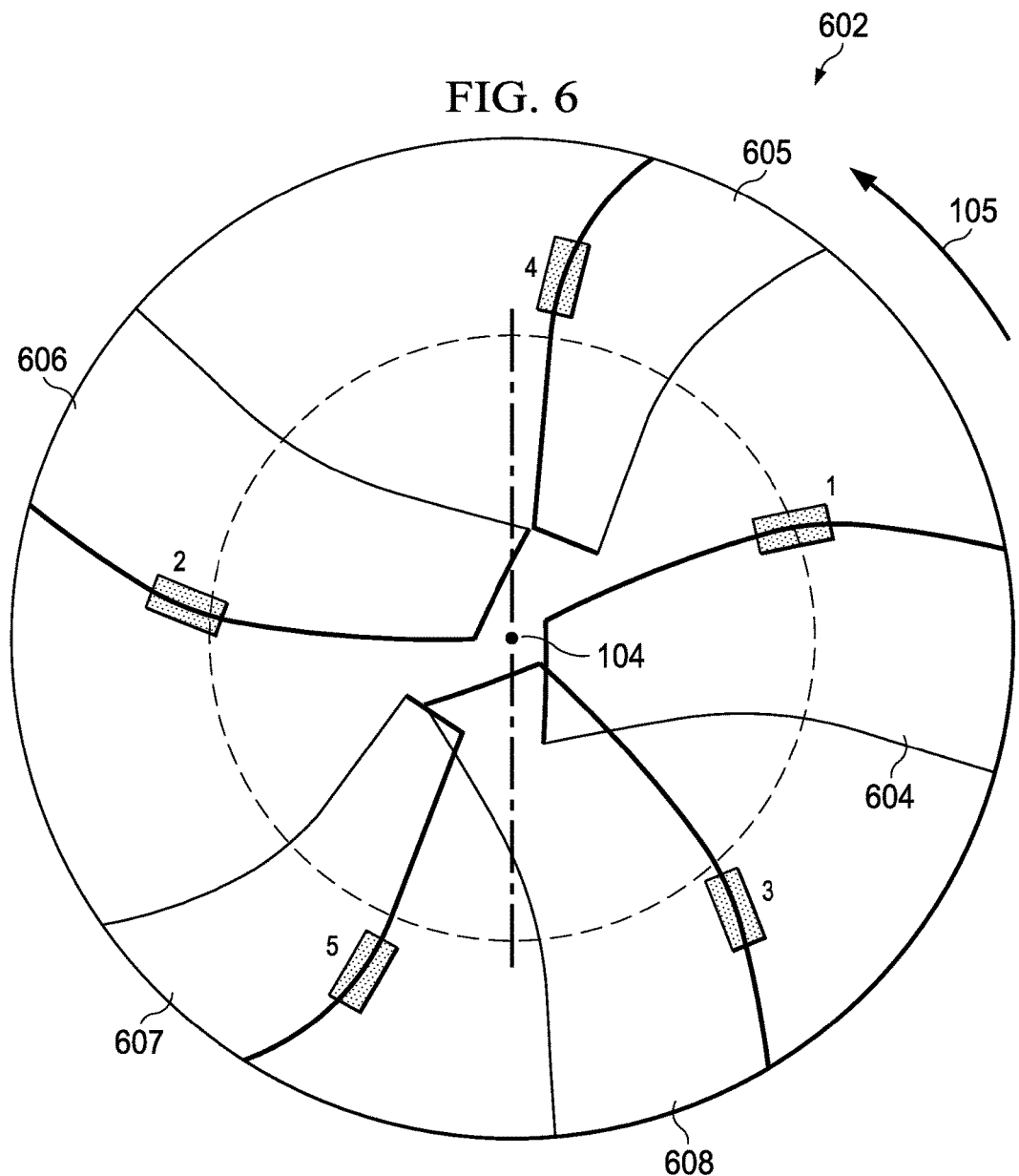
FIG. 6 illustrates a schematic drawing of a bit face for a downhole drilling tool having five blades including exemplary locations to install cutting elements based on blade groups and cutting element sets for use in multilevel force balancing the downhole drilling tool, in accordance with some embodiments of the present disclosure.

FIG. 6 illustrates a schematic drawing of bit face 602 for a downhole drilling tool having five blades including exemplary locations to install cutting elements based on blade groups and cutting element sets for use in multilevel force balancing the downhole drilling tool, in accordance with some embodiments of the present disclosure. Blades and associated cutting elements discussed with respect to FIG. 6 may be disposed on exterior portions of drill bit 101 as illustrated in FIGS. 1 and 2A-2B.

The number of blades on a downhole drilling tool may be divided into groups depending on the type of cutting element groups used for level one force balancing as illustrated in table 401 of FIGS. 4A and 4B. As illustrated in FIG. 4A, a five-bladed downhole drilling tool may be divided into a two blade group having one of two different configurations. FIG. 6 illustrates exemplary locations for installing cutting elements in a two blade group having the configuration (1,3,5) (2,4). Blades 604, 606 and 608 may be primary blades and may form the first blade group. Blades 605 and 607 may be secondary blades and may form the second blade group. In the illustrated embodiment, a three cutting element group may be laid out on the first blade group (1,3,5) and imbalance forces created by the three cutting element group may be balanced or minimized. A two cutting element group may be laid out on the second blade group (2,4) and imbalance forces created by the two cutting element group may be balanced or minimized. Imbalance forces created by respective cutting elements in each cutting element group may be balanced or minimized by adjusting respective cutting element locations, cutting element orientations such as back rake, side rake, cutting element size and phase angle. Further, imbalance forces associated with the two neighbor cutting element groups may be balanced such that a five-bladed downhole drilling tool including a two blade group having the configuration (1,3,5) (2,4) may be level two force balanced.

A cutting element set includes at least two force balanced neighbor cutting element groups. In some embodiments, the number of cutting elements in one cutting element set may be equal to the number of blades on a downhole drilling tool. Cutting element set [(1,3,5) (2,4)] as illustrated in FIG. 6 may include two cutting element groups. The first cutting element group may include cutting elements 1, 2 and 3 installed on primary blades 604, 606 and 608 and the second cutting element group may include cutting elements 4 and 5 installed on secondary blades 605 and 607. Imbalance forces created by all of the cutting elements in cutting element set [(1,3,5) (2,4)] may be balanced such that cutting element set [(1,3,5) (2,4)] may be a level three force balanced cutting element set. Further, as illustrated in table 401 of FIG. 4A, cutting element set [(1,3,5) (2,4)] may be the preferred match for a five-bladed downhole drilling tool such that cutting element set [(1,3,5) (2,4)] may also be a level four force balanced cutting element set.

Figure 7A:
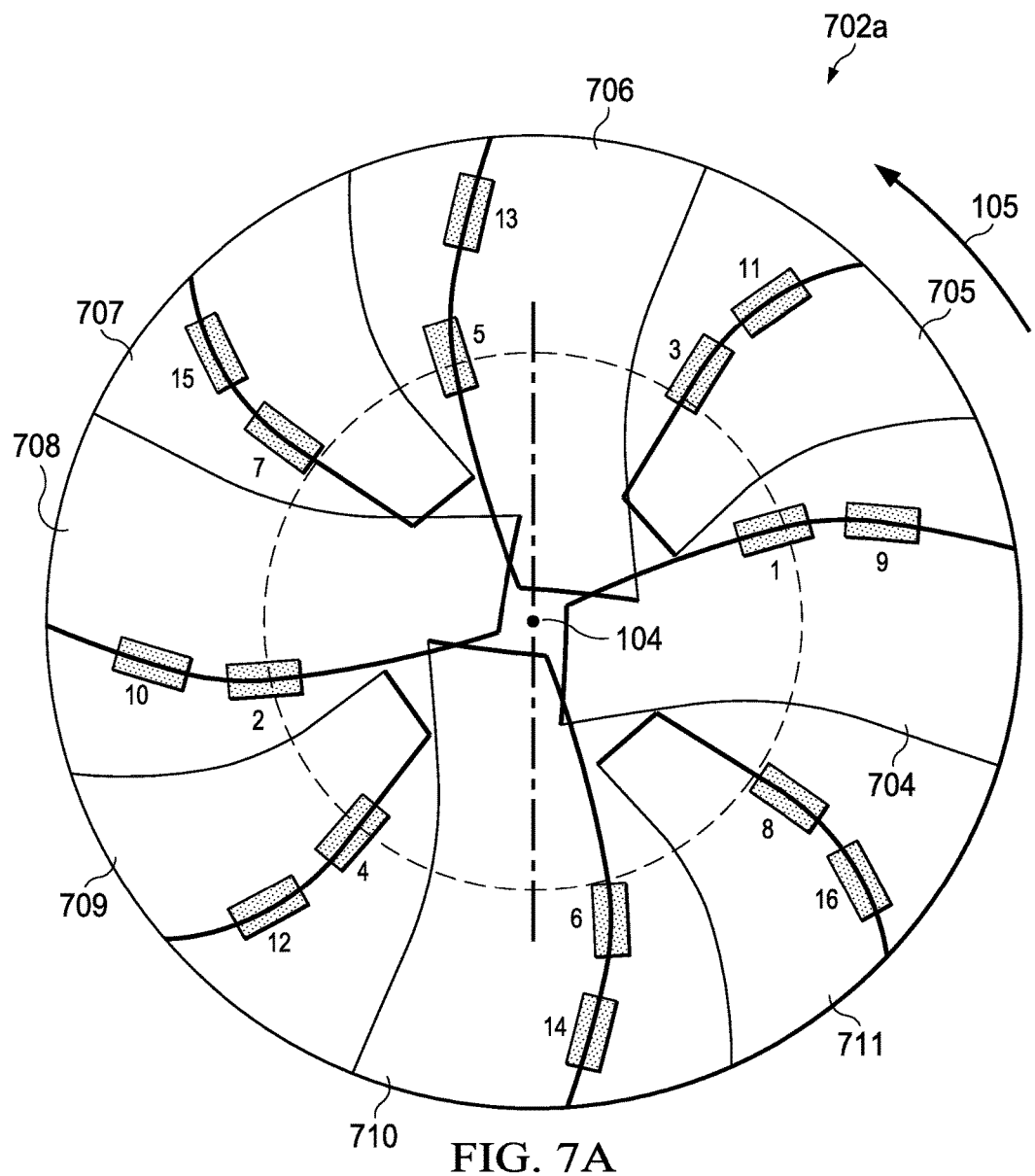
FIGS. 7A and 7B illustrate schematic drawings of bit faces for downhole drilling tools having eight blades including exemplary locations to install cutting elements based on blade groups and cutting element sets for use in multilevel force balancing the downhole drilling tools, in accordance with some embodiments of the present disclosure.
Figure 7B:
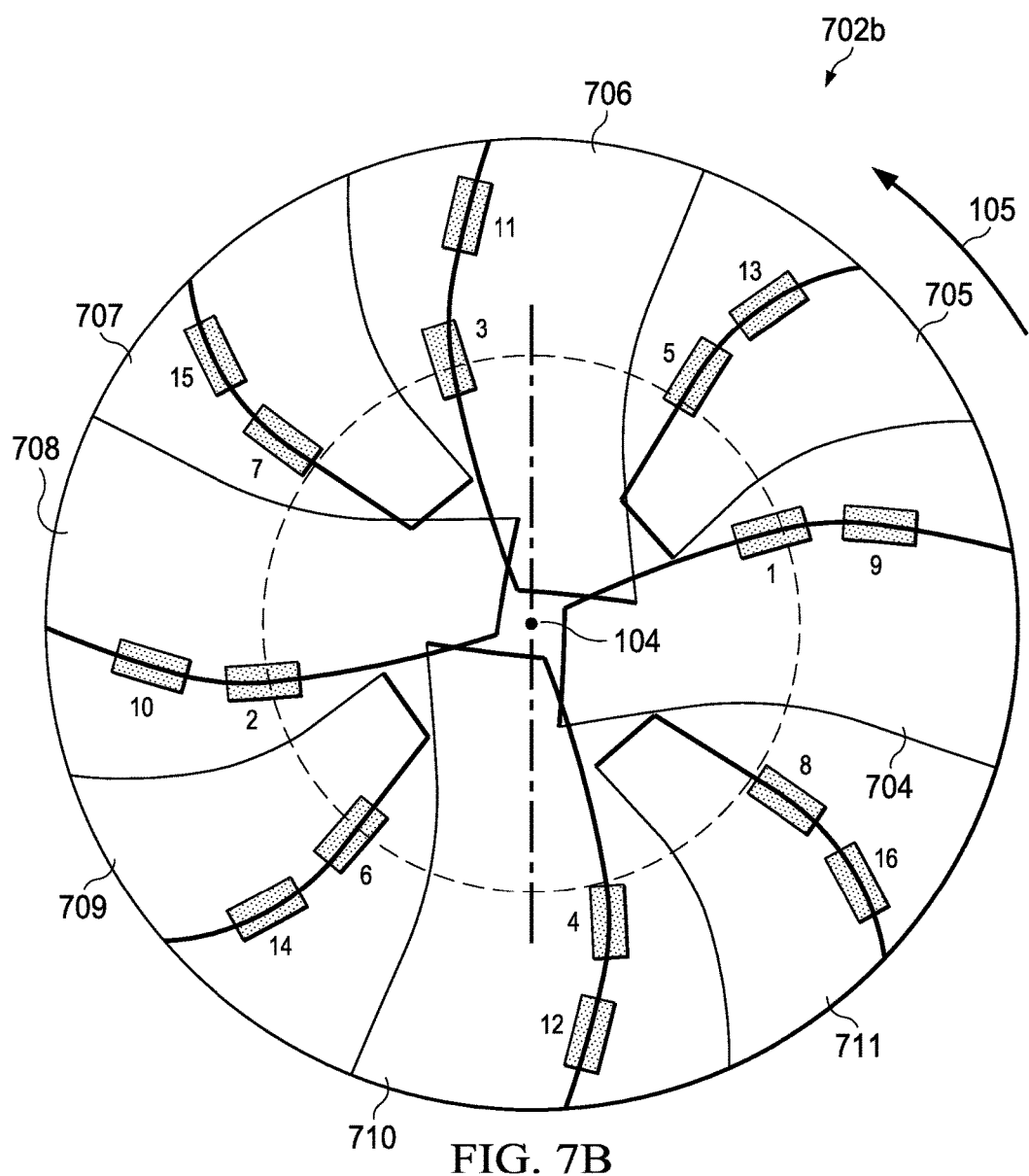

FIGS. 7A and 7B illustrate schematic drawings of bit faces 702a and 702b for downhole drilling tools having eight blades including exemplary locations to install cutting elements based on blade groups and cutting element sets for use in multilevel force balancing the downhole drilling tools, in accordance with some embodiments of the present disclosure. Blades and associated cutting elements discussed with respect to FIGS. 7A and 7B may be disposed on exterior portions of drill bit 101 as illustrated in FIGS. 1 and 2A-2B.

As illustrated in table 401 of FIG. 4A, an eight-bladed downhole drilling tool may be divided into a two blade group, a pair blade group or a three blade group. FIGS. 7A and 7B illustrate exemplary locations for installing cutting elements using the pair blade group algorithm such that the blades are divided into two different pair blade groups: (1,5), (2,6), (3,7), (4,8) and (1,5), (3,7), (2,6), (4,8). Blades 704, 706, 708 and 710 may be primary blades and blades 705, 707, 709 and 711 may be secondary blades. In FIG. 7A, blades 704 and 708 may form the first blade group, blades 705 and 709 may form the second blade group, blades 706 and 710 may form the third blade group and blades 707 and 711 may form the fourth blade group. In FIG. 7B, blades 704 and 708 may form the first blade group, blades 706 and 710 may form the second blade group, blades 705 and 709 may form the third blade group and blades 707 and 711 may form the fourth blade group.

In the illustrated embodiments, four two cutting element groups may be laid out in the respective pair groups and imbalance forces created by each of the two cutting element groups may be balanced or minimized. Similar to the cutting element groups discussed with respect to FIG. 6, imbalance forces created by respective cutting elements in each cutting element group may be balanced or minimized by adjusting respective cutting element locations, cutting element orientations such as back rake, side rake, cutting element size and phase angle. Further, imbalance forces associated with two neighbor cutting element groups may be balanced such that an eight-bladed downhole drilling tool including a two blade group having either of the configurations (1,5), (2,6), (3,7), (4,8) and (1,5), (3,7), (2,6), (4,8) may be level two force balanced.

Cutting element set [(1,5) (2,6) (3,7) (4,8)] as illustrated in FIG. 7A may include four two cutting element groups. The first cutting element group may include cutting elements 1 and 2 installed on primary blades 704 and 708, the second cutting element group may include cutting elements 3 and 4 installed on secondary blades 705 and 709, the third cutting element group may include cutting elements 5 and 6 installed on primary blades 706 and 710 and the fourth cutting element group may include cutting elements 7 and 8 installed on secondary blades 707 and 711. Imbalance forces created by all of the cutting elements in cutting element set [(1,5) (2,6) (3,7) (4,8)] may be balanced such that cutting element set [(1,5) (2,6) (3,7) (4,8)] may be a level three force balanced cutting element set.

Cutting element set [(1,5) (3,7) (2,6) (4,8)] as illustrated in FIG. 7B may also include four two cutting element groups but the order for installing the cutting elements may be different. Like FIG. 7A, the first cutting element group may include cutting elements 1 and 2 installed on primary blades 704 and 708 and the fourth cutting element group may include cutting elements 7 and 8 installed on secondary blades 707 and 711. However, the second cutting element group may include cutting elements 3 and 4 installed on primary blades 706 and 710 and the third cutting element group may include cutting elements 5 and 6 installed on secondary blades 705 and 709. Imbalance forces created by all of the cutting elements in cutting element set [(1,5) (3,7) (2,6) (4,8)] may be balanced such that cutting element set [(1,5) (3,7) (2,6) (4,8)] is also a level three force balanced cutting element set. Further, as illustrated in table 401 of FIG. 4A, cutting element set [(1,5) (3,7) (2,6) (4,8)] may be the preferred match for an eight-bladed downhole drilling tool such that cutting element set [(1,5) (3,7) (2,6) (4,8)] may also be a level four force balanced cutting element set.

FIGS. 8A, 8C, 8E, 8G and 8I illustrate schematic drawings showing various components of respective bit faces or cutting faces 802a, 802b, 802c, 802d and 802e disposed on drill bit 101 or other downhole drilling tool, in accordance with some embodiments of the present disclosure. FIGS. 8B, 8D, 8F, 8H and 8J illustrate schematic drawings showing portions of a composite bit face profile or composite cutting face profile corresponding with the components shown in respective FIGS. 8A, 8C, 8E, 8G and 8I, in accordance with some embodiments of the present disclosure. To provide a frame of reference, each of FIGS. 8B, 8D, 8F, 8H and 8J include a z-axis that represents bit rotational axis 104 of drill bit 101 and radial axis 106 that indicates the orthogonal distance from bit rotational axis 104. Blades and associated cutting elements discussed with respect to FIGS. 8A-8J may be disposed on exterior portions of drill bit 101 as illustrated in FIGS. 1 and 2A-2B. FIGS. 8A-8J show various examples of laying out cutting elements in combinations of single-set or track-set configurations on a downhole drilling tool using multilevel force balancing techniques, in accordance with some embodiments of the present disclosure.

Figure 8A:
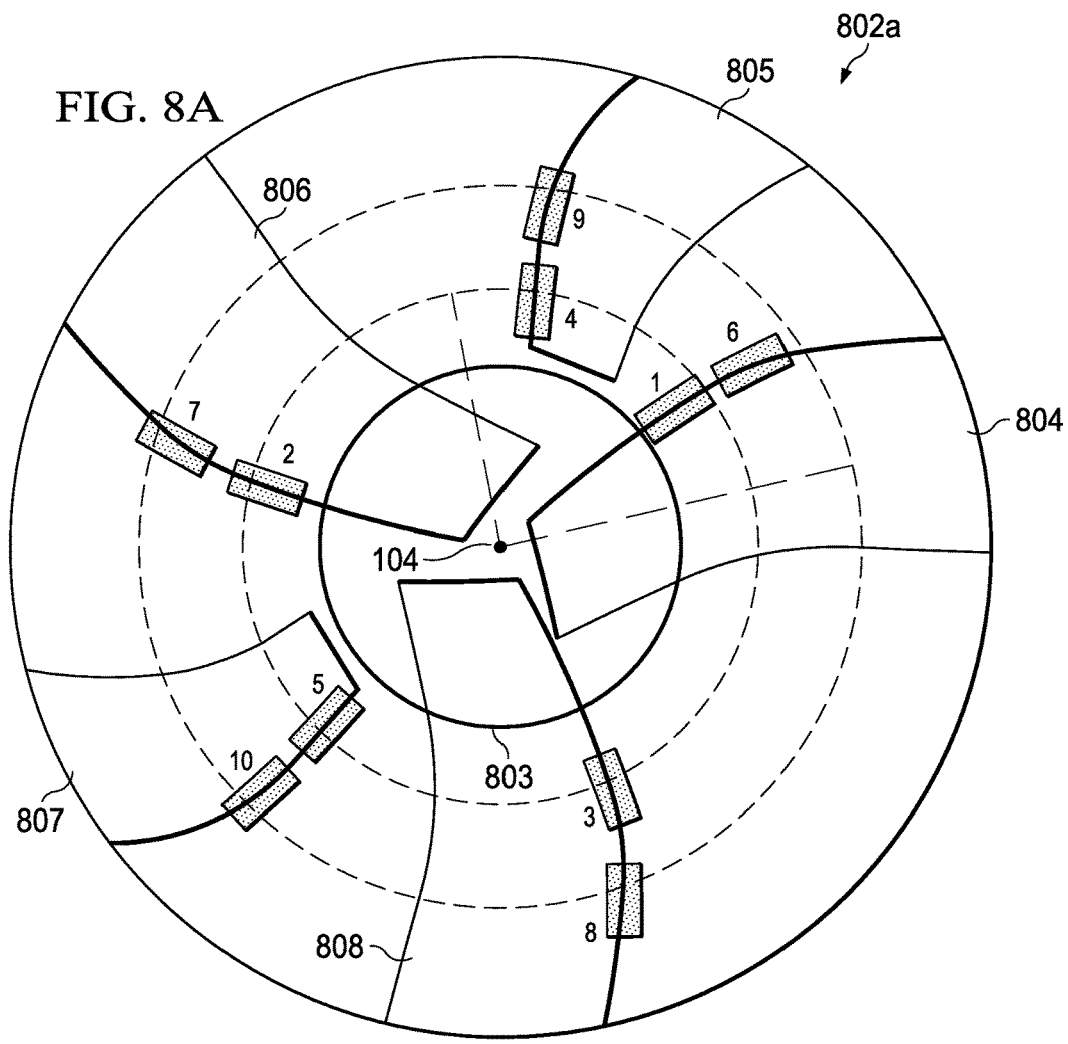
FIG. 8A illustrates a schematic drawing of a bit face for a downhole drilling tool having five blades including exemplary locations to install cutting elements in a combination of single-set and track-set configurations for use in multilevel force balancing the downhole drilling tool, in accordance with some embodiments of the present disclosure.
Figure 8B:
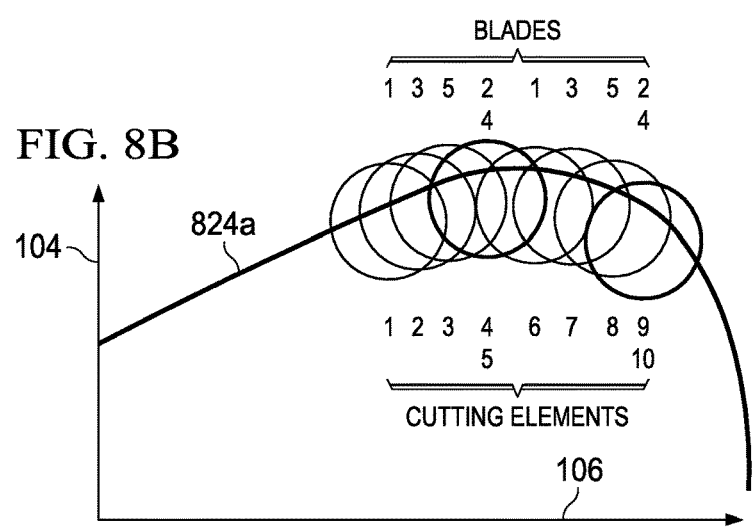
FIG. 8B illustrates a schematic drawing of a bit face profile for the downhole drilling tool of FIG. 8A, in accordance with some embodiments of the present disclosure.

FIGS. 8A and 8B illustrate one example of a five-bladed downhole drilling tool that includes both single-set and track-set cutting elements laid out in accordance with multilevel force balancing techniques. As shown in FIG. 8A, blades of the downhole drilling tool may be divided into a two blade group having the configuration (1,3,5) (2,4). Blades 804, 806 and 808 may be primary blades and may form the first blade group. Blades 805 and 807 may be secondary blades and may form the second blade group. In the illustrated embodiment, cutting elements 1, 2 and 3 may be respectively laid out in a three cutting element group on primary blades 804, 806 and 808 and each of the cutting elements in the group may be single-set. Cutting elements 4 and 5 may be respectively laid out on secondary blades 805 and 807 in a two cutting element group and the cutting elements in the group may be track-set. These cutting element groups may form cutting element set [(1,3,5) (2,4)]. The single-set cutting elements of the first blade group may drill into a formation at a higher efficiency while the track-set cutting elements of the second blade group may provide stability as the downhole drilling tool drills into the formation.

As shown in FIG. 8B, cutting elements in the cutting element set [(1,3,5) (2,4)] are neighbor cutting elements because individual cutting elements 1, 2 and 3 and the two cutting element group including track-set cutting elements 4 and 5 are disposed immediately adjacent to each other on bit face profile 824a. Additionally, as illustrated in table 401 of FIG. 4A and table 501 of FIG. 5, cutting element set [(1,3,5) (2,4)] may be levels one through four force balanced.

Figure 8C:
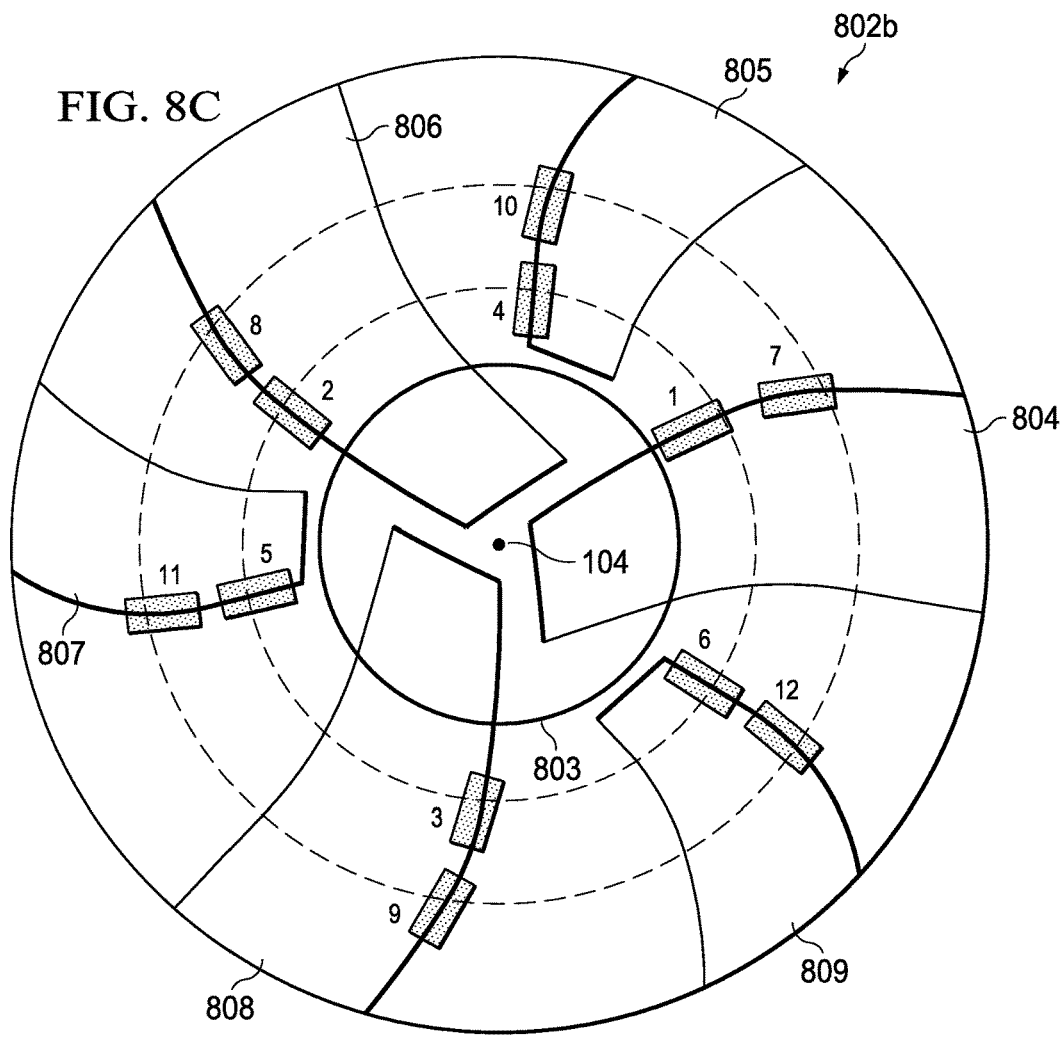
FIG. 8C illustrates a schematic drawing of a bit face for a downhole drilling tool having six blades including exemplary locations to install cutting elements in a combination of single-set and track-set configurations for use in multilevel force balancing the downhole drilling tool, in accordance with some embodiments of the present disclosure.
Figure 8D:
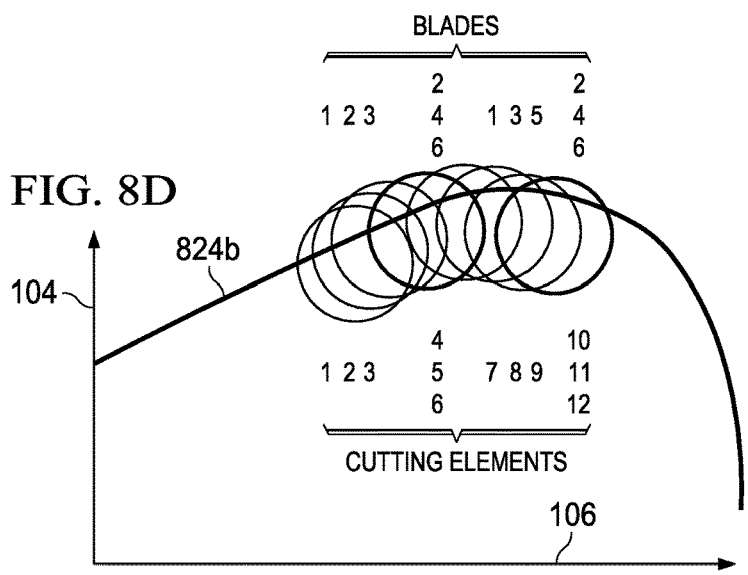
FIG. 8D illustrates a schematic drawing of a bit face profile for the downhole drilling tool of FIG. 8C, in accordance with some embodiments of the present disclosure.

FIGS. 8C and 8D illustrate one example of a six-bladed downhole drilling tool that includes both single-set and track-set cutting elements laid out in accordance with multilevel force balancing techniques. As shown in FIG. 8C, blades of the downhole drilling tool may be divided into a two blade group having the configuration (1,3,5) (2,4,6). Blades 804, 806 and 808 may be primary blades and may form the first blade group. Blades 805, 807 and 809 may be secondary blades and may form the second blade group. In the illustrated embodiment, cutting elements 1, 2 and 3 may be respectively laid out in a three cutting element group on primary blades 804, 806 and 808 and each of the cutting elements in the group may be single-set. Cutting elements 4, 5 and 6 may be respectively laid out on secondary blades 805, 807 and 809 in a three cutting element group and the cutting elements in the group may be track-set. These cutting element groups may form cutting element set [(1,3,5) (2,4,6)]. The single-set cutting elements of the first blade group may drill into a formation at a higher efficiency while the track-set cutting elements of the second blade group may provide stability as the downhole drilling tool drills into the formation.

As shown in FIG. 8D, cutting elements in the cutting element set [(1,3,5) (2,4,6)] are neighbor cutting elements because individual cutting elements 1, 2 and 3, and the three cutting element group including track-set cutting elements 4, 5 and 6 are disposed immediately adjacent to each other on bit face profile 824b. Additionally, as illustrated in table 401 of FIG. 4A and table 501 of FIG. 5, cutting element set [(1,3,5) (2,4,6)] may be levels one through four force balanced.

Figure 8E:
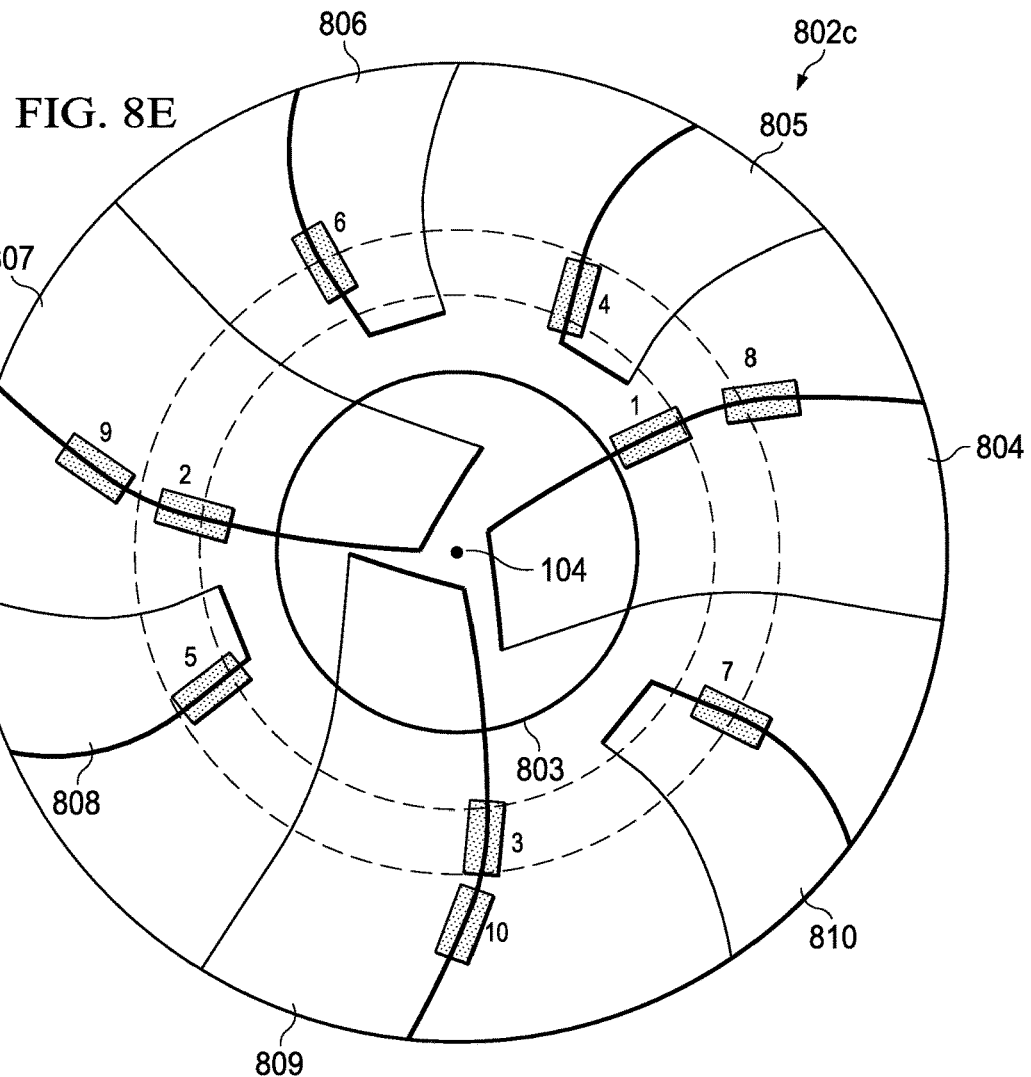
FIG. 8E illustrates a schematic drawing of a bit face for a downhole drilling tool having seven blades including exemplary locations to install cutting elements in a combination of single-set and track-set configurations for use in multilevel force balancing the downhole drilling tools, in accordance with some embodiments of the present disclosure.
Figure 8F:
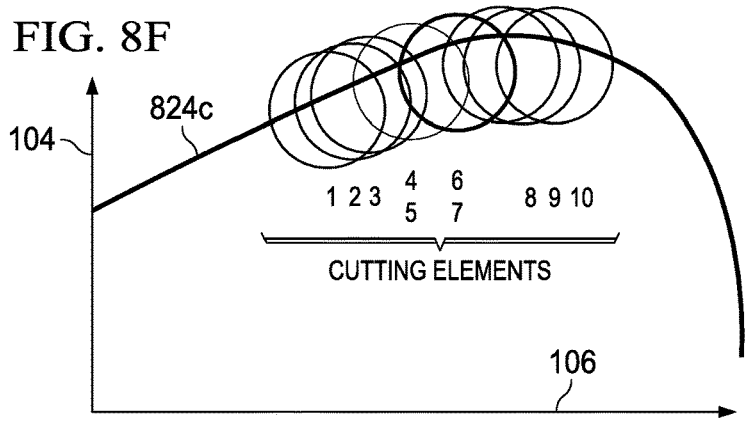
FIG. 8F illustrates a schematic drawing of a bit face profile for the downhole drilling tool of FIG. 8E, in accordance with some embodiments of the present disclosure.

FIGS. 8E and 8F illustrate one example of a seven-bladed downhole drilling tool that includes both single-set and track-set cutting elements laid out in accordance with multilevel force balancing techniques. As shown in FIG. 8E, blades of the downhole drilling tool may be divided into a three blade group having the configuration (1,4,6) (2,5) (3,7). Blades 804, 807 and 809 may be primary blades and may form the first blade group. Blades 805, 806, 808 and 810 may be secondary blades such that blades 805 and 808 form the second blade group and blades 806 and 810 form the third blade group. In the illustrated embodiment, cutting elements 1, 2 and 3 may be respectively laid out in a three cutting element group on primary blades 804, 807 and 809 and each of the cutting elements in the group may be single-set. Cutting elements 4 and 5 may be respectively laid out on secondary blades 805 and 808 in a two cutting element group and the cutting elements in the group may be track-set. Cutting elements 6 and 7 may be respectively laid out on secondary blades 806 and 810 in a two cutting element group and the cutting elements in the group may be track-set. These cutting element groups may form cutting element set [(1,4,6) (2,5) (3,7)]. The single-set cutting elements of the first blade group may drill into a formation at a higher efficiency while the track-set cutting elements of the second and third blade groups may provide stability as the downhole drilling tool drills into the formation.

As shown in FIG. 8F, cutting elements in the cutting element set [(1,4,6) (2,5) (3,7)] are neighbor cutting elements because individual cutting elements 1, 2 and 3, the two cutting element group including track-set cutting elements 4 and 5, and the two cutting element group including track-set cutting elements 6 and 7 are disposed immediately adjacent to each other on bit face profile 824c.

Figure 8G:
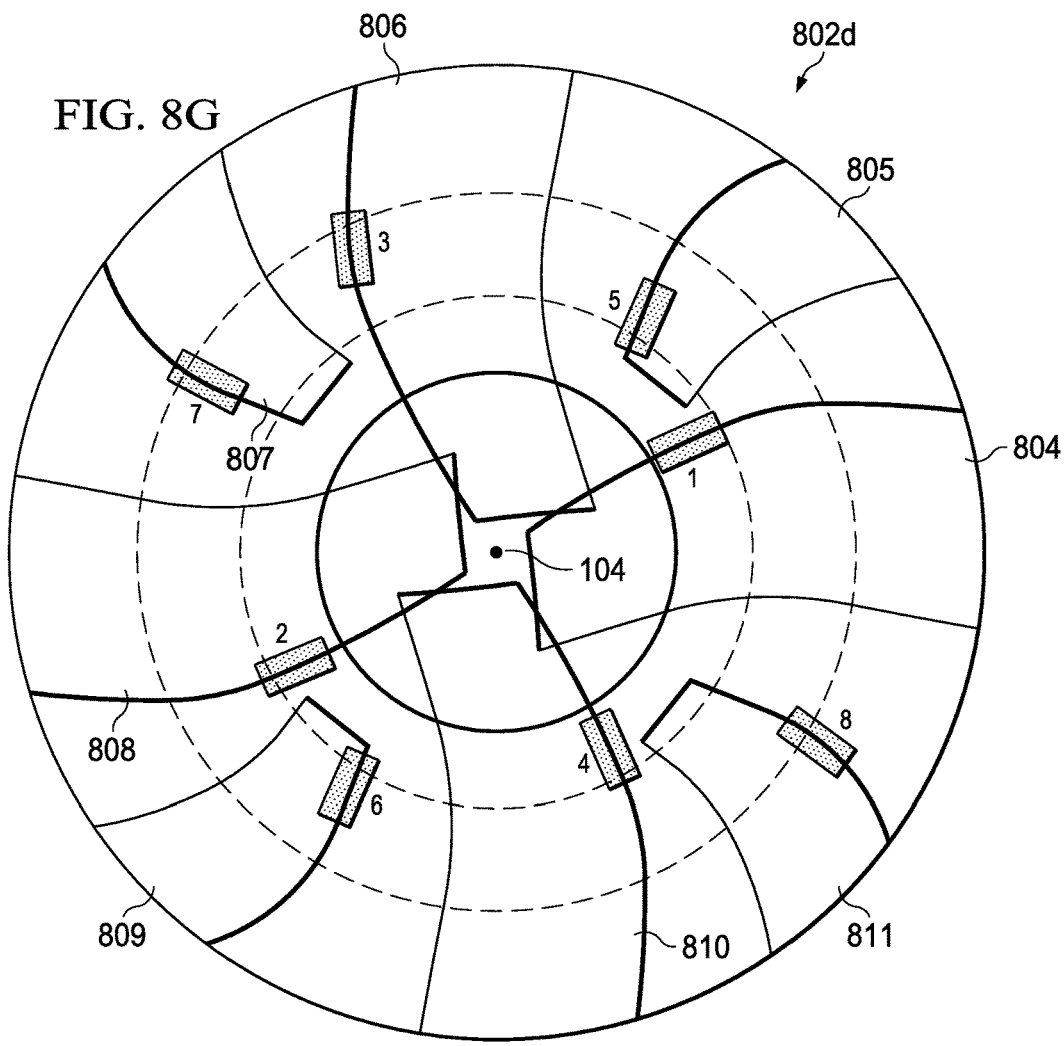
FIG. 8G illustrates a schematic drawing of a bit face for a downhole drilling tool having eight blades including exemplary locations to install cutting elements in a combination of single-set and track-set configurations for use in multilevel force balancing the downhole drilling tools, in accordance with some embodiments of the present disclosure.
Figure 8H:
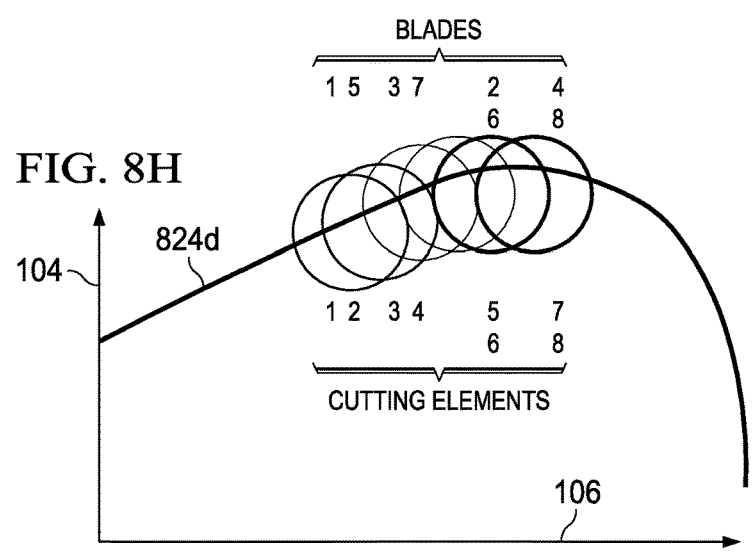
FIG. 8H illustrates a schematic drawing of a bit face profile for the downhole drilling tool of FIG. 8G, in accordance with some embodiments of the present disclosure.

FIGS. 8G and 8H illustrate one example of an eight-bladed downhole drilling tool that includes both single-set and track-set cutting elements laid out in accordance with multilevel force balancing techniques. As shown in FIG. 8G, blades of the downhole drilling tool may be divided into a pair or four blade group having the configuration (1,5) (3,7) (2,6) (4,8). Blades 804, 806, 808 and 810 may be primary blades such that blades 804 and 808 form the first blade group and blades 806 and 810 form the second blade group. Blades 805, 807, 809 and 811 may be secondary blades such that blades 805 and 809 form the third blade group and blades 807 and 811 form the fourth blade group. In the illustrated embodiment, cutting elements 1 and 2 may be respectively laid out in a two cutting element group on primary blades 804 and 808 and each of the cutting elements in the group may be single-set. Cutting elements 3 and 4 may be respectively laid out in a two cutting element group on primary blades 806 and 810 and each of the cutting elements in the group may be single-set. Cutting elements 5 and 6 may be respectively laid out on secondary blades 805 and 809 in a two cutting element group and the cutting elements in the group may be track-set. Cutting elements 7 and 8 may be respectively laid out on secondary blades 807 and 811 in a two cutting element group and the cutting elements in the group may be track-set. These cutting element groups may form cutting element set [(1,5) (3,7) (2,6) (4,8)]. The single-set cutting elements of the first and second blade groups may drill into a formation at a higher efficiency while the track-set cutting elements of the third and fourth blade groups may provide stability as the downhole drilling tool drills into the formation.

As shown in FIG. 8H, cutting elements in the cutting element set [(1,5) (3,7) (2,6) (4,8)] are neighbor cutting elements because individual cutting elements 1, 2, 3 and 4, the two cutting element group including track-set cutting elements 5 and 6, and the two cutting element group including track-set cutting elements 7 and 8 are disposed immediately adjacent to each other on bit face profile 824d.

Additionally, as illustrated in table 401 of FIG. 4A and table 501 of FIG. 5, cutting element set [(1,5) (3,7) (2,6) (4,8)] may be levels one through four force balanced.

Figure 8I:
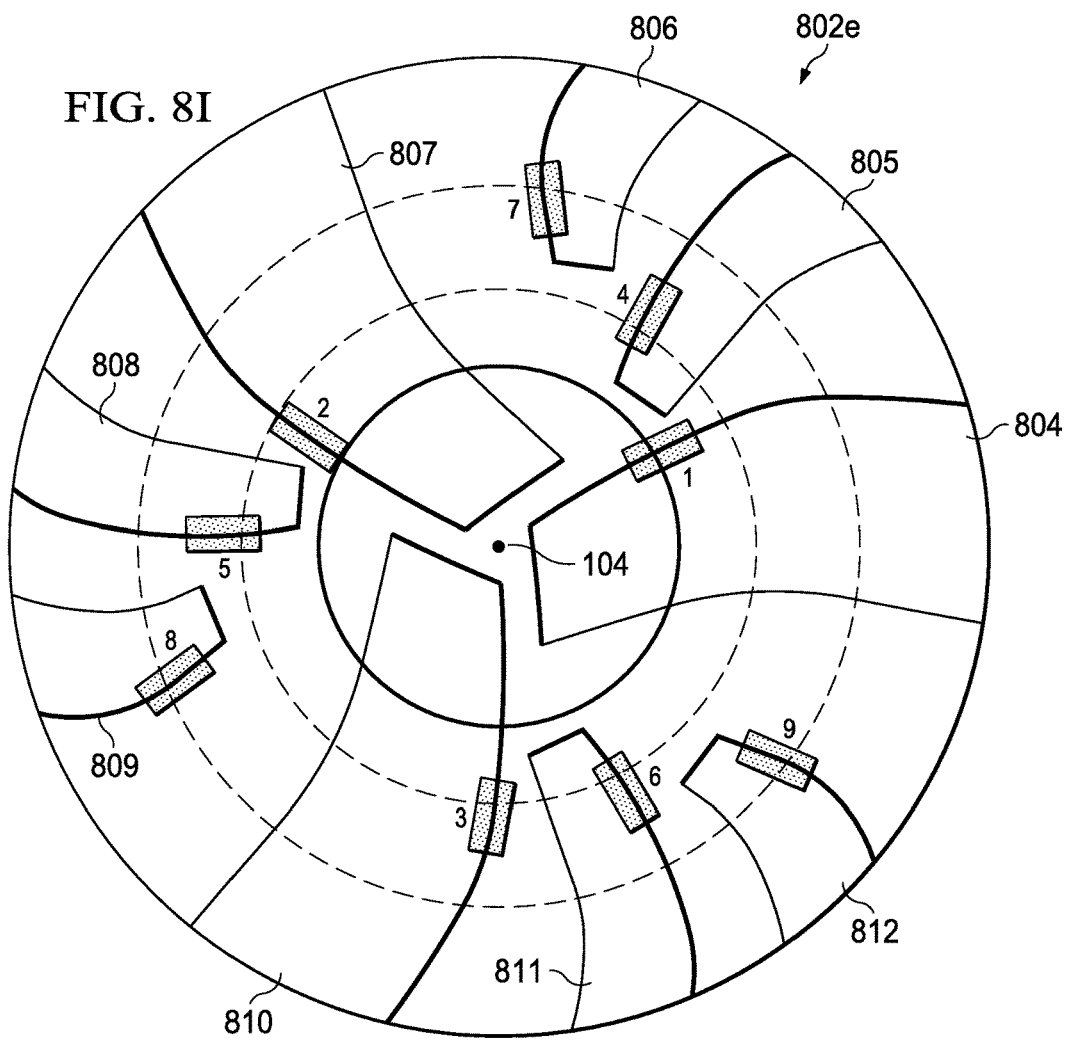
FIG. 8I illustrates a schematic drawing of a bit face for a downhole drilling tool having nine blades including exemplary locations to install cutting elements in a combination of single-set and track-set configurations for use in multilevel force balancing the downhole drilling tools, in accordance with some embodiments of the present disclosure.
Figure 8J:
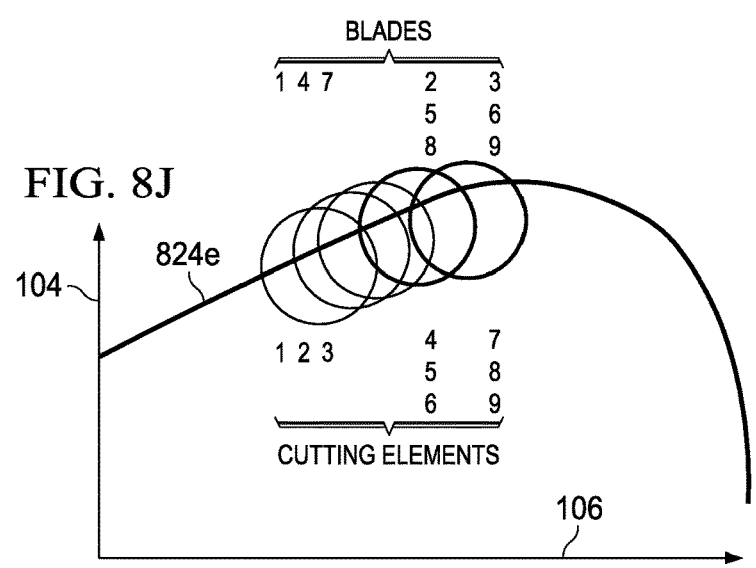
FIG. 8J illustrates a schematic drawing of a bit face profile for the downhole drilling tool of FIG. 8I, in accordance with some embodiments of the present disclosure.

FIGS. 8I and 8J illustrate one example of a nine-bladed downhole drilling tool that includes both single-set and track-set cutting elements laid out in accordance with multilevel force balancing techniques. As shown in FIG. 8I, blades of the downhole drilling tool may be divided into a three blade group having the configuration (1,4,7) (2,5,8) (3,6,9). Blades 804, 807 and 810 may be primary blades and may form the first blade group. Blades 805, 806, 808, 809, 811 and 812 may be secondary blades such that blades 805, 808 and 811 form the second blade group and blades 806, 809 and 812 form the third blade group. In the illustrated embodiment, cutting elements 1, 2 and 3 may be respectively laid out in a three cutting element group on primary blades 804, 807 and 810 and each of the cutting elements in the group may be single-set. Cutting elements 4, 5 and 6 may be respectively laid out in a three cutting element group on secondary blades 805, 808 and 811 and the cutting elements in the group may be track-set. Cutting elements 7, 8 and 9 may be respectively laid out on secondary blades 806, 809 and 812 in a three cutting element group and the cutting elements in the group may be track-set. These cutting element groups may form cutting element set [(1,4,7) (2,5,8) (3,6,9)]. The single-set cutting elements of the first blade group may drill into a formation at a higher efficiency while the track-set cutting elements of the second and third blade groups may provide stability as the downhole drilling tool drills into the formation.

As shown in FIG. 8J, cutting elements in the cutting element set [(1,4,7) (2,5,8) (3,6,9)] are neighbor cutting elements because individual cutting elements 1, 2 and 3, the three cutting element group including track-set cutting elements 4, 5 and 6, and the three cutting element group including track-set cutting elements 7, 8 and 9 are disposed immediately adjacent to each other on bit face profile 824e. Additionally, as illustrated in table 401 of FIG. 4A and table 501 of FIG. 5, cutting element set [(1,4,7) (2,5,8) (3,6,9)] may be levels one through four force balanced.

Modifications, additions or omissions may be made to FIGS. 8A-8J without departing from the scope of the present disclosure. For example, the cutting elements may be laid out in different configurations as described in FIGS. 4 and 5 and/or the first cutting element in any given cutting element set may be disposed on a secondary blade. Additionally, the cutting element sets may be repeated on the blades such that the cutting elements are laid out in all zones of the downhole drilling tool (e.g., cone zone, nose zone, shoulder zone and gage zone as illustrated in FIG. 2B).

FIGS. 9A, 9C, 9E, 9G and 9I illustrate schematic drawings showing various components of respective bit faces or cutting faces 902a, 902b, 902c, 902d and 902e of drill bit 101 or other downhole drilling tool, in accordance with some embodiments of the present disclosure. Bit faces 902a, 902b, 902c, 902d and 902e may each include nose point 903 that defines an inner segment located proximate to bit rotational axis 104 and an outer segment that extends from nose point 903 to the gage pad of the downhole drilling tool. Cutting elements located in the inner segment may be laid out in either a single-set or a trac-loc configuration.

FIGS. 9B, 9D, 9F, 9H and 9J illustrate schematic drawings showing portions of a composite bit face profile or composite cutting face profile corresponding with the components shown in respective FIGS. 9A, 9C, 9E, 9G and 9I, in accordance with some embodiments of the present disclosure. To provide a frame of reference, each of FIGS. 9B, 9D, 9F, 9H and 9J include a z-axis that represents bit rotational axis 104 of drill bit 101 and radial axis 106 that indicates the orthogonal distance from rotational axis 104. Blades and associated cutting elements discussed with respect to FIGS. 9A-9J may be disposed on exterior portions of drill bit 101 as illustrated in FIGS. 1 and 2A-2B. FIGS. 9A-9J show various examples of laying out cutting elements in a track-set configuration on a downhole drilling tool using multilevel force balancing techniques, in accordance with some embodiments of the present disclosure.

Figure 9A:
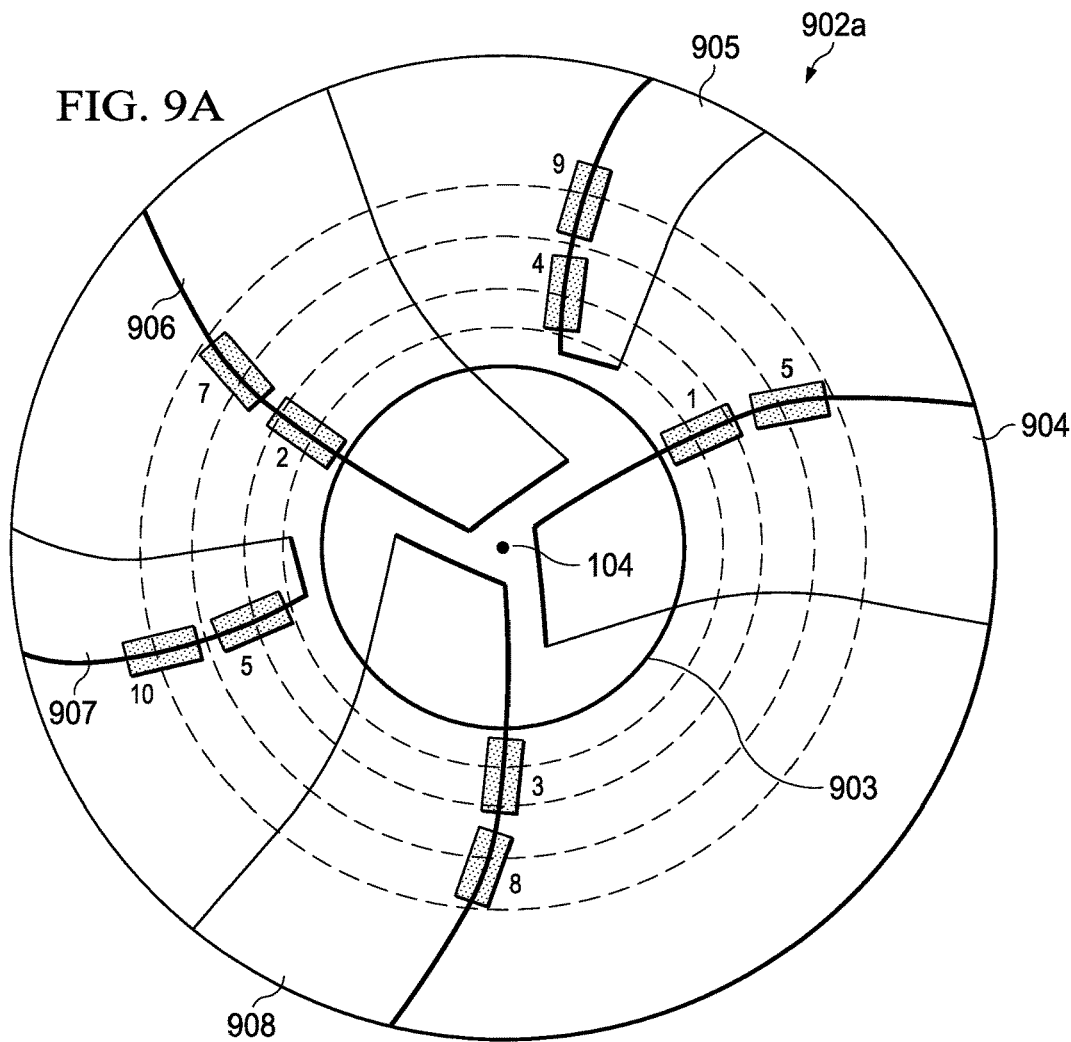
FIG. 9A illustrates a schematic drawing of a bit face for a downhole drilling tool having five blades including exemplary locations to install cutting elements in a track-set configuration for use in multilevel force balancing the downhole drilling tool, in accordance with some embodiments of the present disclosure.
Figure 9B:
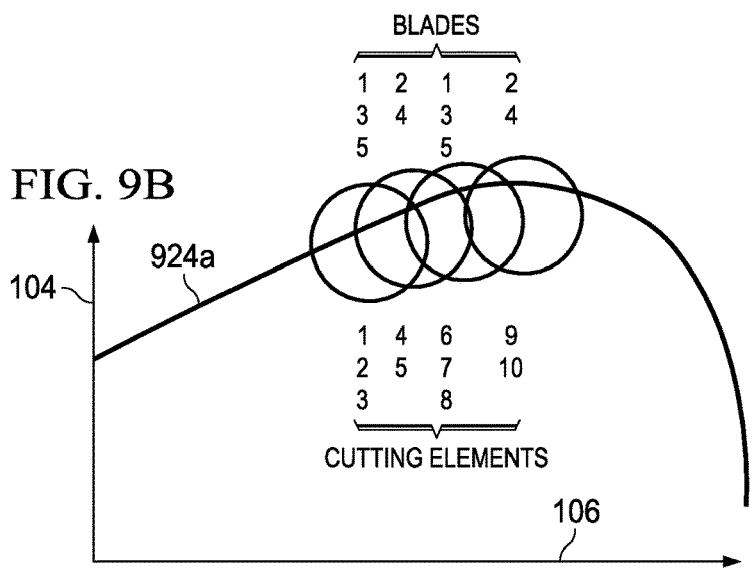
FIG. 9B illustrates a schematic drawing of a bit face profile for the downhole drilling tool of FIG. 9A, in accordance with some embodiments of the present disclosure.

FIGS. 9A and 9B illustrate one example of a five-bladed downhole drilling tool that includes track-set cutting elements laid out in accordance with multilevel force balancing techniques. As shown in FIG. 9A, blades of the downhole drilling tool may be divided into a two blade group having the configuration (1,3,5) (2,4). Blades 904, 906 and 908 may be primary blades and may form the first blade group. Blades 905 and 907 may be secondary blades and may form the second blade group. In the illustrated embodiment, cutting elements 1, 2 and 3 may be respectively laid out in a three cutting element group on primary blades 904, 906 and 908 and each of the cutting elements in the group may be track-set. Cutting elements 4 and 5 may be respectively laid out on secondary blades 905 and 907 in a two cutting element group and the cutting elements in the group may be track-set. These cutting element groups may form cutting element set [(1,3,5) (2,4)]. The track-set cutting elements of the two blade groups may uniformly distribute the loadings of each cutting element and provide stability as a downhole drilling tool drills into a formation.

As shown in FIG. 9B, cutting elements in the cutting element set [(1,3,5) (2,4)] are neighbor cutting elements because the three cutting element group including track-set cutting elements 1, 2 and 3, and the two cutting element group including track-set cutting elements 4 and 5 are disposed immediately adjacent to each other on bit face profile 924a. Additionally, as illustrated in table 401 of FIG. 4A and table 501 of FIG. 5, cutting element set [(1,3,5) (2,4)] may be levels one through four force balanced.

Figure 9C:
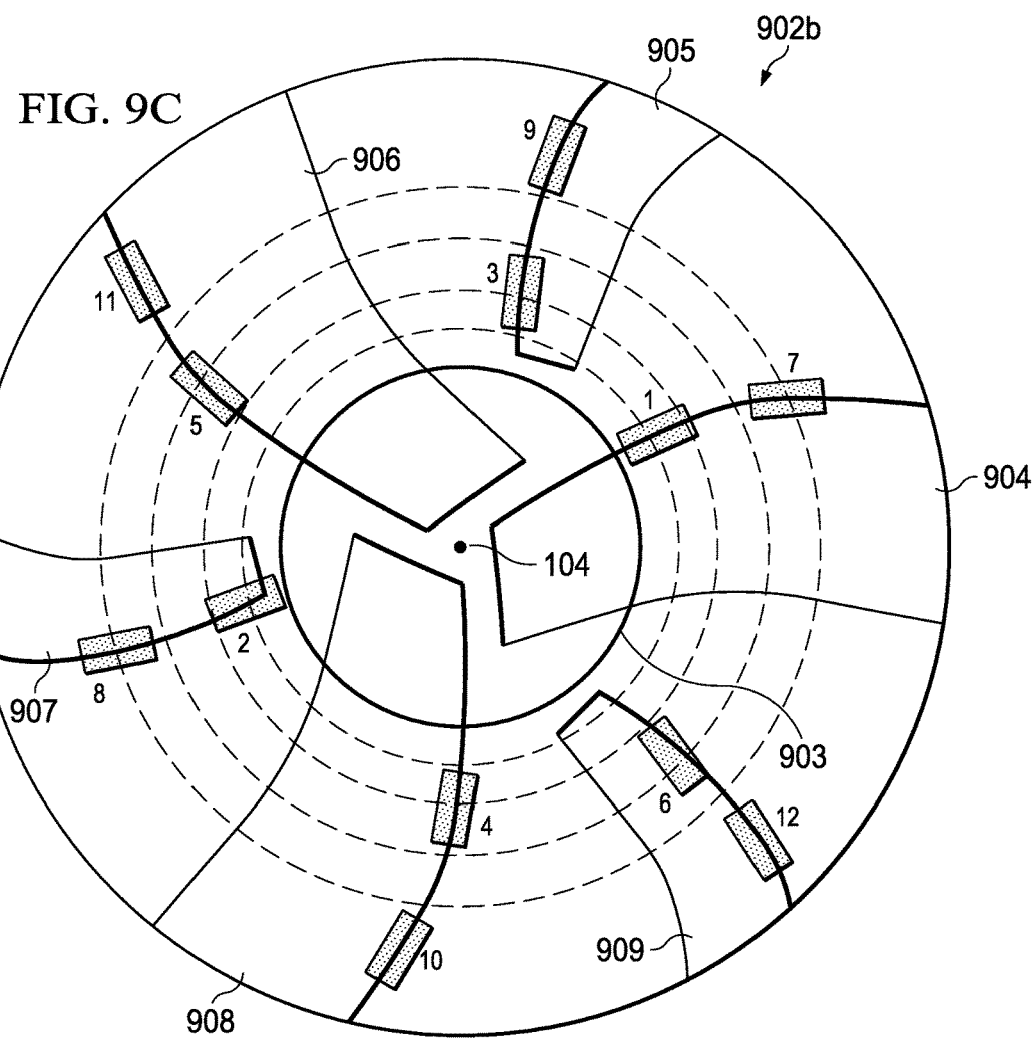
FIG. 9C illustrates a schematic drawing of a bit face for a downhole drilling tool having six blades including exemplary locations to install cutting elements in a track-set configuration for use in multilevel force balancing the downhole drilling tool, in accordance with some embodiments of the present disclosure.
Figure 9D:
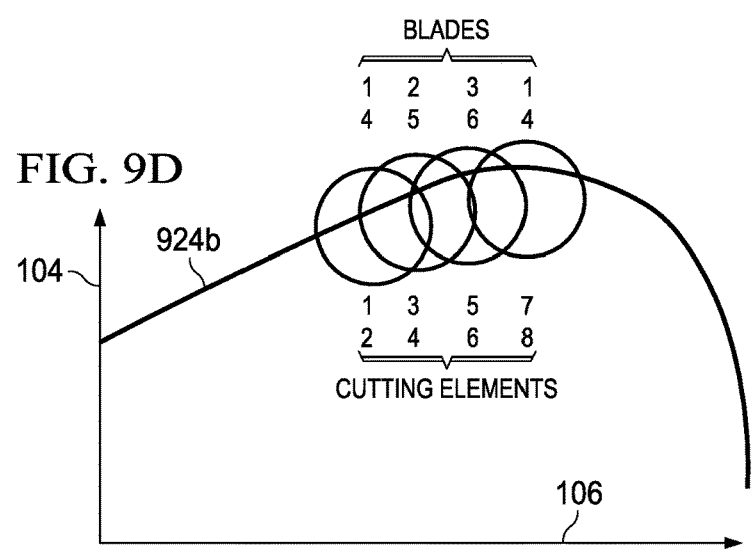
FIG. 9D illustrates a schematic drawing of a bit face profile for the downhole drilling tool of FIG. 9C, in accordance with some embodiments of the present disclosure.

FIGS. 9C and 9D illustrate one example of a six-bladed downhole drilling tool that includes track-set cutting elements laid out in accordance with multilevel force balancing techniques. As shown in FIG. 9C, blades of the downhole drilling tool may be divided into a pair blade group having the configuration (1,4) (2,5) (3,6). Blades 904, 906 and 908 may be primary blades and blades 905, 907 and 909 may be secondary blades. In the illustrated embodiment, cutting elements 1 and 2 may be respectively laid out on primary blade 904 and secondary blade 907 in a two cutting element group and the cutting elements in the group may be track-set. Cutting elements 3 and 4 may be respectively laid out on secondary blade 905 and primary blade 908 in a two cutting element group and the cutting elements in the group may be track-set. Cutting elements 7 and 8 may be respectively laid out on primary blade 906 and secondary blade 909 in a two cutting element group and the cutting elements in the group may be track-set. These cutting element groups may form cutting element set [(1,4) (2,5) (3,6)]. The track-set cutting elements of the pair blade groups may uniformly distribute the loadings of each cutting element and provide stability as a downhole drilling tool drills into a formation.

As shown in FIG. 9D, cutting elements in the cutting element set [(1,4) (2,5) (3,6)] are neighbor cutting elements because the two cutting element group including track-set cutting elements 1 and 2, the two cutting element group including track-set cutting elements 3 and 4, and the two cutting element group including track-set cutting elements 5 and 6 are disposed immediately adjacent to each other on bit face profile 924b. Additionally, as illustrated in table 401 of FIG. 4A and table 501 of FIG. 5, cutting element set [(1,4) (2,5) (3,6)] may be levels one through four force balanced.

Figure 9E:
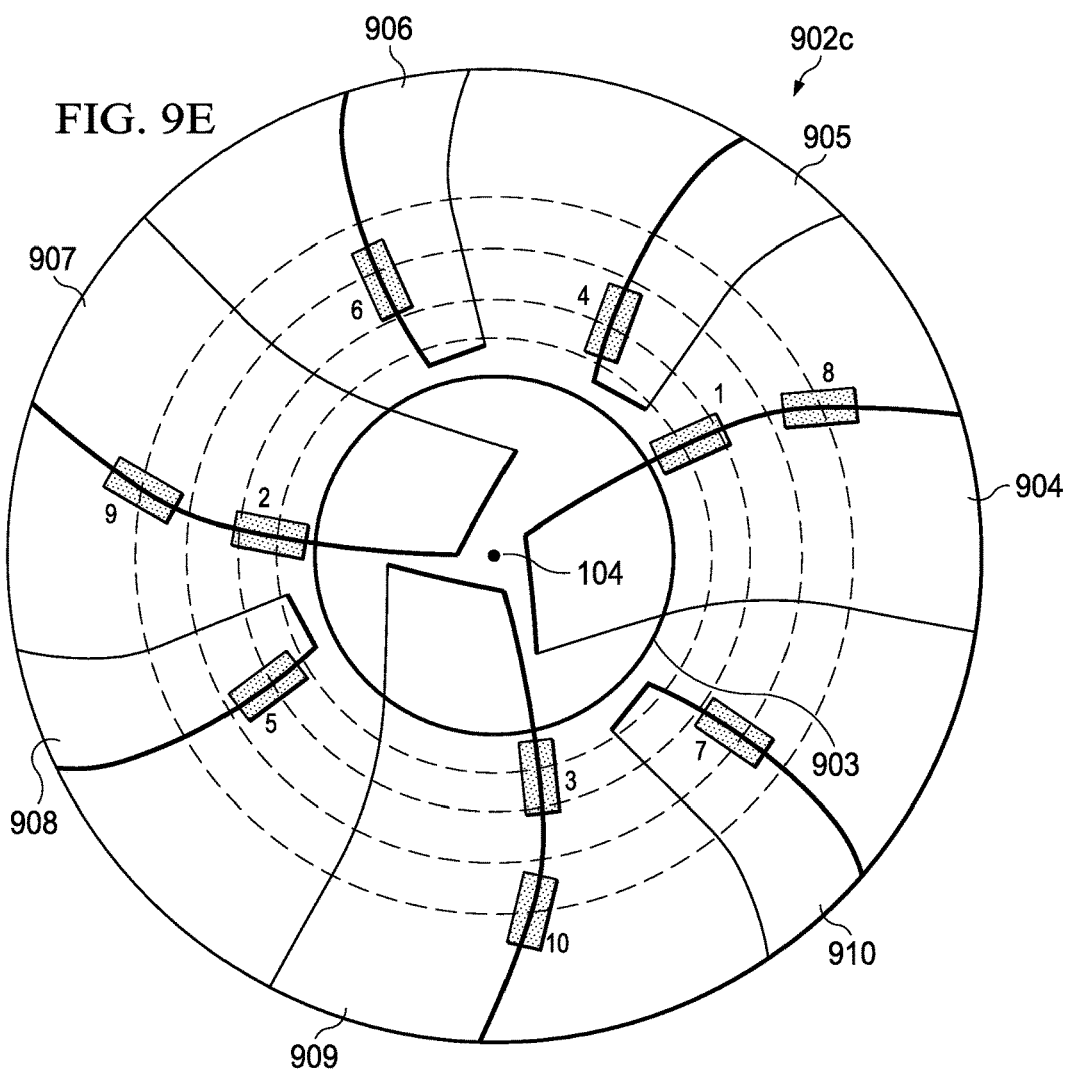
FIG. 9E illustrates a schematic drawing of a bit face for a downhole drilling tool having seven blades including exemplary locations to install cutting elements in a track-set configuration for use in multilevel force balancing the downhole drilling tool, in accordance with some embodiments of the present disclosure.
Figure 9F:
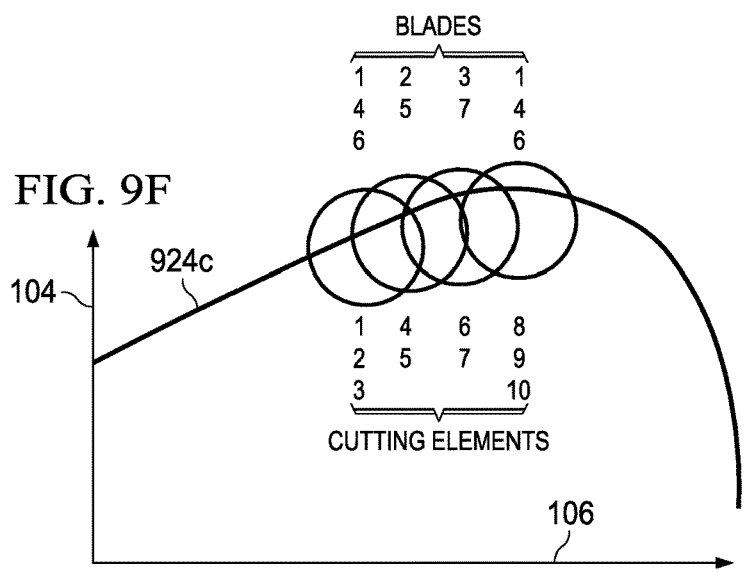
FIG. 9F illustrates a schematic drawing of a bit face profile for the downhole drilling tool of FIG. 9E, in accordance with some embodiments of the present disclosure.

FIGS. 9E and 9F illustrate one example of a seven-bladed downhole drilling tool that includes track-set cutting elements laid out in accordance with multilevel force balancing techniques. As shown in FIG. 9E, blades of the downhole drilling tool may be divided into a three blade group having the configuration (1,4,6) (2,5) (3,7). Blades 904, 907 and 909 may be primary blades and may form the first blade group. Blades 905, 906, 908 and 910 may be secondary blades such that blades 905 and 908 form the second blade group and blades 906 and 910 form the third blade group. In the illustrated embodiment, cutting elements 1, 2 and 3 may be respectively laid out in a three cutting element group on primary blades 904, 907 and 909 and the cutting elements in the group may be track-set. Cutting elements 4 and 5 may be respectively laid out on secondary blades 905 and 908 in a two cutting element group and the cutting elements in the group may be track-set. Cutting elements 6 and 7 may be respectively laid out on secondary blades 906 and 910 in a two cutting element group and the cutting elements in the group may be track-set. These cutting element groups may form cutting element set [(1,4,6) (2,5) (3,7)]. The track-set cutting elements of the three blade groups may uniformly distribute the loadings of each cutting element and provide stability as a downhole drilling tool drills into a formation.

As shown in FIG. 9F, cutting elements in the cutting element set [(1,4,6) (2,5) (3,7)] are neighbor cutting elements because the three cutting element group including track-set cutting elements 1, 2 and 3, the two cutting element group including track-set cutting elements 4 and 5, and the two cutting element group including track-set cutting elements 6 and 7 are disposed immediately adjacent to each other on bit face profile 924c.

Figure 9G:
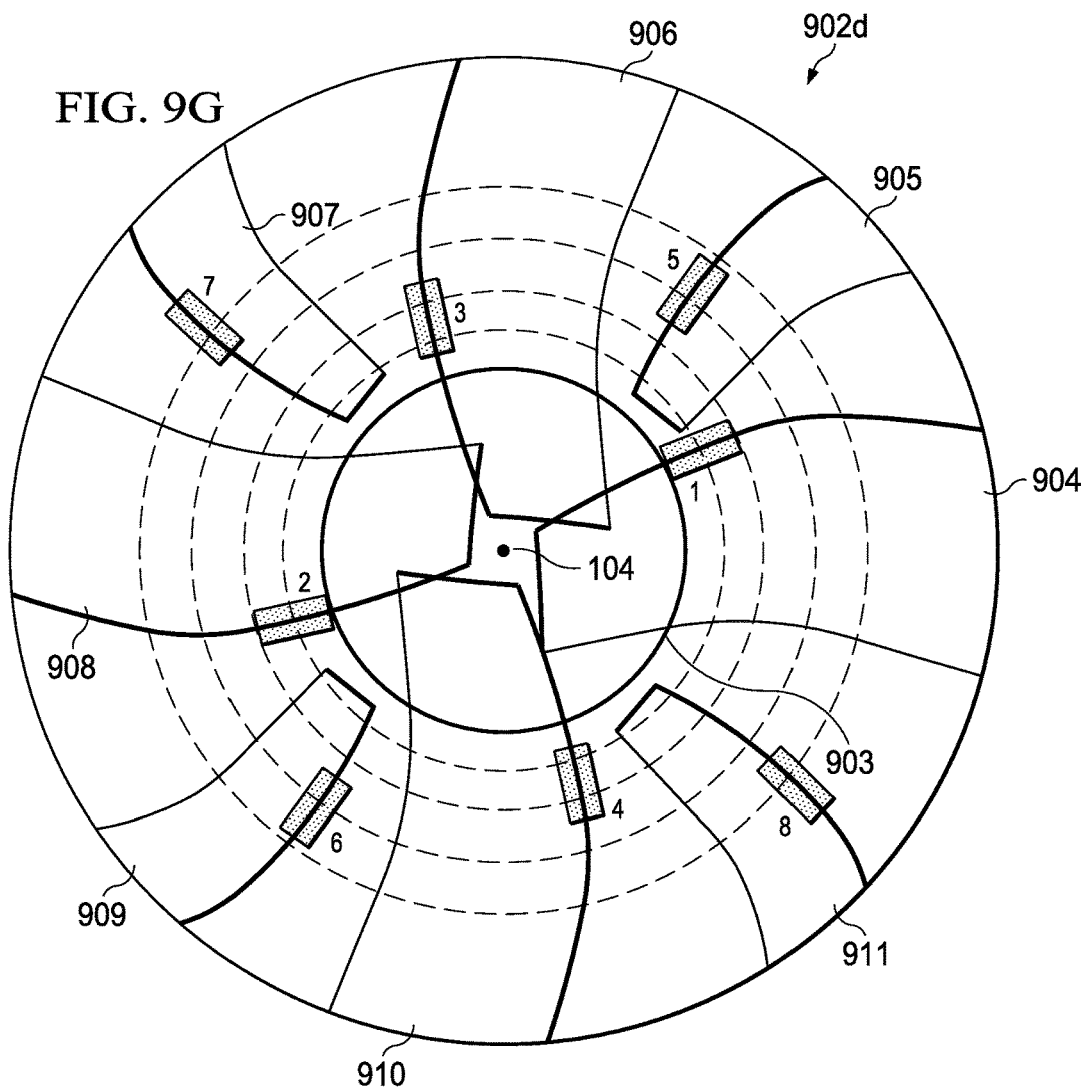
FIG. 9G illustrates a schematic drawing of a bit face for a downhole drilling tool having eight blades including exemplary locations to install cutting elements in a track-set configuration for use in multilevel force balancing the downhole drilling tool, in accordance with some embodiments of the present disclosure.
Figure 9H:
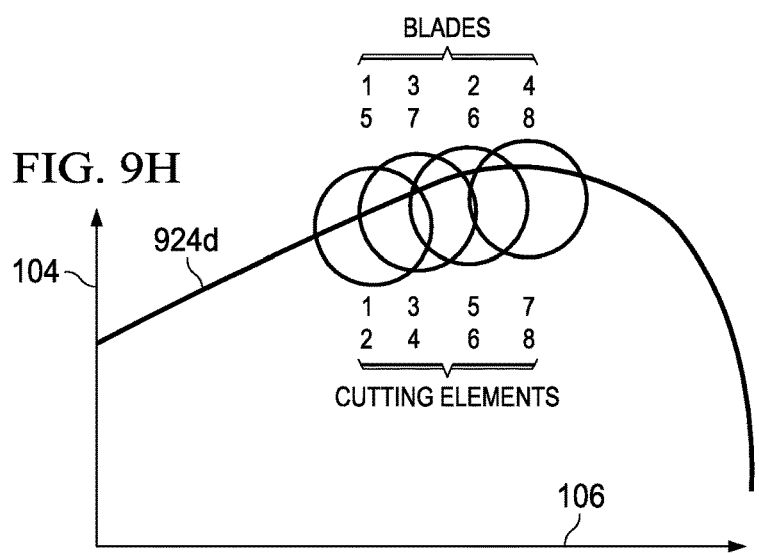
FIG. 9H illustrates a schematic drawing of a bit face profile for the downhole drilling tool of FIG. 9G, in accordance with some embodiments of the present disclosure.

FIGS. 9G and 9H illustrate one example of an eight-bladed downhole drilling tool that includes track-set cutting elements laid out in accordance with multilevel force balancing techniques. As shown in FIG. 9G, blades of the downhole drilling tool may be divided into a pair blade group having the configuration (1,5) (3,7) (2,6) (4,8). Blades 904, 906, 908 and 910 may be primary blades such that blades 904 and 908 form the first blade group and blades 906 and 910 form the second blade group. Blades 905, 907, 909 and 911 may be secondary blades such that blades 905 and 909 form the third blade group and blades 907 and 911 form the fourth blade group. In the illustrated embodiment, cutting elements 1 and 2 may be respectively laid out in a two cutting element group on primary blades 904 and 908 and the cutting elements in the group may be track-set. Cutting elements 3 and 4 may be respectively laid out in a two cutting element group on primary blades 906 and 910 and the cutting elements in the group may be track-set. Cutting elements 5 and 6 may be respectively laid out on secondary blades 905 and 909 in a two cutting element group and the cutting elements in the group may be track-set. Cutting elements 7 and 8 may be respectively laid out on secondary blades 907 and 911 in a two cutting element group and the cutting elements in the group may be track-set. These cutting element groups may form cutting element set [(1,5) (3,7) (2,6) (4,8)]. The track-set cutting elements of the pair or four blade group may uniformly distribute the loadings of each cutting element and provide stability as a downhole drilling tool drills into a formation.

As shown in FIG. 9H, cutting elements in the cutting element set [(1,5) (3,7) (2,6) (4,8)] are neighbor cutting elements because the two cutting element group including track-set cutting elements 1 and 2, the two cutting element group including track-set cutting elements 3 and 4, the two cutting element group including track-set cutting elements 5 and 6, and the two cutting element group including track-set cutting elements 7 and 8 are disposed immediately adjacent to each other on bit face profile 924*d*. Additionally, as illustrated in table 401 of FIG. 4A and table 501 of FIG. 5, cutting element set [(1,5) (3,7) (2,6) (4,8)] may be levels one through four force balanced.

Figure 9I:
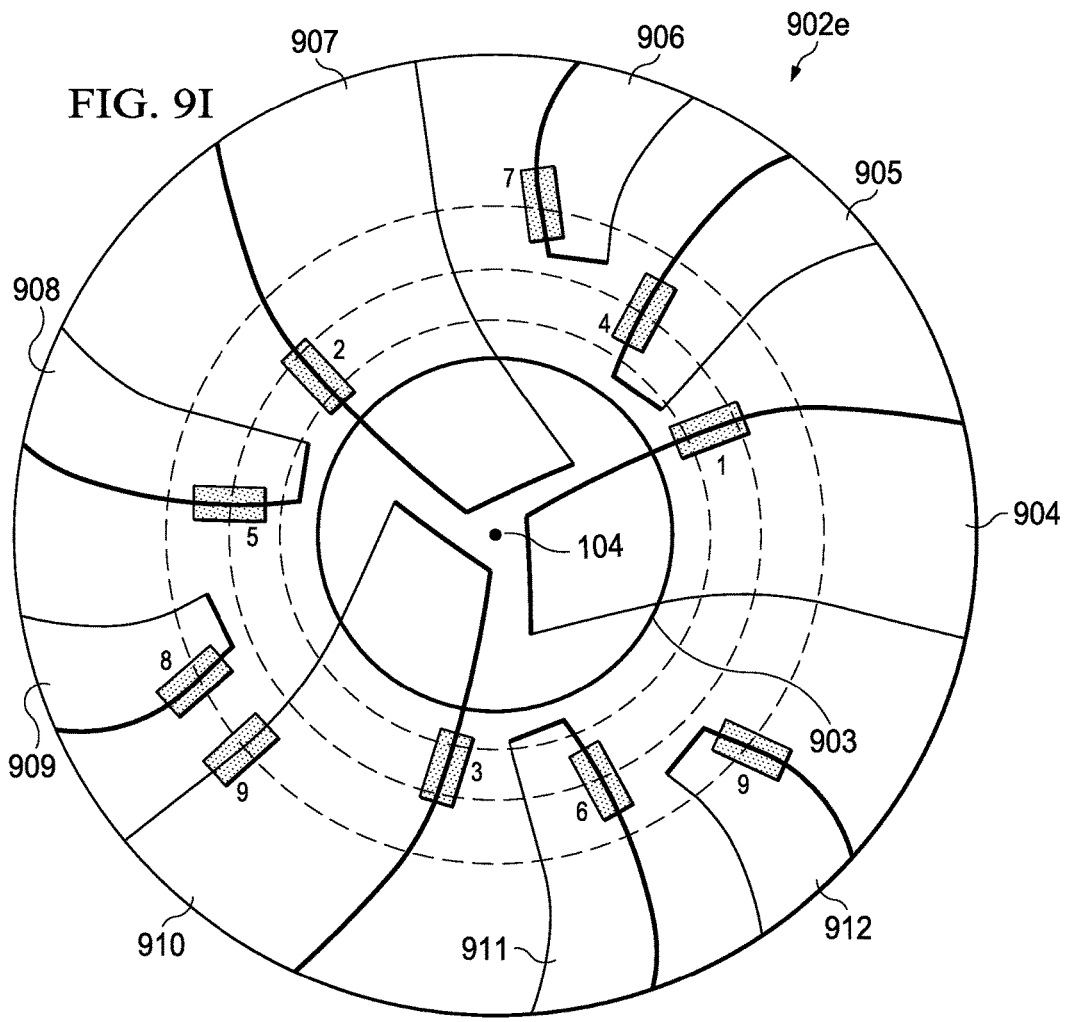
FIG. 9I illustrates a schematic drawing of a bit face for a downhole drilling tool having nine blades including exemplary locations to install cutting elements in a track-set configuration for use in multilevel force balancing the downhole drilling tool, in accordance with some embodiments of the present disclosure.
Figure 9J:
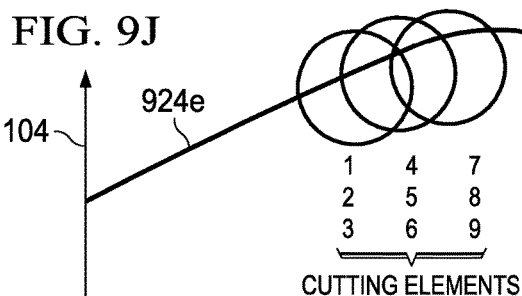
FIG. 9J illustrates a schematic drawing of a bit face profile for the downhole drilling tool of FIG. 9I, in accordance with some embodiments of the present disclosure.

FIGS. 9I and 9J illustrate one example of a nine-bladed downhole drilling tool that includes track-set cutting elements laid out in accordance with multilevel force balancing techniques. As shown in FIG. 9I, blades of the downhole drilling tool may be divided into a three blade group having the configuration (1,4,7) (2,5,8) (3,6,9). Blades 904, 907 and 910 may be primary blades and may form the first blade group. Blades 905, 906, 908, 909, 911 and 912 may be secondary blades such that blades 905, 908 and 911 form the second blade group and blades 906, 909 and 912 form the third blade group. In the illustrated embodiment, cutting elements 1, 2 and 3 may be respectively laid out in a three cutting element group on primary blades 904, 907 and 910 and the cutting elements in the group may be track-set. Cutting elements 4, 5 and 6 may be respectively laid out in a three cutting element group on secondary blades 905, 908 and 911 and the cutting elements in the group may be track-set. Cutting elements 7, 8 and 9 may be respectively laid out on secondary blades 906, 909 and 912 in a three cutting element group and the cutting elements in the group may be track-set. These cutting element groups may form cutting element set [(1,4,7) (2,5,8) (3,6,9)]. The track-set cutting elements of the three blade groups may uniformly distribute the loadings of each cutting element and provide stability as a downhole drilling tool drills into a formation.

As shown in FIG. 9J, cutting elements in the cutting element set [(1,4,7) (2,5,8) (3,6,9)] are neighbor cutting elements because the three cutting element group including track-set cutting elements 1, 2 and 3, the three cutting element group including track-set cutting elements 4, 5 and 6 and the three cutting element group including track-set cutting elements 7, 8 and 9 are disposed immediately adjacent to each other on bit face profile 924*e*. Additionally, as illustrated in table 401 of FIG. 4A and table 501 of FIG. 5, cutting element set [(1,4,7) (2,5,8) (3,6,9)] may be levels one through four force balanced.

Modifications, additions or omissions may be made to FIGS. 9A-9J without departing from the scope of the present disclosure. For example, the cutting elements may be laid out in different configurations as described in FIGS. 4 and 5 and/or the first cutting element in any given cutting element set may be disposed on a secondary blade. Additionally, the cutting element sets may be repeated on the blades such that the cutting elements are laid out in all zones of the downhole drilling tool (e.g., cone zone, nose zone, shoulder zone and gage zone as illustrated in FIG. 2B).

FIGS. 10A, 10C, 10E, 10G and 10I illustrate schematic drawings showing various components of respective bit faces or cutting faces 1002*a*, 1002*b*, 1002*c*, 1002*d* and 1002*e* disposed on drill bit 101 or other downhole drilling tool, in accordance with some embodiments of the present disclosure. FIGS. 10B, 10D, 10F, 10H and 10J illustrate schematic drawings showing portions of a composite bit face profile or composite cutting face profile corresponding with the components shown in respective FIGS. 10A, 10C, 10E, 10G and 10I, in accordance with some embodiments of the present disclosure. To provide a frame of reference, each of FIGS. 10B, 10D, 10F, 10H and 10J include a z-axis that represents rotational axis 104 of drill bit 101 and radial axis 106 that indicates the orthogonal distance from rotational axis 104. Blades and associated cutting elements discussed with respect to FIGS. 10A-10J may be disposed on exterior portions of drill bit 101 as illustrated in FIGS. 1 and 2A-2B. FIGS. 10A-10J show various examples of laying out cutting elements in multiple layers to form a step profile on the bit face profile of a downhole drilling tool designed using multilevel force balancing techniques, in accordance with some embodiments of the present disclosure.

Figure 10A:
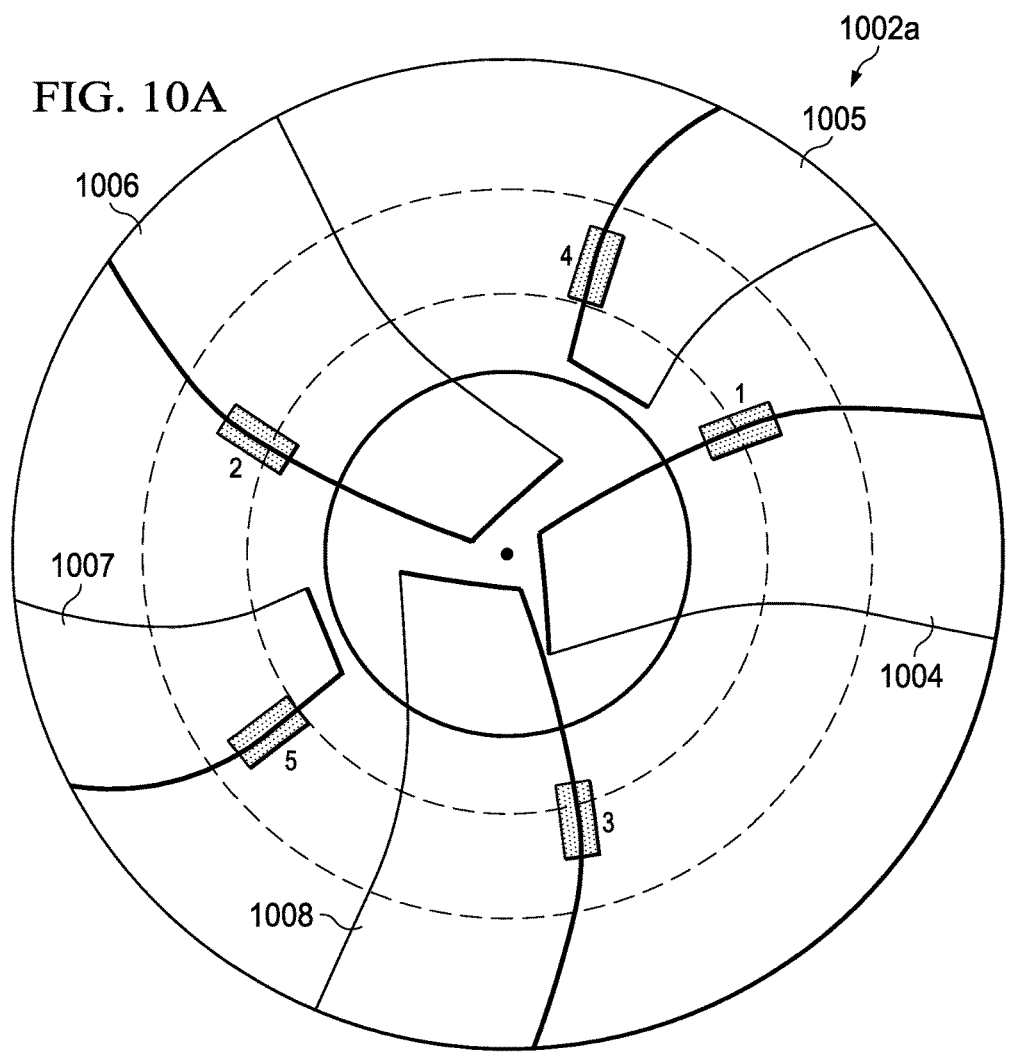
FIG. 10A illustrates a schematic drawing of a bit face for a downhole drilling tool having five blades including exemplary locations to install multiple layers of cutting elements for use in multilevel force balancing the downhole drilling tool, in accordance with some embodiments of the present disclosure.
Figure 10B:
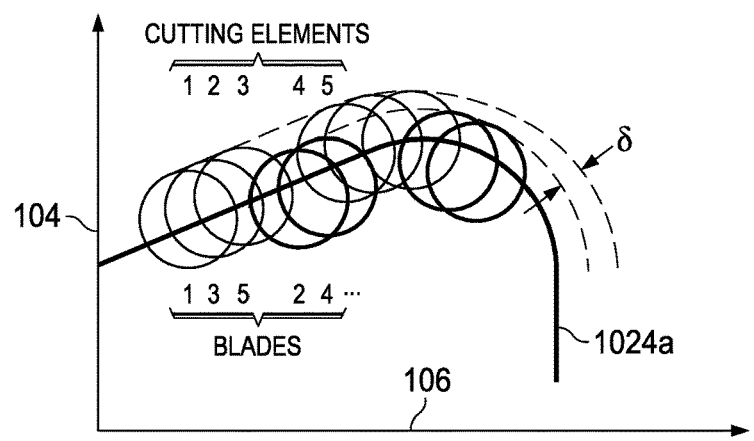
FIG. 10B illustrates a schematic drawing of a bit face profile for the downhole drilling tool of FIG. 10A including an under-exposed base profile, in accordance with some embodiments of the present disclosure.

FIGS. 10A and 10B illustrate one example of a five-bladed downhole drilling tool including multiple layers of cutting elements laid out in accordance with multilevel force balancing techniques. As shown in FIG. 10A, blades of the downhole drilling tool may be divided into a two blade group having the configuration (1,3,5) (2,4). Blades 1004, 1006 and 1008 may be primary blades and may form the first blade group. Blades 1005 and 1007 may be secondary blades and may form the second blade group. In the illustrated embodiment, cutting elements 1, 2 and 3 may be respectively laid out in a three cutting element group on primary blades 1004, 1006 and 1008 and cutting elements 4 and 5 may be respectively laid out on secondary blades 1005 and 1007 in a two cutting element group. These cutting element groups may form cutting element set [(1,3,5) (2,4)]. Cutting elements 4 and 5 in the second blade group may be under-exposed with respect to cutting elements 1, 2 and 3 in the first blade group. In the illustrated embodiment, the cutting elements in both blade groups may be single-set. In other embodiments, the cutting elements in the first blade group may be single-set and the cutting elements in the second blade group may be track-set as illustrated in FIG. 8A. In further embodiments, the cutting elements in both blade groups may be track-set as illustrated in FIG. 9A.

As shown in FIG. 10B, cutting elements in the cutting element set [(1,3,5) (2,4)] are neighbor cutting elements because cutting elements 1 through 5 are disposed immediately adjacent to each other on bit face profile 1024*a*. Additionally, cutting elements 4 and 5 in the second blade group may have an under-exposure ($\delta$) with respect to cutting elements 1, 2 and 3 in the first blade group such that the bit profile associated with the two groups is stepped. In the illustrated embodiment, the amount of under-exposure may be approximately the same for each of the cutting elements in the second blade group. In other embodiments, the amount of under-exposure may vary for each of the cutting elements in the second blade group. As a result of the under-exposure between the cutting elements in the first and second blade groups, the drilling tool may form groves at the end of a wellbore (e.g., wellbore 114 as illustrated in FIG. 1), which improve the stability of the drilling tool during drilling of the wellbore. Further, as illustrated in table 401 of FIG. 4A and table 501 of FIG. 5, cutting element set [(1,3,5) (2,4)] may be levels one through four force balanced.

Figure 10C:
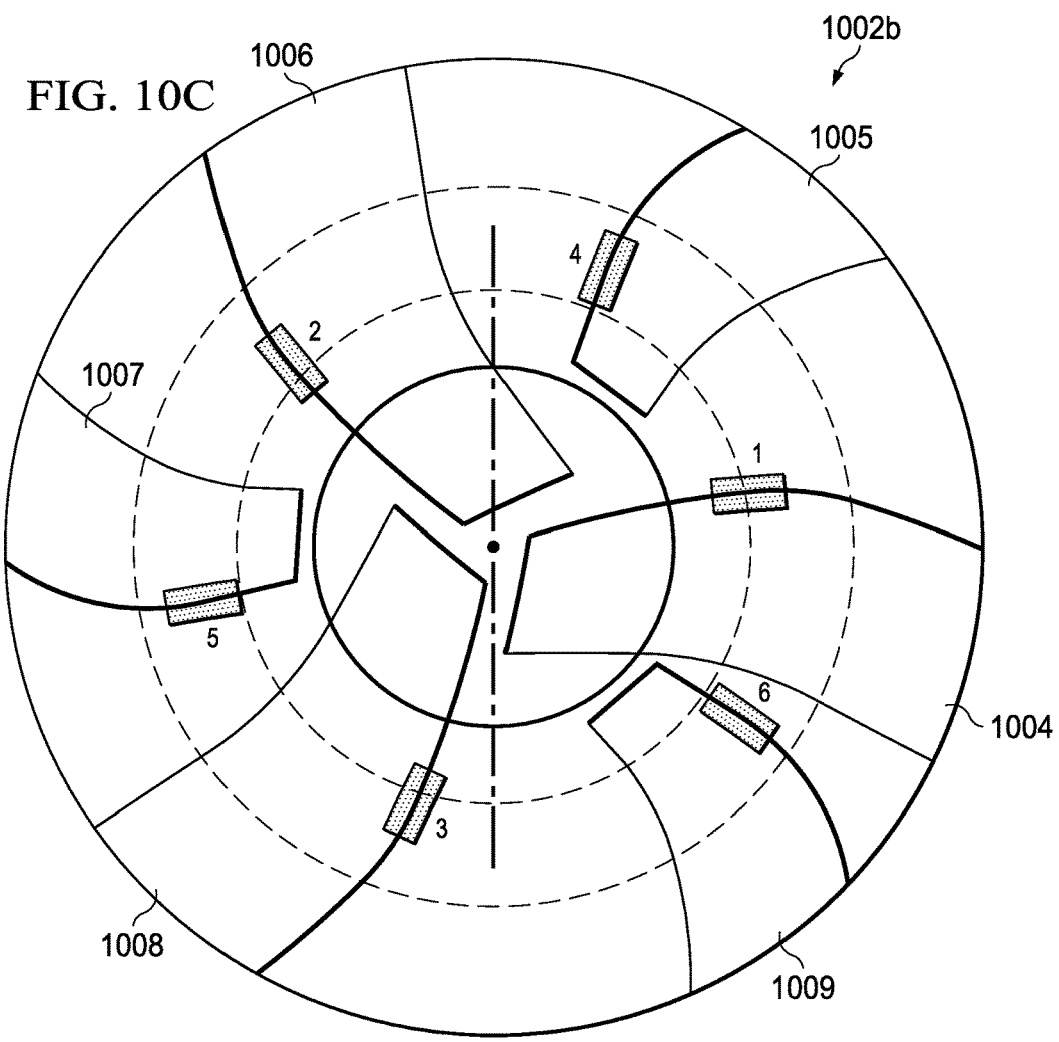
FIG. 10C illustrates a schematic drawing of a bit face for a downhole drilling tool having six blades including exemplary locations to install multiple layers of cutting elements for use in multilevel force balancing the downhole drilling tool, in accordance with some embodiments of the present disclosure.
Figure 10D:
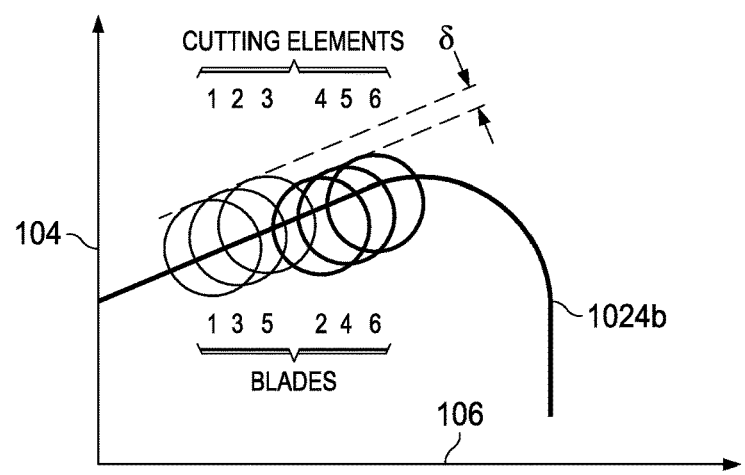
FIG. 10D illustrates a schematic drawing of a bit face profile for the downhole drilling tool of FIG. 10C including an under-exposed base profile, in accordance with some embodiments of the present disclosure.

FIGS. 10C and 10D illustrate one example of a six-bladed downhole drilling tool including multiple layers of cutting elements laid out in accordance with multilevel force balancing techniques. As shown in FIG. 10C, blades of the downhole drilling tool may be divided into a two blade group having the configuration (1,3,5) (2,4,6). Blades 1004, 1006 and 1008 may be primary blades and may form the first blade group. Blades 1005, 1007 and 1009 may be secondary blades and may form the second blade group. In the illustrated embodiment, cutting elements 1, 2 and 3 may be respectively laid out in a three cutting element group on primary blades 1004, 1006 and 1008 and cutting elements 4, 5 and 6 may be respectively laid out in a three cutting element group on secondary blades 1005, 1007 and 1009. These cutting element groups may form cutting element set [(1,3,5) (2,4,6)]. Cutting elements 4, 5 and 6 in the second blade group may be under-exposed with respect to cutting elements 1, 2 and 3 in the first blade group. In the illustrated embodiment, the cutting elements in both blade groups may be single-set. In other embodiments, the cutting elements in the first blade group may be single-set and the cutting elements in the second blade group may be track-set as illustrated in FIG. 8C. In further embodiments, the cutting elements in both blade groups may be track-set as illustrated in FIG. 9C.

As shown in FIG. 10D, cutting elements in the cutting element set [(1,3,5) (2,4,6)] are neighbor cutting elements because each of cutting elements 1 through 6 are disposed immediately adjacent to each other on bit face profile 1024b. Additionally, cutting elements 4, 5 and 6 in the second blade group may have an under-exposure ($\delta$) with respect to cutting elements 1, 2 and 3 in the first blade group such that the bit profile associated with the two groups is stepped. In the illustrated embodiment, the amount of under-exposure may be approximately the same for each of the cutting elements in the second blade group. In other embodiments, the amount of under-exposure may vary for each of the cutting elements in the second blade group. As a result of the under-exposure between the cutting elements in the first and second blade groups, the drilling tool may form groves at the end of a wellbore (e.g., wellbore 114 as illustrated in FIG. 1), which improve the stability of the drilling tool during drilling of the wellbore. Further, as illustrated in table 401 of FIG. 4A and table 501 of FIG. 5, cutting element set [(1,3,5) (2,4,6)] may be levels one through four force balanced.

Figure 10E:
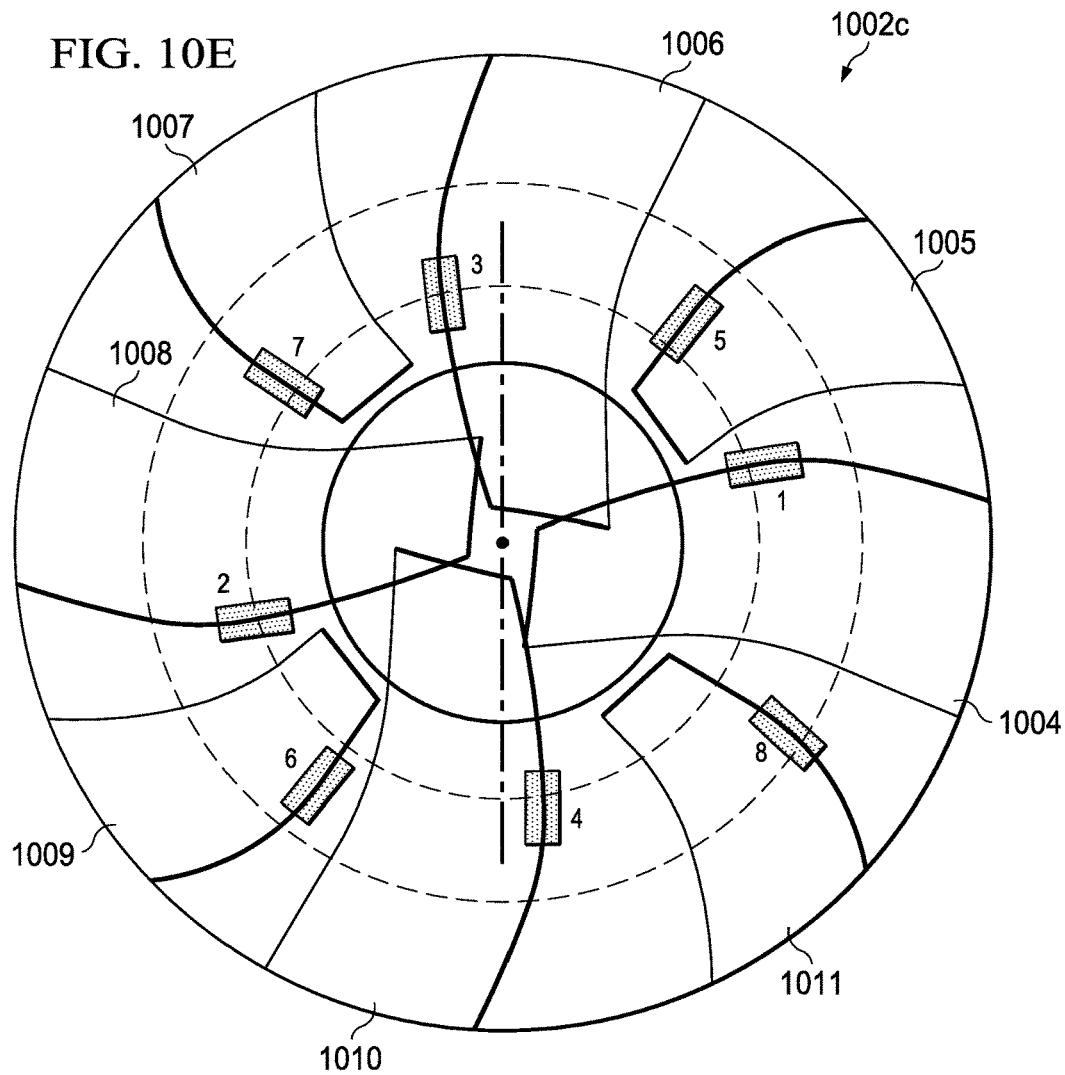
FIG. 10E illustrates a schematic drawing of a bit face for an example downhole drilling tool having eight blades including exemplary locations to install multiple layers of cutting elements for use in multilevel force balancing the downhole drilling tool, in accordance with some embodiments of the present disclosure.
Figure 10F:
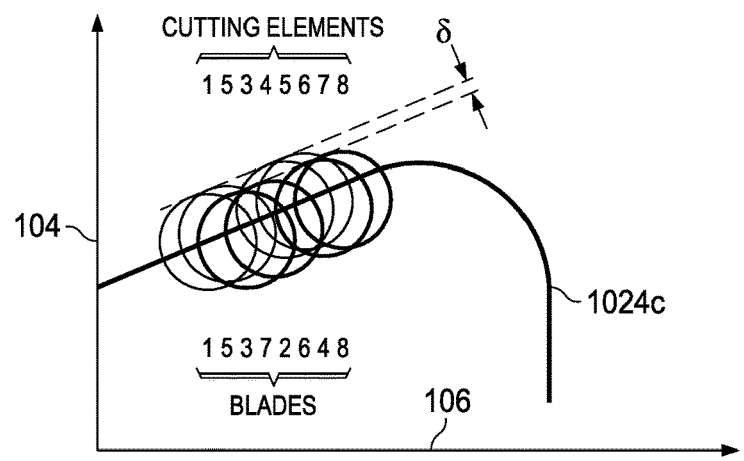
FIG. 10F illustrates a schematic drawing of a bit face profile for the downhole drilling tool of FIG. 10E including an under-exposed base profile, in accordance with some embodiments of the present disclosure.

FIGS. 10E and 10F illustrate one example of an eight-bladed downhole drilling tool including multiple layers of cutting elements laid out in accordance with multilevel force balancing techniques. As shown in FIG. 10E, blades of the downhole drilling tool may be divided into a pair blade group having the configuration (1,5) (3,7) (2,6) (4,8). Blades 1004, 1006, 1008 and 1010 may be primary blades such that blades 1004 and 1008 form the first blade group and blades 1006 and 1010 form the second blade group. Blades 1005, 1007, 1009 and 1011 may be secondary blades such that blades 1005 and 1009 form the third blade group and blades 1007 and 1011 form the fourth blade group. In the illustrated embodiment, cutting elements 1 and 2 may be respectively laid out in a two cutting element group on primary blades 1004 and 1008 and cutting elements 3 and 4 may be respectively laid out in a two cutting element group on primary blades 1006 and 1010. Cutting elements 5 and 6 may be respectively laid out in a two cutting element group on secondary blades 1005 and 1009 and cutting elements 7 and 8 may be respectively laid out in a two cutting element group on secondary blades 1007 and 1011. These cutting element groups may form cutting element set [(1,5) (3,7) (2,6) (4,8)]. Cutting elements 3 and 4 in the second blade group may be under-exposed with respect to cutting elements 1 and 2 in the first blade group. Additionally, cutting elements 7 and 8 in the fourth blade group may be under-exposed with respect to cutting elements 5 and 6 in the third blade group. In the illustrated embodiment, the cutting elements in all blade groups may be single-set. In other embodiments, the cutting elements in the first and third blade groups may be single-set and the cutting elements in the second and fourth blade groups may be track-set. In further embodiments, the cutting elements in all blade groups may be track-set as illustrated in FIG. 9G.

As shown in FIG. 10F, cutting elements in the cutting element set [(1,5) (3,7) (2,6) (4,8)] are neighbor cutting elements because each of cutting elements 1 through 8 are disposed immediately adjacent to each other on bit face profile 1024d. Additionally, cutting elements 3 and 4 in the second blade group may have an under-exposure ($\delta$) with respect to cutting elements 1 and 2 in the first blade group and cutting elements 7 and 8 in the fourth blade group may have an under-exposure ($\delta$) with respect to cutting elements 5 and 6 in the third blade group. In the illustrated embodiment, the under-exposures for the cutting elements in the second and fourth blade groups may be approximately the same such that the bit profile associated with the blade groups has one step. In another embodiment, the under-exposures for the cutting elements in the second blade group may be either less than or greater than the under-exposures for the cutting elements in the fourth group such that the bit profile associated with the blade groups has at least two steps. In the illustrated embodiment, the amount of under-exposure may be approximately the same for each of the cutting elements in the second and fourth blade groups. In other embodiments, the amount of under-exposure may vary for each of the cutting elements in the second and fourth blade groups. As a result of the under-exposure between the cutting elements in the first and second blade groups and the under-exposure between the cutting elements in the third and fourth blade groups, the drilling tool may form groves at the end of a wellbore (e.g., wellbore 114 as illustrated in FIG. 1), which improve the stability of the drilling tool during drilling of the wellbore. Further, as illustrated in table 401 of FIG. 4A and table 501 of FIG. 5, cutting element set [(1,5) (3,7) (2,6) (4,8)] may be levels one through four force balanced.

Figure 10G:
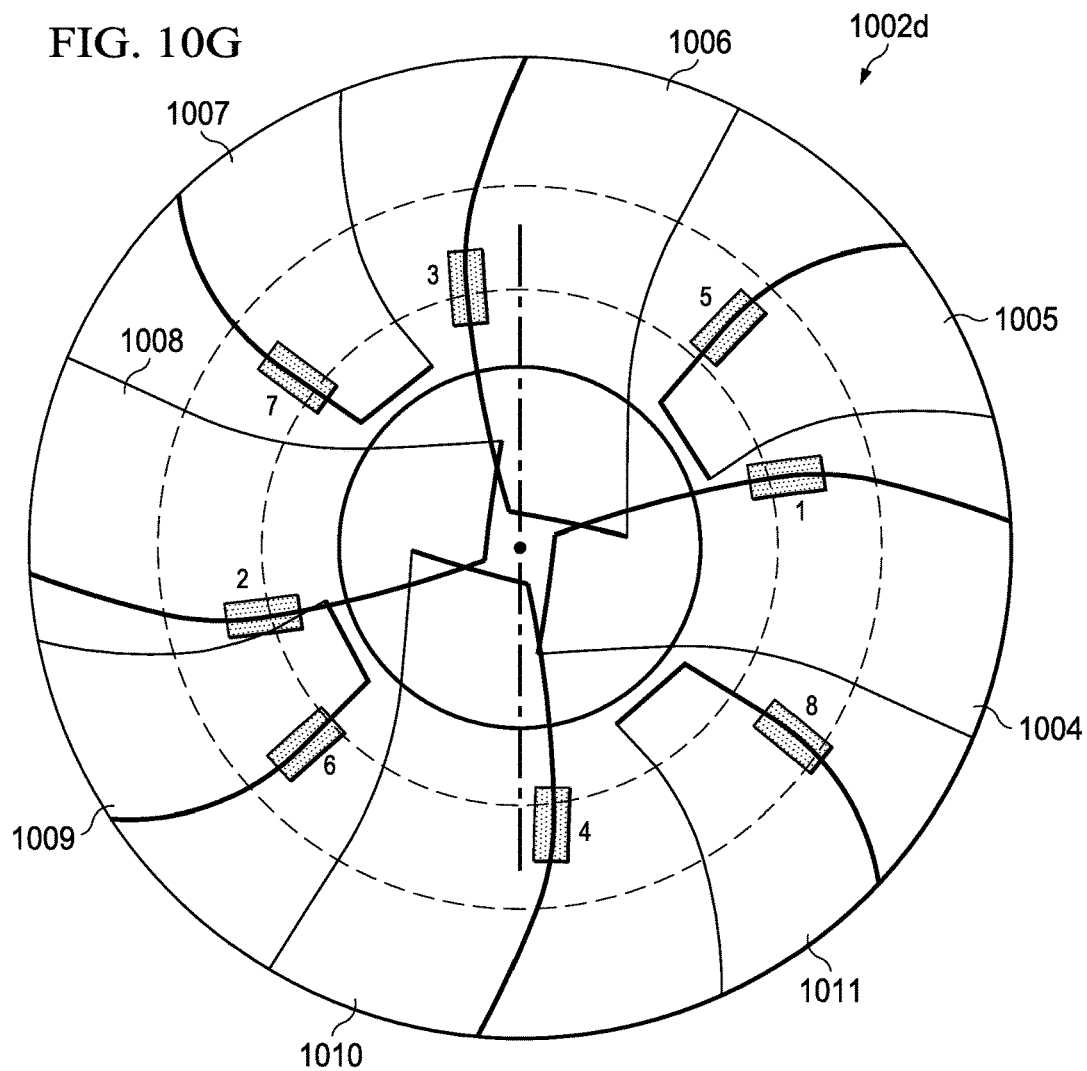
FIG. 10G illustrates a schematic drawing of a bit face for another example downhole drilling tool having eight blades including exemplary locations to install multiple layers of cutting elements for use in multilevel force balancing the downhole drilling tool, in accordance with some embodiments of the present disclosure.
Figure 10H:
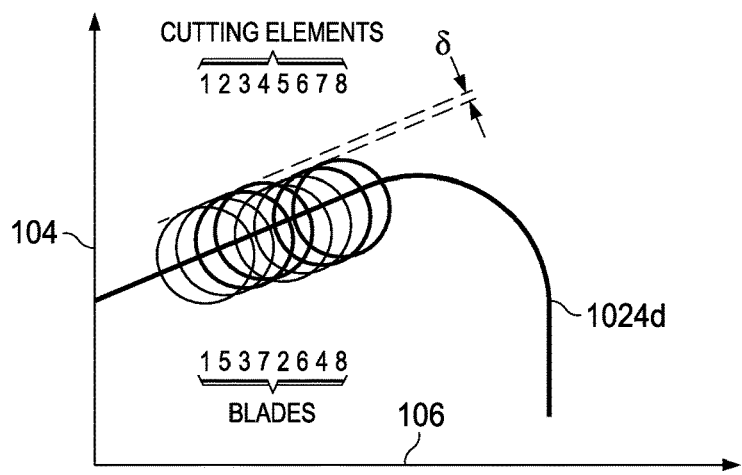
FIG. 10H illustrates a schematic drawing of a bit face profile for the downhole drilling tool of FIG. 10G including an under-exposed base profile, in accordance with some embodiments of the present disclosure.

FIGS. 10G and 10H illustrate another example of an eight-bladed downhole drilling tool including multiple layers of cutting elements laid out in accordance with multilevel force balancing techniques. As shown in FIG. 10G, blades of the downhole drilling tool may be divided into a pair blade group having the configuration (1,5) (3,7) (2,6) (4,8). Blades 1004, 1006, 1008 and 1010 may be primary blades such that blades 1004 and 1008 form the first blade group and blades 1006 and 1010 form the second blade group. Blades 1005, 1007, 1009 and 1011 may be secondary blades such that blades 1005 and 1009 form the third blade group and blades 1007 and 1011 form the fourth blade group. In the illustrated embodiment, cutting elements 1 and 2 may be respectively laid out in a two cutting element group on primary blades 1004 and 1008 and cutting elements 3 and 4 may be respectively laid out in a two cutting element group on primary blades 1006 and 1010. Cutting elements 5 and 6 may be respectively laid out in a two cutting element group on secondary blades 1005 and 809 and cutting elements 7 and 8 may be respectively laid out in a two cutting element group on secondary blades 807 and 811. These cutting element groups may form cutting element set [(1,5) (3,7) (2,6) (4,8)]. Cutting elements 5 and 6 in the third blade group and cutting elements 7 and 8 in the fourth blade group may be under-exposed with respect to cutting elements 1 and 2 in the first blade group and cutting elements 3 and 4 in the second blade group. In the illustrated embodiment, the cutting elements in all blade groups may be single-set. In other embodiments, the cutting elements in the first and second blade groups may be single-set and the cutting elements in the third and fourth blade groups may be track-set as illustrated in FIG. 8G. In further embodiments, the cutting elements in all blade groups may be track-set as illustrated in FIG. 9G.

As shown in FIG. 10H, cutting elements in the cutting element set [(1,5) (3,7) (2,6) (4,8)] are neighbor cutting elements because each of cutting elements 1 through 8 are disposed immediately adjacent to each other on bit face profile 1024d. Additionally, cutting elements 5 and 6 in the third blade group and cutting elements 7 and 8 in the fourth blade group may have an under-exposure ($\delta$) with respect to cutting elements 1 and 2 in the first blade group and cutting elements 3 and 4 in the second blade group. In the illustrated embodiment, the under-exposures for the cutting elements in the third and fourth blade groups may be approximately the same such that the bit profile associated with the blade groups has one step. In another embodiment, the under-exposures for the cutting elements in the third blade group may be either less than or greater than the under-exposures for the cutting elements in the fourth group such that the bit profile associated with the blade groups has at least two steps. In the illustrated embodiment, the amount of under-exposure may be approximately the same for each of the cutting elements in the third and fourth blade groups. In other embodiments, the amount of under-exposure may vary for each of the cutting elements in the third and fourth blade groups. As a result of the under-exposure between the cutting elements in the first and second blade groups and the cutting elements in the third and fourth blade groups, the drilling tool may form groves at the end of a wellbore (e.g., wellbore 114 as illustrated in FIG. 1), which improve the stability of the drilling tool during drilling of the wellbore. Further, as illustrated in table 401 of FIG. 4A and table 501 of FIG. 5, cutting element set [(1,5) (3,7) (2,6) (4,8)] may be levels one through four force balanced.

Figure 10J:
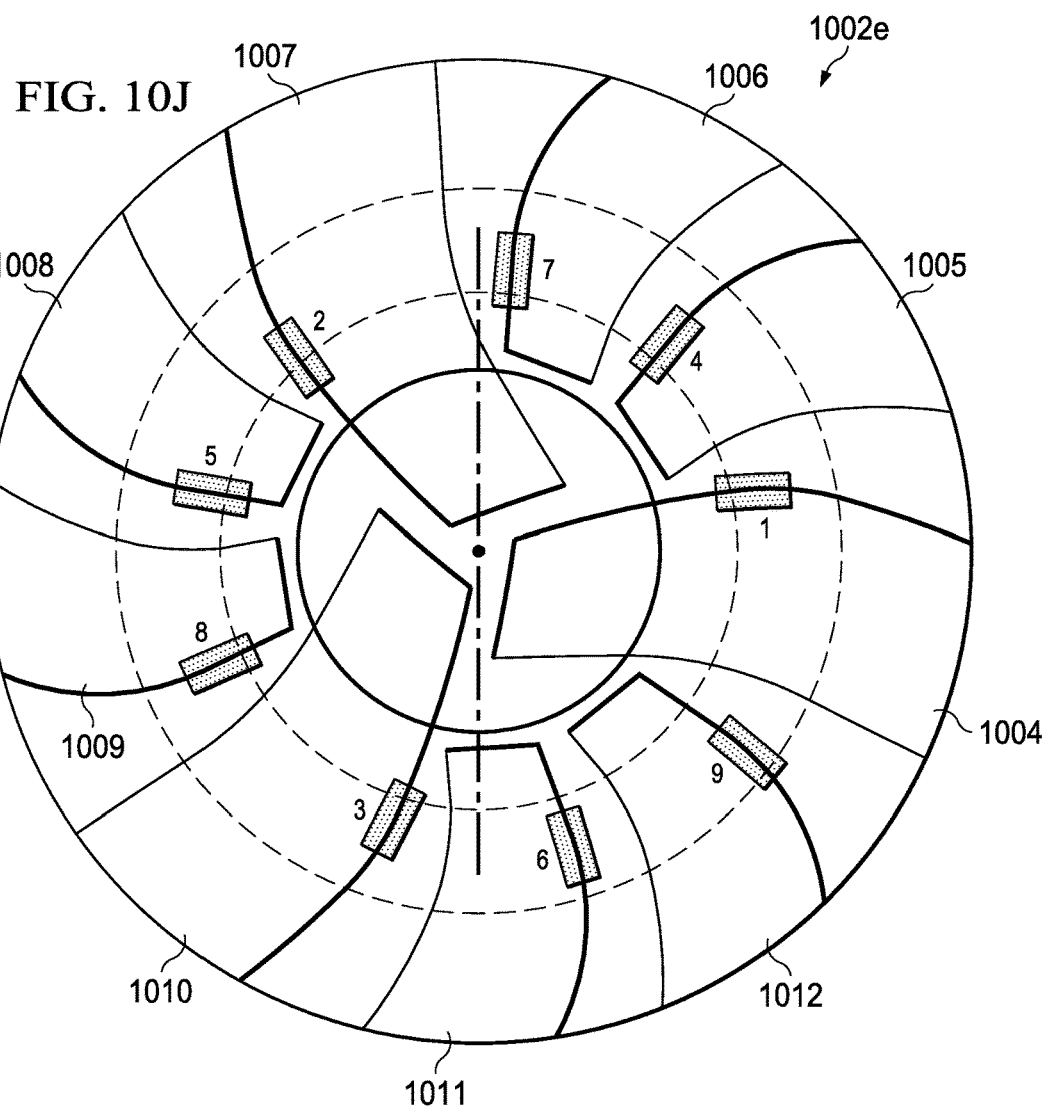
FIG. 10J illustrates a schematic drawing of a bit face profile for the downhole drilling tool of FIG. 10I including an under-exposed base profile, in accordance with some embodiments of the present disclosure.
Figure 10I:
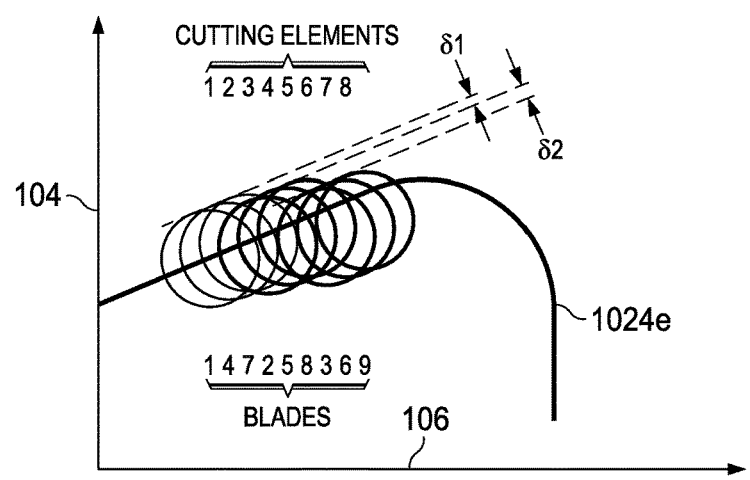
FIG. 10I illustrates a schematic drawing of a bit face for a downhole drilling tool having nine blades including exemplary locations to install multiple layers of cutting elements for use in multilevel force balancing the downhole drilling tool, in accordance with some embodiments of the present disclosure.

FIGS. 10I and 10J illustrate one example of a nine-bladed downhole drilling tool including multiple layers of cutting elements laid out in accordance with multilevel force balancing techniques. As shown in FIG. 10I, blades of the downhole drilling tool may be divided into a three blade group having the configuration (1,4,7) (2,5,8) (3,6,9). Blades 1004, 1007 and 1010 may be primary blades and may form the first blade group. Blades 1005, 1006, 1008, 1009, 1011 and 1012 may be secondary blades such that blades 1005, 1008 and 1011 form the second blade group and blades 1006, 1009 and 1012 form the third blade group. In the illustrated embodiment, cutting elements 1, 2 and 3 may be respectively laid out in a three cutting element group on primary blades 1004, 1007 and 1010. Additionally, cutting elements 4, 5 and 6 may be respectively laid out in a three cutting element group on secondary blades 1005, 1008 and 1011 and cutting elements 7, 8 and 9 may be respectively laid out in a three cutting element group on secondary blades 1006, 1009 and 1012. These cutting element groups may form cutting element set [(1,4,7) (2,5,8) (3,6,9)]. Cutting elements 4, 5 and 6 in the second blade group may be under-exposed with respect to cutting elements 1, 2 and 3 in the first blade group and cutting elements 7, 8 and 9 in the third blade group may be under-exposed with respect to cutting elements 4, 5 and 6 in the second blade group. In the illustrated embodiment, the cutting elements in all blade groups may be single-set. In other embodiments, the cutting elements in the first blade group may be single-set and the cutting elements in the second and third blade groups may be track-set as illustrated in FIG. 8I. In further embodiments, the cutting elements in all blade groups may be track-set as illustrated in FIG. 9I.

As shown in FIG. 10J, cutting elements in the cutting element set [(1,4,7) (2,5,8) (3,6,9)] are neighbor cutting elements because cutting elements 1 through 9 are disposed immediately adjacent to each other on bit face profile 1024e. Additionally, cutting elements 4, 5 and 6 in the second blade group may have an under-exposure ($\delta_1$) with respect to cutting elements 1, 2 and 3 in the first blade group and cutting elements 7, 8 and 9 in the third blade group may have an under-exposure exposure ($\delta_2$) with respect to cutting elements 4, 5 and 6 in the second blade group. In the illustrated embodiment, under-exposure $\delta_1$ may be approximately the same amount as under-exposure $\delta_2$. In another embodiment, under-exposure $\delta_1$ may be greater than or less than under-exposure $\delta_2$. In the illustrated embodiment, the amount of under-exposure may be approximately the same for each of the cutting elements in the second and third blade groups. In other embodiments, the amount of under-exposure may vary for each of the cutting elements in the second and third blade groups. As a result of the under-exposure between the cutting elements in the first and second blade groups and the under-exposure between the cutting elements in the second and third blade groups, the drilling tool may form groves at the end of a wellbore (e.g., wellbore 114 as illustrated in FIG. 1), which improve the stability of the drilling tool during drilling of the wellbore. Further, as illustrated in table 401 of FIG. 4A and table 501 of FIG. 5, cutting element set [(1,4,7) (2,5,8) (3,6,9)] may be levels one through four force balanced.

Modifications, additions or omissions may be made to FIGS. 10A-10J without departing from the scope of the present disclosure. For example, the cutting elements may be laid out in different configurations as described in FIGS. 4 and 5 and/or the first cutting element in any given cutting element set may be disposed on a secondary blade. Additionally, the cutting element sets may be repeated on the blades such that the cutting elements are laid out in all zones of the downhole drilling tool (e.g., cone zone, nose zone, shoulder zone and gage zone as illustrated in FIG. 2B).

Figure 11A:
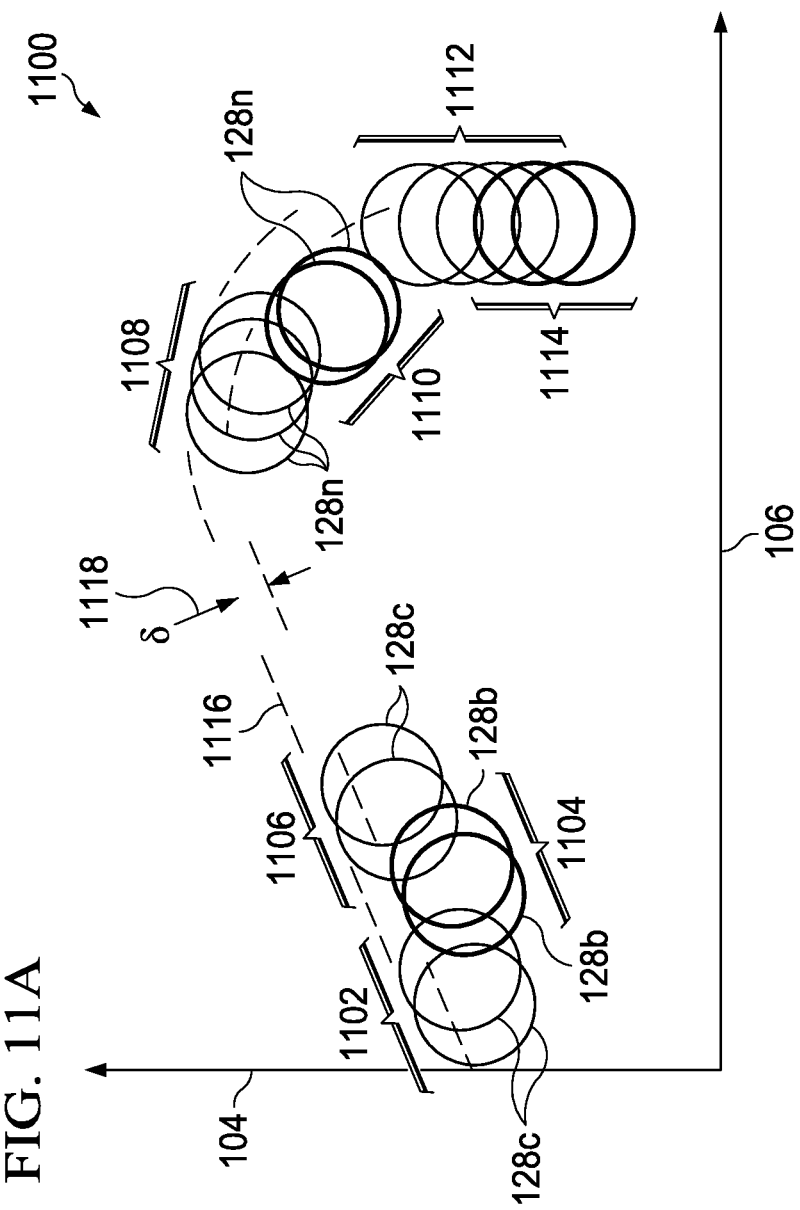
FIG. 11A illustrates a schematic drawing of a bit face profile for a downhole drilling tool including multiple layers of cutting elements with under-exposures, in accordance with some embodiments of the present disclosure.

FIG. 11A illustrates a schematic drawing of a bit face profile for a downhole drilling tool including multiple layers of cutting elements with under-exposures laid out in several zones of the downhole drilling tool using multilevel force balancing techniques, in accordance with some embodiments of the present disclosure. As illustrated, several groups of cutting elements laid out in accordance with multilevel force balancing techniques in different zones of a downhole drilling tool may form bit face profile 1100. For example, cutting elements 128, may be located in a respective cone zone of the drilling tool and may be divided into several groups of cutting elements 1102, 1104 and 1106. In the illustrated embodiment, cutting elements $128_c$ in group 1104 may be under-exposed ($\delta$) with respect to cutting elements $128_c$ in groups 1102 and 1106 in the cone zone such that cutting elements $128_c$ in groups 1102 and 1006 form base profile 1116 and cutting elements $128_c$ in group 1104 form base profile 1118. Due to the under-exposed cutting elements in the cone zone, groves may be formed at the end of a wellbore (e.g., wellbore 114 as illustrated in FIG. 1) proximate the cone zone of the downhole drilling tool during drilling operations to enhance stability of the downhole drilling tool. Additionally, adjacent groups of cutting elements $128_c$ in base profiles 1116 and 1118 may form force balanced cutting element groups.

Cutting elements $128_n$ may be located in a respective nose zone of the drilling tool and may be divided into several groups of cutting elements 1108 and 1110. In the illustrated embodiment, cutting elements $128_n$ in group 1110 may be under-exposed ($\delta$) with respect to cutting elements $128_n$ in group 1108 in the nose zone such that cutting elements $128_n$ in group 1108 form base profile 1116 and cutting elements $128_c$ in group 1110 form base profile 1118. In other embodiments, the amount of under-exposure between cutting elements $128_n$ in group 1110 and cutting elements $128_n$ in group 1108 within the nose zone may be either less than or greater than the amount of under exposure between cutting elements $128_c$ in group 1104 and cutting elements $128_c$ in groups 1102 and 1106 in the cone zone such that cutting elements $128_n$ in group 1110 may form another base profile. Due to the under-exposed cutting elements in the nose zone, groves may be formed at the end of a wellbore (e.g., wellbore 114 as illustrated in FIG. 1) proximate the nose zone of the downhole drilling tool during drilling operations to enhance stability of the downhole drilling tool. Additionally, adjacent groups of cutting elements $128_n$ in base profiles 1116 and 1118 may form force balanced cutting element groups.

Cutting elements $128_g$ may be located in a respective gage zone of the drilling tool and may be divided into several groups of cutting elements 1112 and 1114. As illustrated, cutting elements in the gage zone may be laid out using one base line such that no groves are formed at the end of a wellbore proximate the gage zone during drilling operations. Although not expressly shown, cutting elements $128_s$ may be laid out in several groups of the shoulder zone and some groups may be under-exposed with respect to other groups. In some embodiments, the amount of under-exposure for cutting elements in the shoulder zone may be approximately the same as the amount of under-exposure in either of the cone and nose zones. In other embodiments, the amount of under-exposure for the cutting elements in the shoulder zone may be greater than or less than the amount of under-exposure in either of the cone and nose zones such that cutting elements $128_s$ may form another base profile.

Figure 11B:
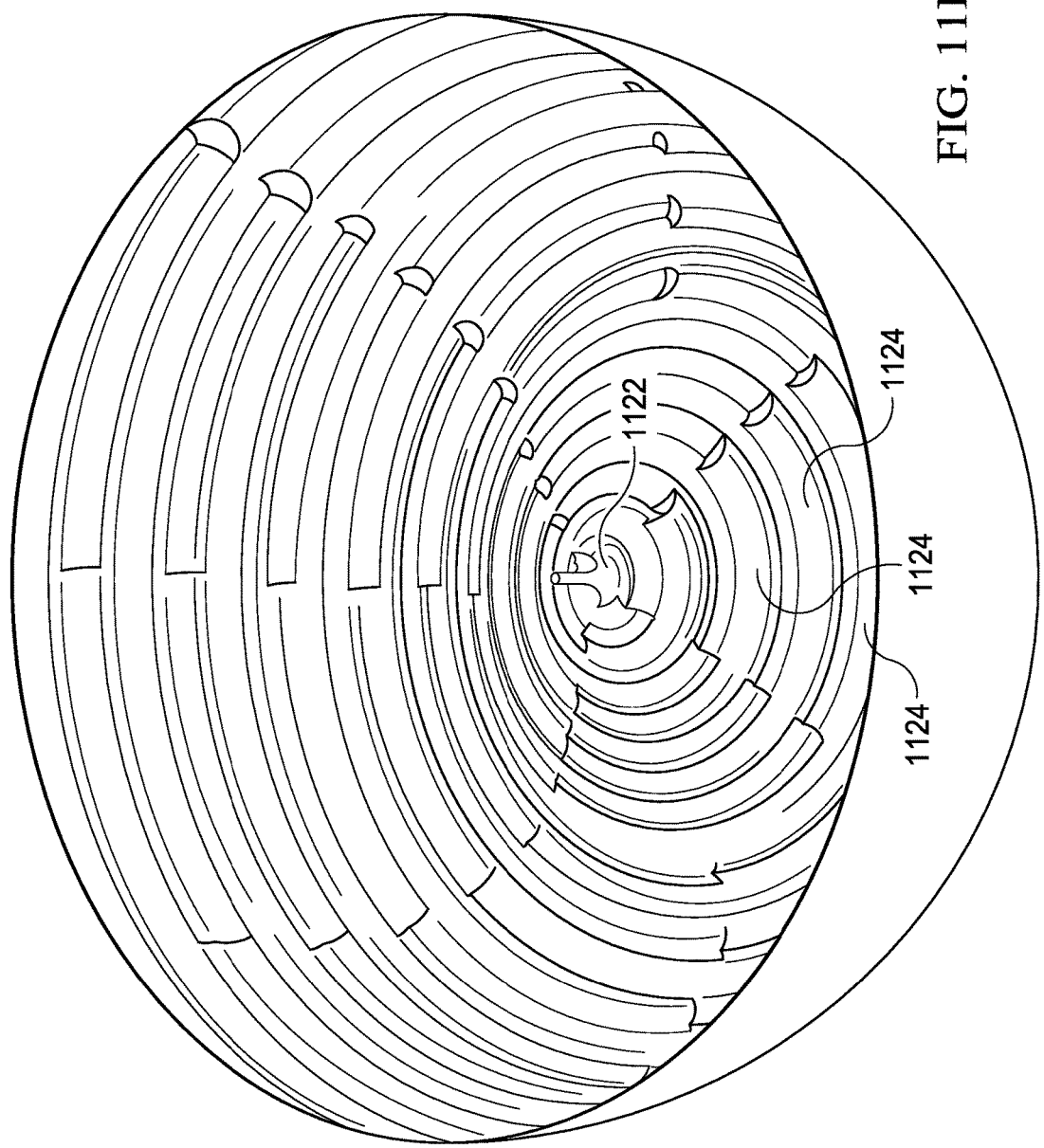
FIG. 11B illustrates a graphical user interface displaying a perspective view of the results of a simulation for drilling a wellbore using a force balanced downhole drilling tool including under-exposed cutting elements, in accordance with some embodiments of the present disclosure.

FIG. 11B illustrates a graphical user interface displaying a perspective view of the results of a simulation for drilling a wellbore using a force balanced downhole drilling tool including under-exposed cutting elements, in accordance with some embodiments of the present disclosure. The simulation may be performed by IBitS™ design software designed and manufactured by Halliburton Energy Services, Inc. (Houston, Tex.).

As illustrated, cutting elements $128_c$ of drill bit 101 illustrated in FIGS. 1 and 2A-2B may form grooves 1122 at a downhole end of a wellbore (e.g., wellbore 114 as illustrated in FIG. 1). Additionally, cutting elements $128_c$ of drill bit 101 may form grooves 1124 at a downhole end of the wellbore. These grooves enhance the stability of a downhole drilling tool during drilling operations. Additionally, a downhole drilling tool designed in accordance with multi-level force balancing techniques removes material from a formation more efficiently.

Figure 12A:
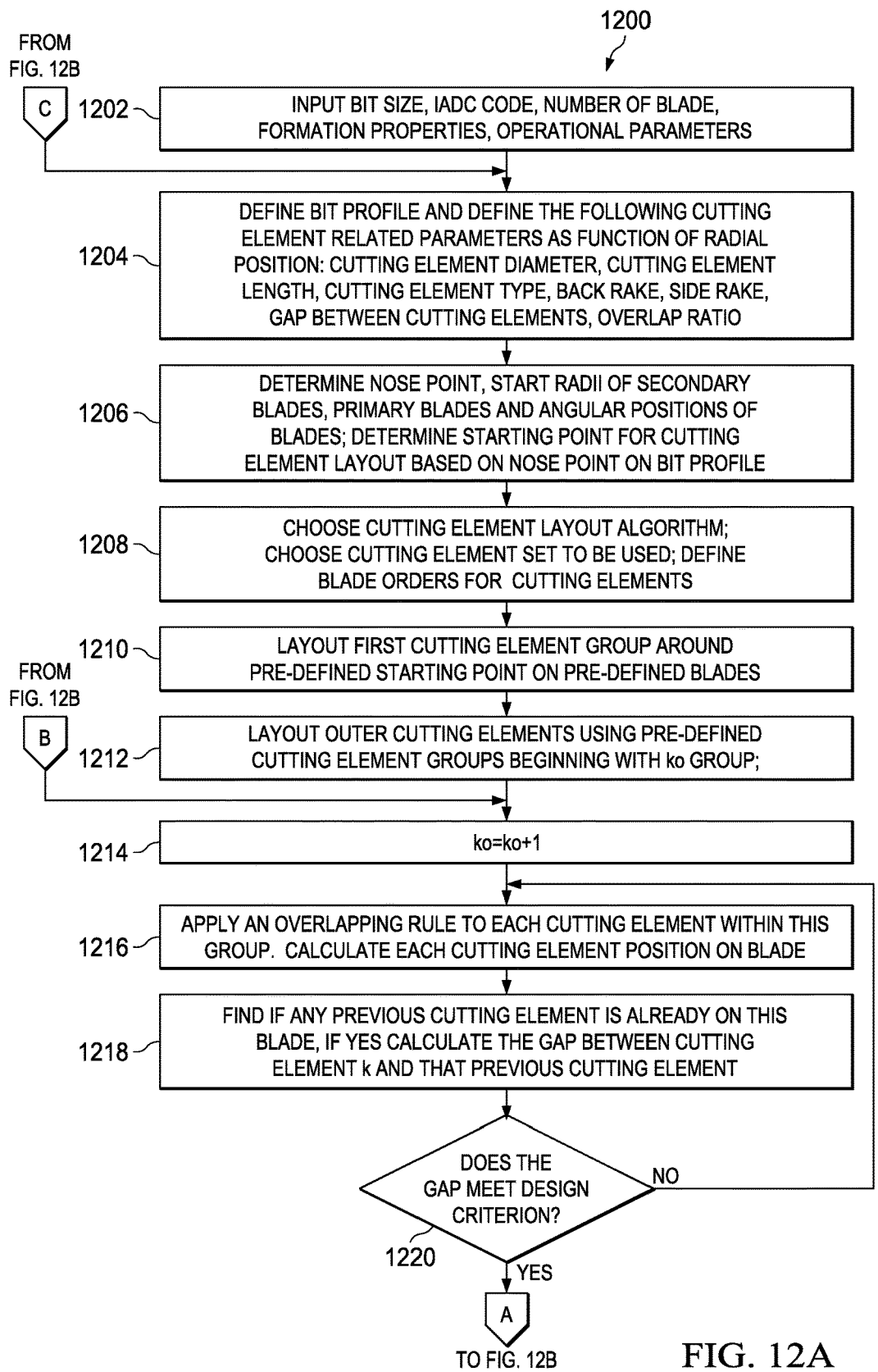
FIGS. 12A and 12B illustrate flow charts of an example method for installing cutting elements on exterior portions of a downhole drilling tool and multilevel force balancing the downhole drilling tool, in accordance with some embodiments of the present disclosure.
Figure 12B:
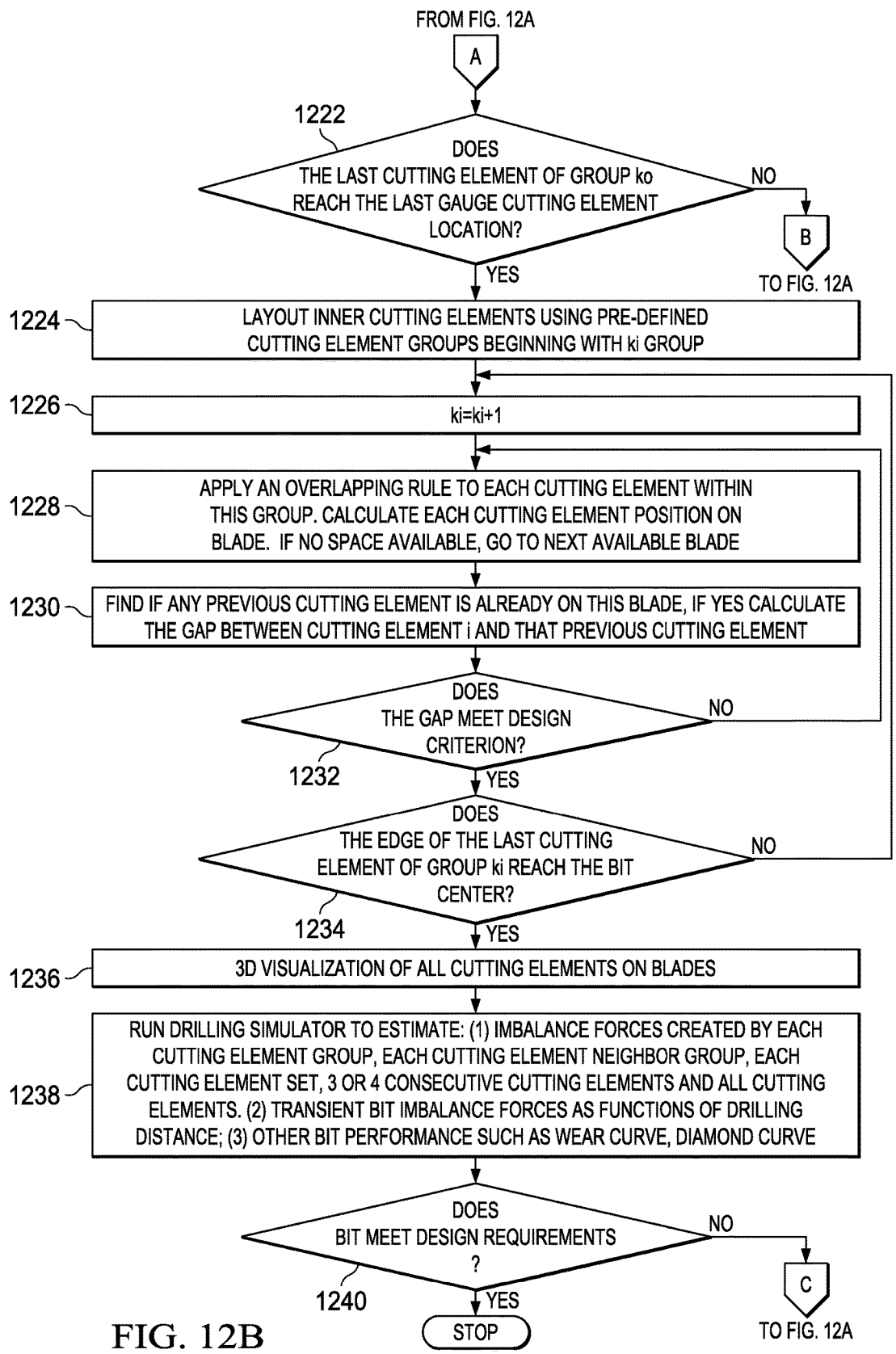

FIGS. 12A and 12B illustrate a flow chart of a method for designing rotary drill bits and other downhole drilling tools to substantially reduce or eliminate undesired bit imbalance forces during non-uniform downhole drilling conditions, in accordance with some embodiments of the present disclosure. The steps of method 1200 may be performed by various computer programs, models or any combination thereof, configured to simulate and design drilling systems, apparatuses and devices. The programs and models may include instructions stored on computer readable media and operable to perform, when executed, one or more of the steps described below. The computer readable media may include any system, apparatus or device configured to store and retrieve programs or instructions such as a hard disk drive, a compact disc, flash memory or any other suitable device. The programs and models may be configured to direct a processor or other suitable processing device to retrieve and execute the instructions from the computer readable media. Collectively, the computer programs and models used to simulate and design drilling systems may be referred to as a "drilling engineering tool" or "engineering tool."

Method 1200 may begin at step 1202 by inputting various characteristics of a downhole drilling tool, such as rotary drill bit 101, and drilling conditions (e.g., characteristics and drilling conditions included in Appendix A) into a general purpose computer or special purpose computer executing an engineering tool. In addition to computer readable media and a processing device, the computer may further include memory and communication ports for communicating with external devices and various input and output (I/O) devices, such as a keyboard, a mouse and/or a video display. At step 1204, various design parameters (e.g., drilling tool design parameters included in Appendix A) related to the cutting elements of the downhole drilling tool (e.g., cutting elements 128 of drill bit 101) may also be inputted into the general purpose computer or special purpose computer.

At step 1206, the engineering tool may determine specific parameters associated with a bit face profile or cutting face profile for the downhole drilling tool. For example, the parameters may include, but are not limited to, location of the nose point, starting radii of secondary blades from an associated rotational axis, location of primary blades, angular position of primary blades and secondary blades relative to each other and initial layout for installing cutting elements on exterior portions of associated blades based on the nose point of the composite bit face profile or composite cutting face profile. In some embodiments, determination of the initial layout for installing cutting elements may include determining whether certain cutting element groups will be laid out in a single-set or track-set configuration as described in FIGS. 8A-8J and 9A-9J. In other embodiments, determination of the initial layout for installing cutting elements may include determining the amount of under-exposure between cutting elements in different layers as described in FIGS. 10A-10J. In some embodiments, the under-exposure between cutting elements may be between approximately 0.01 inches and approximately 0.15 inches.

At step 1208, the engineering tool may select the blade group algorithm as shown in table 401 of FIGS. 4A and 4B and table 501 of FIG. 5. Additionally, the engineering tool may further determine cutting element sets as shown in tables 401 and 501 for use in multilevel force balancing and define blade order for selecting locations to install cutting elements relative to an associated nose segment. At step 1210, the engineering tool may determine the layout locations for inner cutting elements starting from the nose point based on initial composite bit face profile and initial blade design. At step 1212, the engineering tool may select layout locations for additional groups of cutting elements using pre-defined cutting element groups beginning with group $k_0$ (the initial group). The engineering tool may further lay out additional cutting element groups ($k_0$+1) at step 1214, and apply an overlapping rule to each cutting element in the group and calculate the position of each cutting element at step 1216. For single-set cutting element groups, the amount of overlap between cutting surfaces of neighbor cutting elements or cutting element groups on a bit face profile may be less than approximately 100%. In other embodiments, the overlap between respective cutting surfaces of neighbor single-set cutting elements may be between approximately 30% and approximately 90%. For track-set cutting element groups, the amount of overlap between cutting surfaces of neighbor cutting elements or cutting element groups may be approximately 100%.

At step 1218, the engineering tool may determine if a cutting element was previously installed on the blade. If a cutting element was previously installed, the engineering tool may evaluate the overlap between the cutting element being considered (cutting element K) and the cutting element previously installed on the blade. At step 1220, the engineering tool may compare overlaps or gaps between the cutting element being installed and the previously installed cutting element and determine if the overlap meets design criteria for the downhole drilling tool. If the overlap does not meet the design criteria, the method returns to step 1216. If the overlap does meet the design criteria, the engineering tool determines if the last cutting element in each cutting element group is located proximate an associated last gage cutting location on the associated gage pad. If the last cutting element in each cutting element group is not located proximate the last gage cutting location, the method returns to step 1214.

If the last cutting element in each group is located proximate the last gage cutting location, the engineering tool may lay out the inner cutting elements using predefined cutting element groups beginning with group $K_i$ at step 1224. At step 1226, the engineering tool may continue laying out the inner cutting elements (e.g., $k_i$+1) until the cutting elements in each inner cutting element group have been disposed on exterior portions of the associated blades. In some embodiments, inner cutting elements may be laid out in a direction starting proximate the nose point and ending proximate the bit rotational axis. At step 1228, the engineering tool may apply the overlap rule to each cutting element in the inner group and calculate each cutting element position on the associated blade. If sufficient space is not available on the blade to install the desired cutting element, the engineering tool may move to the next blade in rotation relative to the associated bit rotational axis.

At step 1230, the engineering tool may determine if a cutting element was previously installed on the blade. If a cutting element was previously installed, the engineering tool may calculate the overlap between the cutting element being added and the previously installed cutting element. At step 1232, the engineering tool may determine if the overlap between the cutting element being added and the previous cutting element on the blade meets the design criteria. If the overlap does not meet the design criteria, the method returns to step 1228. If the overlap does meet the design criteria, the engineering tool may determine if the edge of the last cutting element in the cutting element group being considered is located proximate the bit rotational axis at step 1234. If the last cutting element in the cutting element group is not located proximate the bit rotational axis, the method returns to step 1226.

If the last cutting element in the cutting element group is located proximate the bit rotational axis, the engineering tool may generate three-dimensional (3-D) visualization of the cutting elements disposed on exterior portions of all blades at step 1236. In some embodiments, the 3-D visualization may be displayed on a video display of a computer. At step 1238, the engineering tool may conduct a drilling simulation to estimate imbalance forces created by each cutting element group, each neighbor cutting element group, each cutting element set and each three or four neighbor cutting element groups on the associated composite bit face profile and all cutting elements. Imbalance forces may be evaluated as a function of drilling distance. Additionally, the engineering tool may use the simulation to evaluate downhole drilling performance with other criteria such as a wear curve and a diamond curve. In some embodiments, the drilling simulation may be performed in accordance with method 1300 as described with respect FIG. 13.

At step 1240, the engineering tool may determine if the downhole drilling tool meets desired design requirements. In some embodiments, the downhole drilling tool designed using multilevel force balancing techniques may meet design requirements if the magnitude of the imbalance forces associated with N (N=3 or N=4) consecutive neighbor cutting elements is smaller than the maximum imbalance forces associated with each cutting element of the N consecutive cutting elements. In other embodiments, the downhole drilling tool designed using multilevel force balancing techniques may meet design requirements if associated bit forces including bit lateral force, bit axial force and bit axial moment are limited. For example, the downhole drilling tool may be designed based at least in part on simulations using multilevel force balancing techniques to limit:

(a) maximum transient lateral imbalance force is less than approximately 8% (and often preferably less than approximately 6%) of associated transient axial force;

(b) lateral imbalance force, when all cutters are engaged with a general uniform downhole formation, is less than approximately 4% of bit actual force;

(c) maximum transient radial lateral imbalance forces is less than approximately 6% (preferably less than approximately 4%) of associated transient axial force;

(d) radial lateral imbalance force, when all cutters are engaged with a generally uniform downhole formation, is less than approximately 2.5% of associated bit axial force;

(e) maximum transient drag lateral imbalance force is less than approximately 6% (and often preferably less than approximately 4%) of associated transient axial force;

(f) drag lateral imbalance force while all cutters are engaged with a general uniform downhole formation is less than approximately 2.5% of associated bit axial force;

(g) maximum axial movement is less than approximately 15% of associated transient torque; and (h) axial moment, when all cutters are engaged with a general uniform downhole formation, is less than approximately 4% of associated bit torque. If the downhole drilling tool does not meet the design requirements, the method may return to step 1204. If the downhole drilling tool meets the design requirements, the method may end and the design data inputted in steps 1202, 1204 and 1206 may be used to manufacture an associated downhole drilling tool.

Modifications, additions, or omissions may be made to method 1200 without departing from the scope of the present disclosure. For example, the order of the steps may be performed in a different manner than that described and some steps may be performed at the same time. Additionally, each individual step may include additional steps without departing from the scope of the present disclosure.

Figure 13:
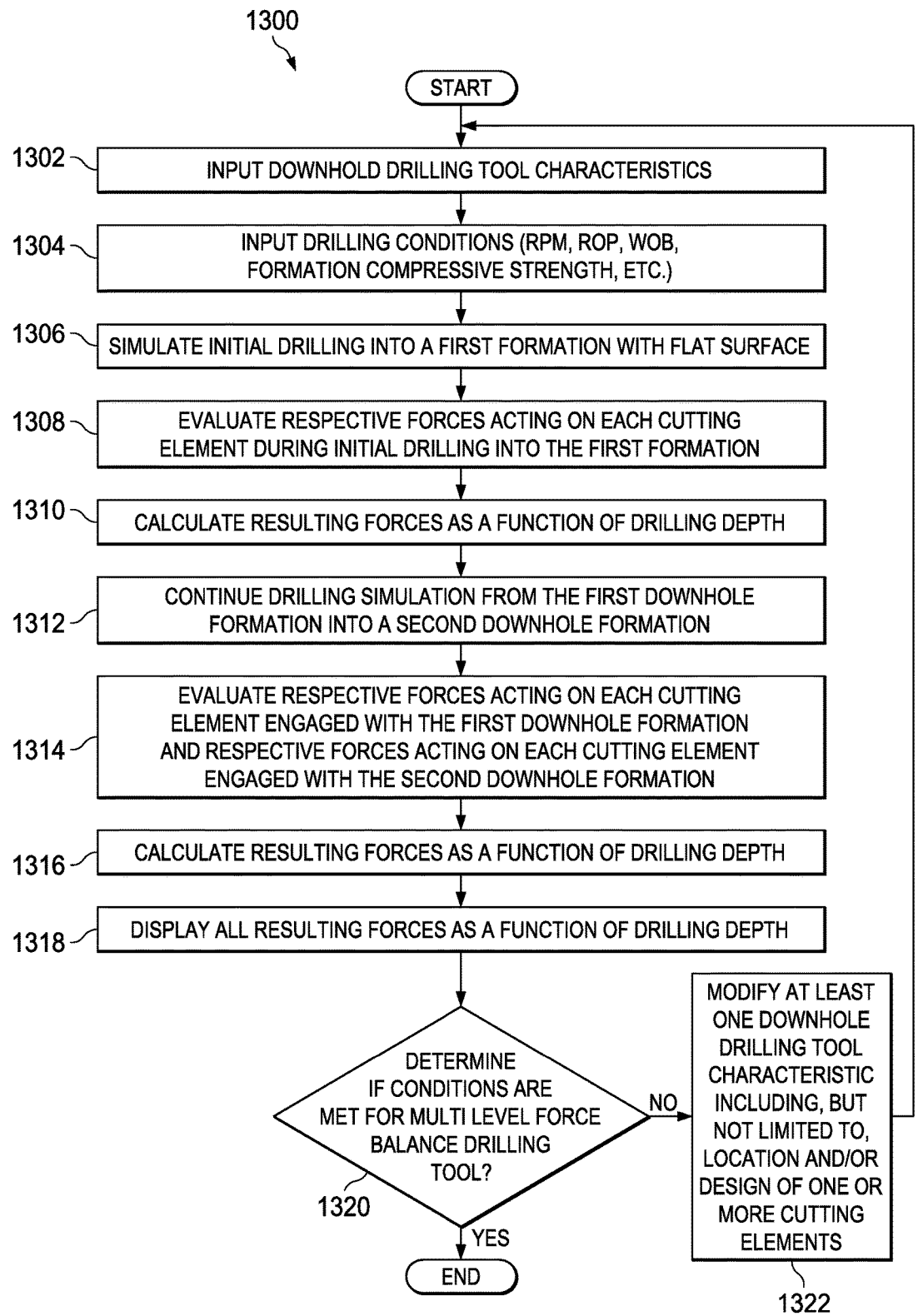
FIG. 13 illustrates a flow chart of an example method for designing a downhole drilling tool, in accordance with some embodiments of the present disclosure.

FIG. 13 illustrates a flow chart of example techniques or procedures that may be used to design rotary drill bits and other downhole drilling tools based at least in part on multilevel force balancing to substantially reduce and/or eliminate imbalance forces acting on a rotary drill bit and other downhole drilling tools, in accordance with some embodiments of the present invention. The steps of method 1300 may be performed by various computer programs, models or any combination thereof, configured to simulate and design drilling systems, apparatuses and devices. The programs and models may include instructions stored on a computer readable medium and operable to perform, when executed, one or more of the steps described below. The computer readable media may include any system, apparatus or device configured to store and retrieve programs or instructions such as a hard disk drive, a compact disc, flash memory or any other suitable device. The programs and models may be configured to direct a processor or other suitable processing device to retrieve and execute the instructions from the computer readable media. Collectively, the computer programs and models used to simulate and design drilling systems may be referred to as a "drilling engineering tool" or "engineering tool."

Method 1300 may begin at step 1302 by inputting various characteristics of a downhole drilling tool (e.g., characteristics included in Appendix A), such as drill bit 101, into a general purpose computer or special purpose computer executing an engineering tool. In addition to a computer readable medium and a processing device, the computer may further include memory and communication ports for communicating with external devices and various input and output (I/O) devices, such as a keyboard, a mouse and/or a video display.

At step 1304, various downhole drilling conditions (e.g., conditions included in Appendix A) may be inputted into the computer. At step 1306, a drilling simulation using the engineering tool may start with initial engagement between one or more cutters of a fixed cutter drill bit or other downhole drilling tool and a generally flat surface of a first downhole formation layer at the downhole end of a wellbore. A standard set of drilling conditions may include one hundred twenty (120) revolutions per minute (RPM), rate of penetration (ROP), thirty (30) feet per hour, first formation strength 5,000 psi and second formation strength 18,000 psi.

Respective forces acting on cutting elements 128 disposed on drill bit 101 or other downhole drilling tool may be evaluated during initial contact between each cutting element and the first downhole formation. Respective forces acting on each cutting element may be evaluated versus depth of penetration of the rotary drill bit or other downhole drilling tool into the first downhole formation. The resulting forces acting on the associated rotary drill bit or other downhole drilling tool may then be calculated as a function of drilling depth at step 1310. Various computer models and computer programs, such as those listed in Appendix A, are available to evaluate and calculate forces acting on each of cutting elements 128.

The drilling simulation may continue to step 1312 corresponding with forming the wellbore through the first downhole formation and into a second downhole formation. Respective forces acting on each cutting element engaged with the first downhole formation and respective forces acting on each cutting element engaged with the second downhole formation may then be evaluated at step 1314. Resulting forces acting on the fixed cutter rotary drill bit or other downhole drilling tool may then be evaluated as a function of drilling depth in step 1316. At step 1318, resulting forces acting on the fixed cutter rotary drill bit or other downhole drilling tool may be displayed as a function of drilling depth.

If the resulting forces acting on the fixed cutter rotary drill bit or other downhole drilling tool meet design requirements for a multilevel force balanced drilling tool at step 1320, the simulation may stop. The downhole drill tool characteristics may then be used to design and manufacture drill bit 101 or other downhole drilling tool.

If the resulting forces acting on drill bit 101 or other downhole drilling tool do not meet design requirements for a multilevel forced balance drilling tool at step 1320, the simulation may proceed to step 1322 and at least one downhole drilling tool characteristic may be modified. For example, the location, orientation and/or size of one or more cutting elements may be modified. The configuration, dimensions and/or orientation of one or more blades disposed on exterior portions of the downhole drilling tool may be modified.

The simulation may then return to step 1302 and method 1300 may be repeated. If the simulation based on the modified downhole drilling tool characteristics is satisfactory at step 1320, the simulation may stop. If the conditions for a multilevel force balanced drilling tool are not satisfied at step 1320, further modifications may be made to at least one downhole drilling tool characteristic at step 1322 and the simulation continued starting at step 1302 and method 1300 repeated until the conditions for a multilevel forced balanced downhole drilling tool are met at step 1120.

Modifications, additions, or omissions may be made to method 1300 without departing from the scope of the present disclosure. For example, the order of the steps may be performed in a different manner than that described and some steps may be performed at the same time. Additionally, each individual step may include additional steps without departing from the scope of the present disclosure.

Although the present disclosure and its advantages have been described in detail, it should be understood that various changes, substitutions and alternations can be made herein without departing from the spirit and scope of the disclosure as defined by the following claims. For example, the cutting elements in the cutting element groups and cutting element sets may be laid out in either a spiraling direction following the direction of rotation of the downhole drilling tool relative to the associated bit rotational axis or a spiraling direction opposite from the direction of rotation. Additionally, the cutting elements may be laid out from a point near bit rotational axis and extend radially outward. Further, the cutting elements may be laid out from a point near a nose point of the downhole drilling tool in a direction extending radially outward or in a direction extending radially inward.

APPENDIX A

| DOWNHOLE DRILLING TOOL CHARACTERISTICS DESIGN PARAMETERS | | | |
|---|---|---|---|
| bit face profile | cutting depth | cutting face profile | cutter phase angle |
| bit geometry | cutting structure | bit face geometry | gap between cutters |
| cutter diameter | cutting element groups | cutting face geometry | cutter overlap ratio |
| cutter radial position | force balanced cutting element groups | worn (dull) bit data | nose point |
| blade (length, number, spiral, width) | neighbor cutters | cutter length | start radii of secondary blades |

| DOWNHOLE DRILLING TOOL CHARACTERISTICS DESIGN PARAMETERS | | | |
|---|---|---|---|
| bottom hole assembly | neighbor cutting element groups | cutter type | bit size |
| cutter (type, size, number) | level three force balanced | cutter length | hydraulic flow areas |
| cutter density | level four force balances | back rake angle | hydraulic flow rate |
| cutter location (cone, nose, shoulder, gage pad) | cutting element sets | side rake angle | |
| cutter orientation (back rake, side rake) | force balanced cutting element sets | IADC Bit Model | |
| cutting face surface area | blade groups | impact arrestor (type,. size, number) | |

| DRILLING CONDITIONS OPERATING PARAMETERS | | |
|---|---|---|
| axial penetration rate | weight on bit (WOB) | torque on bit (TOB) tilt rate |
| rate of penetration (ROP) | revolutions per minute (RPM) | lateral or side penetration rate |
| rotational speed (RPM) | straight hole drilling | |

| DRILLING CONDITIONS WELLBORE PROPERTIES | | |
|---|---|---|
| bottom hole configuration | inside diameter | straight hole |

| DRILLING CONDITIONS FORMATION PROPERTIES | | | |
|---|---|---|---|
| compressive strength | formation strength | porosity | shale plasticity |
| down dip angle | inclination | rock pressure | up dip angle |
| layer thickness | lithology | rock strength | hard stringers |
| formation plasticity | number of layers | first layer second layer | |

| EXAMPLES OF COMPUTER MODELS TO EVALUATE CUTTER FORCES AND DRILL BIT IMBALANCE FORCES |
|---|
| 1. Glowka D. A., 'Use of Single-Cutter Data in the Analysis of PDC Bit Designs: Part 1 - Development of a PDC Cutting Force Model," SPE Journal of Petroleum Technology, 41 (1989) pp. 797-849. |
| 2. Behr S. M., Warren T. M., Sinor L. A., Brett, J. F, "3D PDC Bit Model Predicts Higher Cutter Loads, SPE Drilling & Completion," No. 4, Vol. 8, March 1993. |
| 3. Clayton R., Chen S. and Lefort G., "New Bit Design, Cutter Technology Extend PDC Applications to Hard Rock Drilling," SPE/IADC 91840, February 2005 |
| 4. Chen S., Arfele R., Glass K., "Modeling of the Effects of Cutting Structure, Impact Arrestor, and Gage Geometry on PDC Bit Steerability," paper AADE-07-NTCE-10 presented at 2007 AADE Technical Conference held in Houston, TX, Apr. 10-12, 2007. |
| 5. Chen S., Collins G. J., Thomas M. B., "Reexamination of PDC Bit Walk in Directional and Horizontal Wells," IADC/SPE 112641, March 2008. |

What is claimed is:

1. A downhole drilling tool designed to form a wellbore, comprising:
   a bit body;
   a first plurality of blades on exterior portions of the bit body;
   a first group of cutting elements located on exterior portions of the first plurality of blades;
   a second plurality of blades on exterior portions of the bit body;
   a second group of cutting elements located on exterior portions of the second plurality of blades and underexposed with respect to the first group of cutting elements such that the first and second groups of cutting elements form grooves in a downhole end of a wellbore in order to stabilize the downhole drilling tool during drilling, each of the cutting elements in the second group having a unique radial position from a rotational axis of the bit body with respect to each of the cutting elements in the first group, the first and second plurality of blades and the first and second groups of cutting elements cooperating with each other to form a composite bit face profile including a plurality of respective groups of at least three neighbor cutting elements; and
   each respective group of at least three neighbor cutting elements is force balanced with respect to each other and includes at least one cutting element from the first group of cutting elements and at least one cutting element from the second group of cutting elements.

2. The downhole drilling tool of claim 1, wherein:
each cutting element in the first group of cutting elements is force balanced with respect to each other; and
each cutting element in the second group of cutting elements is force balanced with respect to each other.

3. The downhole drilling tool of claim 1, wherein the first group of cutting elements is force balanced with respect to the second group of cutting elements.

4. The downhole drilling tool of claim 1, wherein all cutting elements in the first and second groups of cutting elements are force balanced with respect to each other.

5. The downhole drilling tool of claim 1, wherein respective cutting surfaces on the composite bit face profile for each group of at least three neighbor cutting elements overlap by between 30% and 100%.

6. The downhole drilling tool of claim 1, wherein each group of at least three neighbor cutting elements is force balanced if a magnitude of the bit imbalance forces acting on the group of at least three neighbor cutting elements is less than maximum bit imbalance forces acting on each cutting element of the respective groups of at least three neighbor cutting elements.

7. The downhole drilling tool of claim 1, wherein each of the cutting elements in the second group of cutting elements is under-exposed by a different amount.

8. The downhole drilling tool of claim 1, wherein the under-exposure between the first group of cutting elements and the second group of cutting elements is between 0.01 inches and 0.15 inches.

9. The downhole drilling tool of claim 1, wherein at least one of the cutting elements in the second group of cutting elements is track-set with respect to another cutting element in the second group of cutting elements.

10. The downhole drilling tool of claim 1, further comprising:
a third plurality of blades on exterior portions of the bit body;
a third group of cutting elements located on exterior portions of the third plurality of blades and under-exposed with respect to the second group of cutting elements, the first, second and third plurality of blades and the first, second and third groups of cutting elements cooperating with each other to form the composite bit face profile; and
each respective group of at least three neighbor cutting elements on the composite bit face profile is force balanced with respect to each other.

11. A method of designing a downhole drilling tool for drilling a wellbore, comprising:
determining locations of a first group of cutting elements on exterior portions of a first plurality of blades of a downhole drilling tool based on balancing forces acting on each of the cutting elements in the first group of cutting elements;
determining locations of a second group of cutting elements on exterior portions of a second plurality of blades of the downhole drilling tool based on balancing forces acting on each of the cutting elements in the second group of cutting elements, the second group of cutting elements under-exposed with respect to the first group of cutting elements such that the first and second groups of cutting elements form grooves in a downhole end of a wellbore in order to stabilize the downhole drilling tool during drilling, each of the cutting elements in the second group having a unique radial position from a rotational axis of the bit body with respect to each of the cutting elements in the first group;
projecting the first and second plurality of blades and the first and second groups of cutting elements onto a composite bit face profile including a plurality of groups of at least three neighbor cutting elements;
simulating forces acting on all cutting elements in the first and second groups of cutting elements while drilling the wellbore; and
evaluating bit imbalance forces acting on each group of at least three neighbor cutting elements, each group of at least three neighbor cutting elements including at least one cutting element from the first group of cutting elements and at least one cutting element from the second group of cutting elements.

12. The method of claim 11, further comprising evaluating bit imbalance forces acting on the first group of cutting elements and evaluating bit imbalance forces acting on the second group of cutting elements.

13. The method of claim 11, further comprising evaluating bit imbalance forces acting on all of the cutting elements in the first and second groups of cutting elements.

14. The method of claim 11, wherein respective cutting surfaces on the composite bit face profile for each group of at least three neighbor cutting elements overlap by between 30% and 100%.

15. The method of claim 11, wherein each group of at least three neighbor cutting elements is force balanced if a magnitude of the bit imbalance forces acting on the group of at least three neighbor cutting elements is less than maximum bit imbalance forces acting on each cutting element of the respective groups of at least three neighbor cutting elements.

16. The method of claim 11, wherein each of the cutting elements in the second group of cutting elements is under-exposed by a different amount.

17. The method of claim 11, wherein at least one of the cutting elements in the second group of cutting elements is track-set with respect to another cutting element in the second group of cutting elements.

18. The method of claim 11, wherein determining locations of the first and second groups of cutting elements comprises:
selecting a point adjacent to a nose zone; and
installing each cutting element of the first and second groups of cutting elements extending outward from the point adjacent to the nose zone in a direction of rotation of the downhole drilling tool.

19. The method of claim 11, further comprising:
determining if the locations of the first and second groups of cutting elements meets a design criterion for the downhole drilling tool; and
modifying the location of at least one of the cutting elements in the first or second groups of cutting elements based on the simulated imbalance force acting on the drilling tool if the location does not meet the design criterion.

20. A method for drilling a wellbore, comprising:
providing a downhole drilling tool including a first group of cutting elements located on a first plurality of blades and a second group of cutting elements located on a second plurality of blades and under-exposed with respect to the first group of cutting elements, each of the cutting elements in the second group having a unique radial position from a rotational axis of the bit body with respect to each of the cutting elements in the first group, the downhole drilling tool being forced balanced based on each respective group of at least three neighbor cutting elements on a composite bit face profile formed by the first and second plurality of blades and the first and second groups of cutting elements being force balanced with respect to each other, each respective group of at least three neighbor cutting elements including at least one cutting element from the first group of cutting elements and at least one cutting element from the second group of cutting elements; and drilling into a formation using the downhole drilling tool to form a wellbore, the wellbore including grooves on a downhole end formed by cooperation of the first and second groups of cutting elements in order to stabilize the downhole drilling tool during drilling.

21. The method of claim 20, wherein each of the cutting elements in the second group of cutting elements is under-exposed by a different amount.

22. The method of claim 20, wherein the under-exposure between the first group of cutting elements and the second group of cutting elements is between 0.01 inches and 0.15 inches.

23. The method of claim 20, wherein respective cutting surfaces on the composite bit face profile for each group of at least three neighbor cutting elements overlap by between 30% and 100%.

24. The method of claim 20, wherein each group of at least three neighbor cutting elements is force balanced if a magnitude of the bit imbalance forces acting on the group of at least three neighbor cutting elements is less than maximum bit imbalance forces acting on each cutting element of the respective groups of at least three neighbor cutting elements.

* * * * *